United States Patent
Lee et al.

(10) Patent No.: US 10,373,912 B2
(45) Date of Patent: Aug. 6, 2019

(54) REPLACEMENT METAL GATE PROCESSES FOR VERTICAL TRANSPORT FIELD-EFFECT TRANSISTOR

(71) Applicant: International Business Machines Corporation, Armonk, NY (US)

(72) Inventors: Choonghyun Lee, Rensselaer, NY (US); Chun Wing Yeung, Niskayuna, NY (US); Ruqiang Bao, Niskayuna, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/862,930

(22) Filed: Jan. 5, 2018

(65) Prior Publication Data

US 2019/0214343 A1 Jul. 11, 2019

(51) Int. Cl.
*H01L 21/8234* (2006.01)
*H01L 23/535* (2006.01)
(Continued)

(52) U.S. Cl.
CPC .... *H01L 23/535* (2013.01); *H01L 21/823437* (2013.01); *H01L 21/823481* (2013.01); *H01L 21/823487* (2013.01); *H01L 27/092* (2013.01); *H01L 29/42392* (2013.01); *H01L 29/6656* (2013.01); *H01L 29/66545* (2013.01); *H01L 29/78642* (2013.01)

(58) Field of Classification Search
CPC . H01L 29/785–7856; H01L 2029/7857; H01L 2029/7858; H01L 29/7827; H01L 29/7831; H01L 21/823431; H01L 21/823821; H01L 29/8083; H01L 29/66795; H01L 27/0886; H01L 29/66545; H01L 29/66606; H01L 29/66871; H01L 27/2454; H01L 21/823487; H01L 21/823885
See application file for complete search history.

(56) References Cited

U.S. PATENT DOCUMENTS 6,770,534 B2 8/2004 Cho et al.
6,773,994 B2 8/2004 Chittipeddi et al.
(Continued)

OTHER PUBLICATIONS

S. Yamaguchi et al., "Effective Work-Function Control Technique Applicable to p-Type FinFET High-k/Metal Gate Devices," Microelectronics Reliability, May 2017, pp. 80-84, vol. 72.
(Continued)

*Primary Examiner* — Selim U Ahmed
*Assistant Examiner* — Evan G Clinton
(74) *Attorney, Agent, or Firm* — Vazken Alexanian; Ryan, Mason & Lewis, LLP

(57) ABSTRACT

A method of forming a semiconductor structure comprises forming a plurality of fins disposed over a top surface of a substrate and forming one or more vertical transport field-effect transistors (VTFETs) from the plurality of fins using a replacement metal gate (RMG) process. A gate surrounding at least one fin of a given one of the VTFETs comprises a gate self-aligned contact (SAC) capping layer disposed over a gate contact metal layer, the gate contact metal layer being disposed adjacent an end of the at least one fin.

17 Claims, 45 Drawing Sheets

(51) Int. Cl.
*H01L 29/786* (2006.01)
*H01L 27/092* (2006.01)
*H01L 29/66* (2006.01)
*H01L 29/423* (2006.01)

(56) References Cited

U.S. PATENT DOCUMENTS

| | | | |
|---|---|---|---|
| 7,683,428 B2 | 3/2010 | Chidambarrao et al. | |
| 8,455,932 B2 | 6/2013 | Khakifirooz et al. | |
| 8,865,581 B2 | 10/2014 | Clark | |
| 8,877,575 B2 | 11/2014 | Fumitake | |
| 9,136,178 B2 | 9/2015 | Li et al. | |
| 9,209,278 B2 | 12/2015 | Tang et al. | |
| 9,502,566 B2 | 11/2016 | Fenouillet-Beranger et al. | |
| 9,530,863 B1 | 12/2016 | Zhang et al. | |
| 9,536,793 B1 | 1/2017 | Zhang et al. | |
| 9,613,868 B2 | 4/2017 | Yu | |
| 9,640,636 B1 * | 5/2017 | Bentley | H01L 29/66666 |
| 9,653,465 B1 * | 5/2017 | Balakrishnan | H01L 27/088 |
| 9,773,708 B1 | 9/2017 | Zhang et al. | |
| 9,780,208 B1 | 10/2017 | Xie et al. | |
| 9,799,751 B1 * | 10/2017 | Zhang | H01L 29/66666 |
| 9,859,421 B1 | 1/2018 | Robison et al. | |
| 9,882,047 B2 | 1/2018 | Leobandung | |
| 9,911,738 B1 | 3/2018 | Niimi et al. | |
| 9,935,199 B2 | 4/2018 | Ching et al. | |
| 2006/0166429 A1 | 7/2006 | Chaudhry et al. | |
| 2006/0261406 A1 | 11/2006 | Chen | |
| 2017/0053913 A1 | 2/2017 | Min et al. | |
| 2017/0162446 A1 | 6/2017 | Balakrishnan et al. | |
| 2017/0179282 A1 | 6/2017 | Balakrishnan et al. | |
| 2017/0288056 A1 | 10/2017 | Balakrishnan et al. | |
| 2018/0006118 A1 | 1/2018 | Mallela et al. | |
| 2018/0019337 A1 | 1/2018 | Xie et al. | |
| 2018/0053847 A1 | 2/2018 | Balakrishnan et al. | |

OTHER PUBLICATIONS

A.P. Jacob et al., "Scaling Challenges for Advanced CMOS Devices," International Journal of High Speed Electronics and Systems, 2017, 76 pages, vol. 26, No. 1.

Disclosed Anonymously, "Method and Structure of Forming VFET Bottom Spacer and Replacement Gate," ip.com, ip.com No. IPCOM000250753D, Aug. 30, 2017, 9 pages.

List of IBM Patents or Patent Applications Treated as Related.

* cited by examiner

300

400

500

600

700

800

900

1000

1100

1200

1300

1400

1500

1600

1700

1800

1900

2000

2100

2200

2300

2500

2700

2800

2900

3100

3200

3400

3700

3800

3900

4000

4200

4300

4400

US 10,373,912 B2

REPLACEMENT METAL GATE PROCESSES FOR VERTICAL TRANSPORT FIELD-EFFECT TRANSISTOR

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for replacement metal gate (RMG) processes for vertical transport field-effect transistors (VTFETs).

In one embodiment, a method of forming a semiconductor structure comprises forming a plurality of fins disposed over a top surface of a substrate and forming one or more VTFETs from the plurality of fins using a RMG process. A gate surrounding at least one fin of a given one of the VTFETs comprises a gate self-aligned contact (SAC) capping layer disposed over a gate contact metal layer, the gate contact metal layer being disposed adjacent an end of the at least one fin.

In another embodiment, a semiconductor structure comprises a substrate and a plurality of fins disposed over a top surface of the substrate, the plurality of fins comprising channels for one or more VTFETs formed with a RMG process. A given one of the VTFETs comprises a gate surrounding at least one of the plurality of fins, the gate of the given VTFET comprising a gate SAC capping layer disposed over a gate contact metal layer, the gate contact metal layer being disposed adjacent an end of the at least one fin.

In another embodiment, an integrated circuit comprises one or more VTFETs comprising a substrate and a plurality of fins disposed over a top surface of the substrate, the plurality of fins comprising channels for the one or more VTFETs formed with a RMG process. A given one of the VTFETs comprises a gate surrounding at least one of the plurality of fins, the gate of the given VTFET comprising a gate SAC capping layer disposed over a gate contact metal layer, the gate contact metal layer being disposed adjacent an end of the at least one fin.

DETAILED DESCRIPTION

Figure 1:
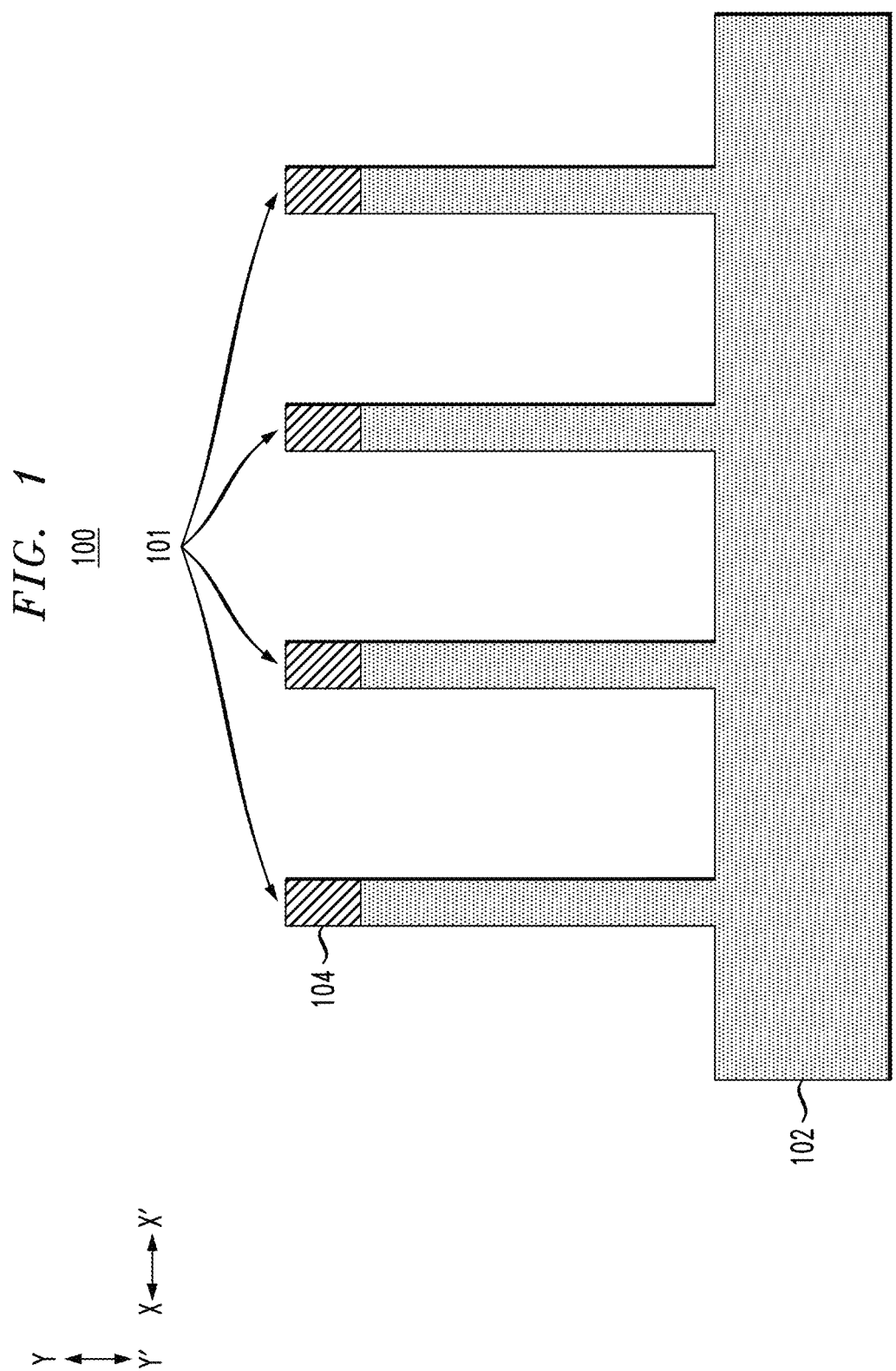
FIG. 1 depicts a side cross-sectional view of a semiconductor structure with a plurality of fins disposed over a substrate, according to an embodiment of the invention.

Illustrative embodiments of the invention may be described herein in the context of illustrative methods for replacement metal gate processes for vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical FET process flows have strict constraints on thermal budgets for downstream processing steps, such as top source/drain epitaxial growth and dopant activation anneal processes, because the high-k metal gate (HKMG) module is formed earlier in processing. Channel length (Lgate) is highly dependent on metal gate recess processing, which causes large chip variation in Lgate. High temperature processes (e.g., greater than 550 degrees Celsius (° C.)) for top source/drain module causes threshold voltage (Vt) shift, increase in inversion thickness (Tiny), and leakage current metric (Toxgl) degradation due to oxygen and metal diffusion into the channel. Thus, replacement metal gate (RMG) process flows for vertical transport FETs (VTFETs) are needed.

Embodiments provide techniques for forming VTFET devices with a RMG process, removing the limitation of thermal budgets for gate stacks. RMG processes disclosed herein provide an accurate Lgate definition as well as self-aligned top junctions. In addition to providing techniques for forming VTFETs with a RMG process, embodiments also allow for formation of VTFETs with multiple channel lengths, self-aligned gate cap formation to avoid gate-to-source/drain region shorts, and CMOS patterning with negligible n/p boundary shift.

Illustrative processes for forming VTFETs using RMG processes, including VTFETs with multiple channel lengths and CMOS VTFET devices, will now be described with respect to FIGS. 1-45.

FIG. 1 depicts a side cross-sectional view 100 of a semiconductor structure, comprising a substrate 102 with a plurality of fins 101 formed therein. As shown, each of the fins 101 is topped by a hard mask 104. The fins 101 may be formed using sidewall image transfer (SIT) or other suitable techniques such as lithography and etching including reactive-ion etching (ME), etc. Each of the fins 101 may have a width or horizontal thickness (in direction X-X') in the range of 5 nanometers (nm) to 10 nm, although other widths above or below this range may be used as desired for a particular application. Each of the fins 101 may have a height or vertical thickness (in direction Y-Y') ranging from 30 nm to 150 nm, although other heights above or below this range may be used as desired for a particular application. A spacing between adjacent ones of the fins 101 may be in the range of 20 nm to 100 nm, although other spacing may be used as desired for a particular application.

In some embodiments, the substrate 102 comprises a semiconductor substrate formed of silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The fins 101 are formed by patterning the substrate 102 as discussed above, and thus may be formed of the same material as the substrate 102.

The substrate 102 may have a width or horizontal thickness (X-X') selected as desired based on a number of fins 101 or other features to be formed thereon. The substrate 102 may have a height or vertical thickness (in direction Y-Y') in the range of 20 nm to 500 nm, although other heights above or below this range may be used as desired for a particular application.

The hard mask 104 may be initially formed over a top surface of the entire substrate, followed by patterning using SIT or other suitable techniques, with the fins 101 being formed by etching portions of the substrate exposed by the patterned hard mask 104. The hard mask 104 may be formed of silicon nitride (SiN), although other suitable materials such as silicon oxide (SiOx), silicon dioxide ($SiO_2$) and silicon oxynitride (SiON) may be used. The hard mask 104 may have a height or vertical thickness (in direction Y-Y') in the range of 20 nm to 100 nm, although other heights above or below this range may be used as desired for a particular application.

Figure 2:
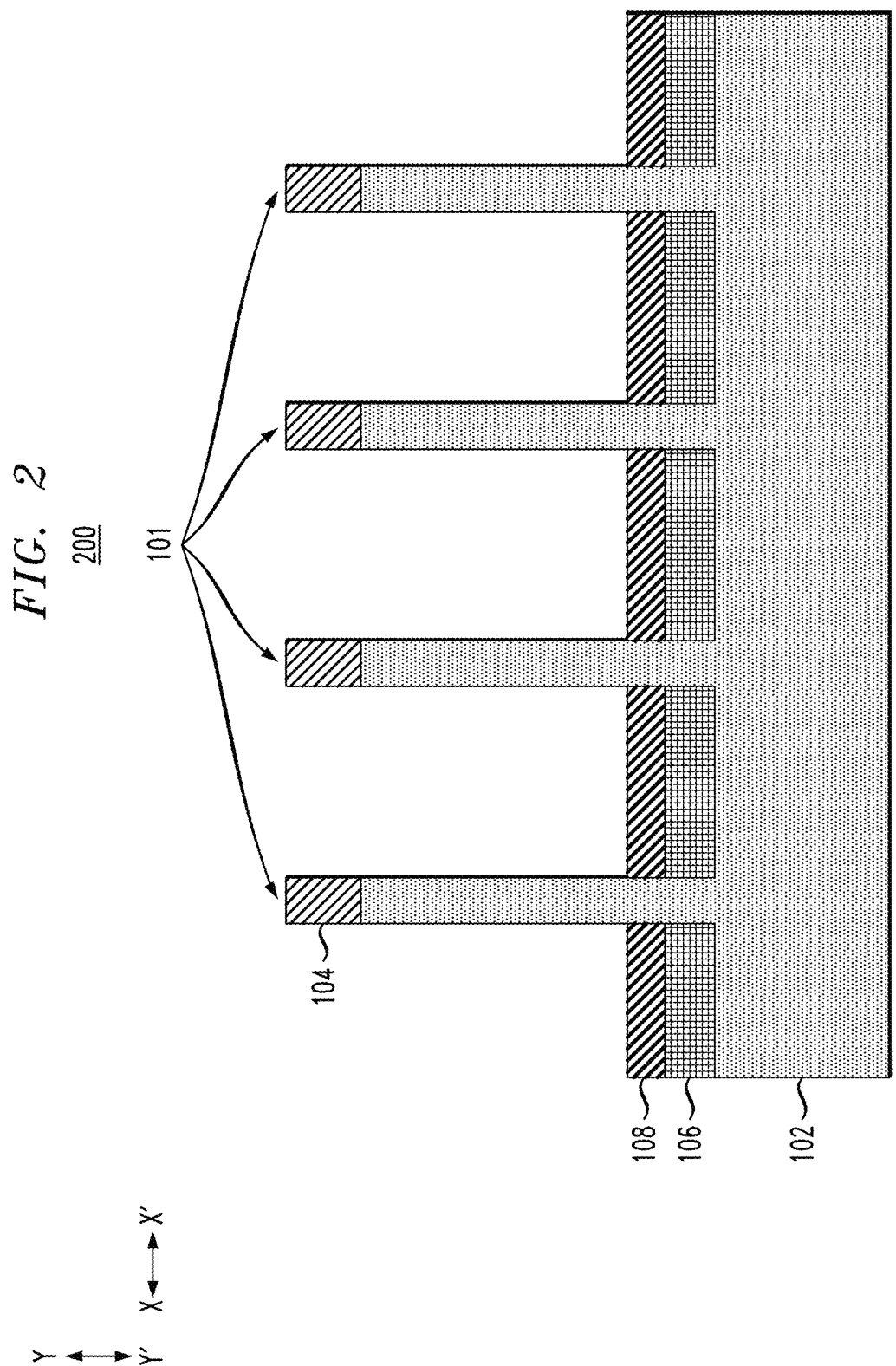
FIG. 2 depicts a side cross-sectional view of the semiconductor structure of FIG. 1 following formation of bottom source/drain regions and bottom spacers, according to an embodiment of the invention.

FIG. 2 depicts a side cross-sectional view 200 of the semiconductor structure of FIG. 1 following formation of bottom source/drain regions 106 over a top surface of the substrate 102 surrounding the fins 101, and formation of bottom spacers 108 over the bottom source/drain regions 106 surrounding the fins 101.

The bottom source/drain regions 106 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain regions 106 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

The bottom source/drain regions 106 may have a height or vertical thickness (in direction Y-Y') in the range of 10 nm to 50 nm, although other heights above or below this range may be used as desired for a particular application.

The bottom spacers 108 are formed over the bottom source/drain regions 106 using non-conformal deposition and etch-back processing (e.g., physical vapor deposition (PVD), high density plasma (HDP) deposition, etc.). The bottom spacers 108 may be formed of $SiO_2$, SiN, silicon carbide oxide (SiCO), silicon boron carbide nitride (SiBCN), etc., although other suitable materials may be used. The bottom spacers 108 may have a height or vertical thickness (in direction Y-Y') in the range of 3 nm to 10 nm, although other heights above or below this range may be used as desired for a particular application.

Figure 3:
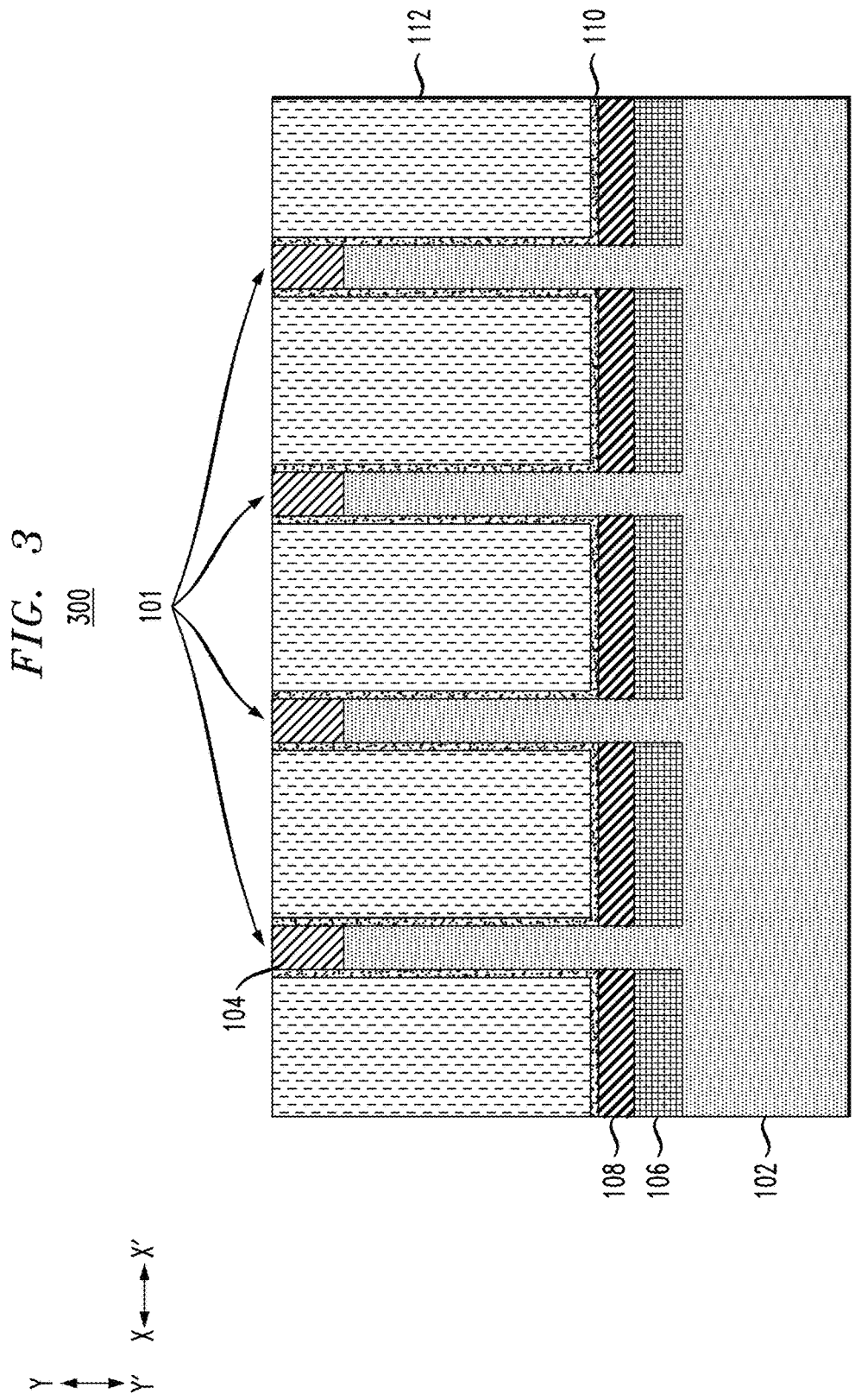
FIG. 3 depicts a side cross-sectional view of the semiconductor structure of FIG. 2 following dummy gate formation, according to an embodiment of the invention.

FIG. 3 depicts a side cross-sectional view 300 of the semiconductor structure of FIG. 2 following dummy gate formation. Dummy gate formation includes formation of an oxide 110 over top surfaces of the bottom spacers 108 and on sidewalls of the fins 101 and hard mask 104. The oxide 110 may be formed by a conformal deposition process, such as atomic layer deposition (ALD) or chemical vapor deposition (CVD). The oxide 110 may be formed of $SiO_2$, SiON, etc., although other suitable materials may be used. The oxide 110 may have a uniform thickness in the range of 2 nm to 6 nm, although other thicknesses above or below this range may be used as desired for a particular application.

Dummy gate 112 is formed over the oxide 110, using processing such as CVD or ALD. The dummy gate 112 may be formed of amorphous silicon (a-Si), amorphous silicon germanium (a-SiGe), $SiO_2$, titanium oxide ($TiO_2$) or another suitable material.

Figure 4:
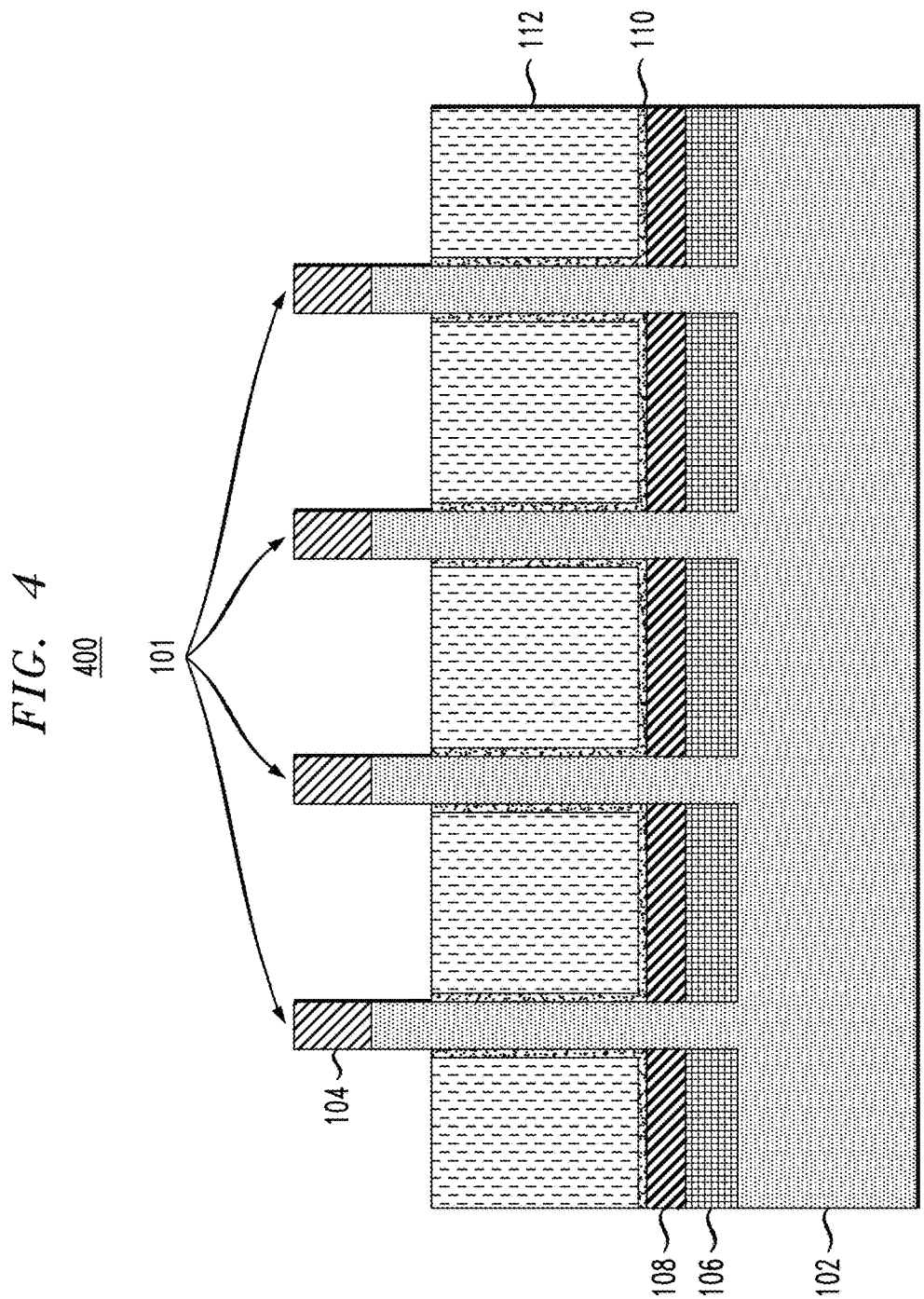
FIG. 4 depicts a side cross-sectional view of the semiconductor structure of FIG. 3 following recess of the dummy gate, according to an embodiment of the invention.

FIG. 4 depicts a side cross-sectional view 400 of the semiconductor structure of FIG. 3 following recess of the dummy gate 112 and removal of exposed portions of the oxide 110 on sidewalls of the fins 101 and hard masks 104 disposed over the fins 101. The dummy gate 112 and oxide 110 may be recessed using processing such as a wet etch, RIE, etc. The dummy gate 112 and oxide 110 may be recessed a depth (in direction Y-Y') in the range of 5 nm to 20 nm, although other depths may be used, so long as at least a portion of the sidewalls of the fins 101 below the hard mask 104 is exposed.

Figure 5:
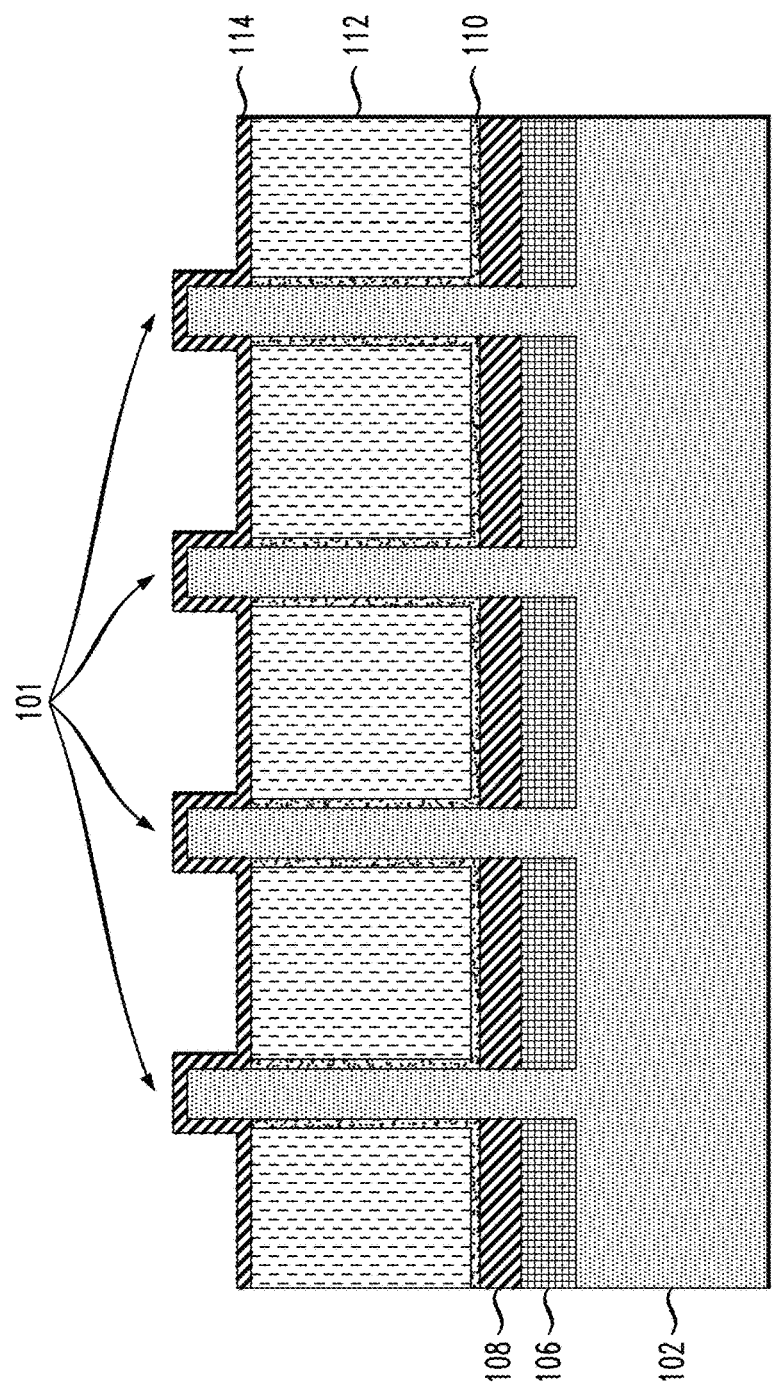
FIG. 5 depicts a side cross-sectional view of the semiconductor structure of FIG. 4 following formation of top spacers, according to an embodiment of the invention.

FIG. 5 depicts a side cross-sectional view 500 of the semiconductor structure of FIG. 4 following removal of the hard masks 104 and formation of top spacers 114. The hard masks 104 may be removed using selective dry or wet etch processing. The top spacers 114 may be formed using a conformal deposition such as ALD or CVD processing. The top spacers 114 may be formed of SiN, $SiO_2$ or another suitable material such as SiON, SiOC, SiBCN, etc. The top spacers 114 may have a uniform thickness in the range of 3 nm to 10 nm, although other thicknesses above or below this range may be used as desired for a particular application.

Figure 6:
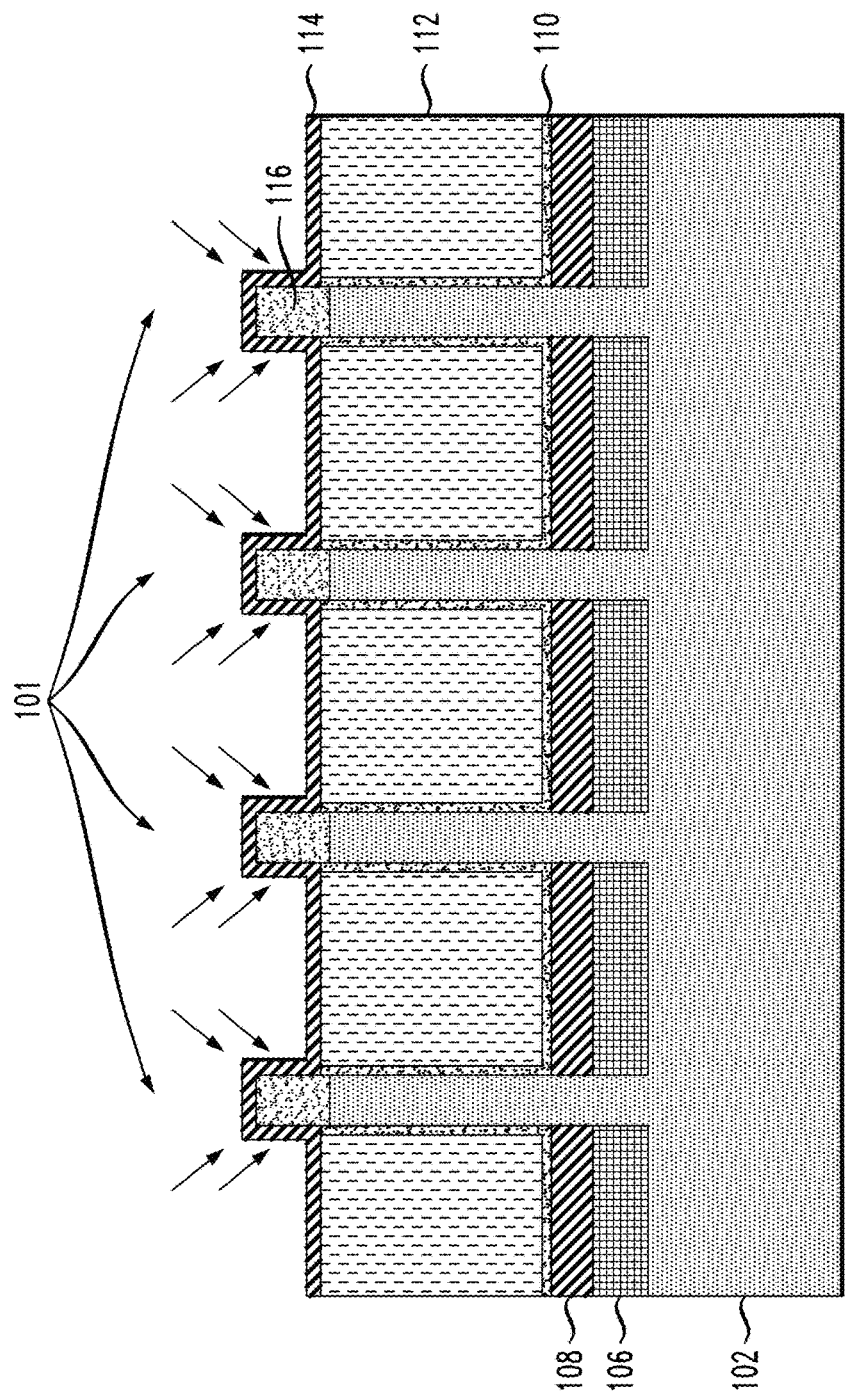
FIG. 6 depicts a side cross-sectional view of the semiconductor structure of FIG. 5 following formation and activation of top junctions, according to an embodiment of the invention.

FIG. 6 depicts a side cross-sectional view 600 of the semiconductor structure of FIG. 5 following formation and activation of top junctions 116. Ion implantation, plasma doping or another suitable process is used to form top junctions 116 (e.g., heavily doped regions) at the tops of the fins 101. The top junctions 116 may use dopants including n-type dopants selected from a group of phosphorus (P), arsenic (As) and antimony (Sb) and p-type dopants selected from a group of boron (B), boron fluoride ($BF_2$), gallium (Ga), indium (In) and thallium (Tl). The height of the top junctions 116 extends in a region of the fins below a bottom surface of the top spacers 114. The top junctions 116 may have a height or vertical thickness (in direction Y-Y') in the range of 5 nm to 20 nm, although other heights above or below this range may be used as desired for a particular application.

Figure 7:
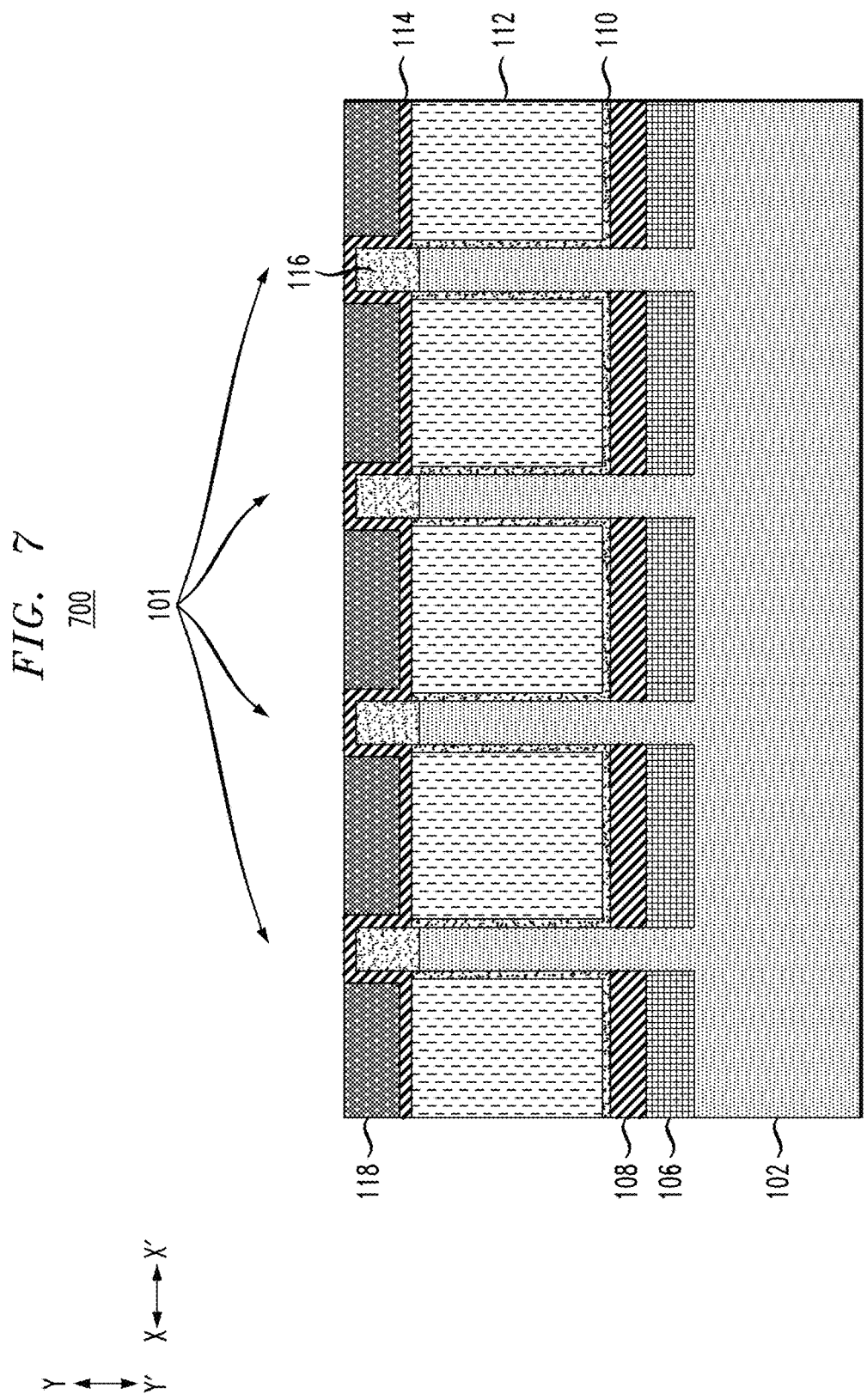
FIG. 7 depicts a side cross-sectional view of the semiconductor structure of FIG. 6 following fill with an isolation layer, according to an embodiment of the invention.

FIG. 7 depicts a side cross-sectional view 700 of the semiconductor structure of FIG. 6 following fill with an isolation or interlevel dielectric (ILD) layer 118. The isolation layer 118 may be formed of $SiO_2$ or another suitable material such as SiOC, SiON, etc. The isolation layer 118 may be formed by fill with the isolation material followed by planarization using chemical mechanical polishing or planarization (CMP) to a top surface of the top spacers 114.

Figure 8:
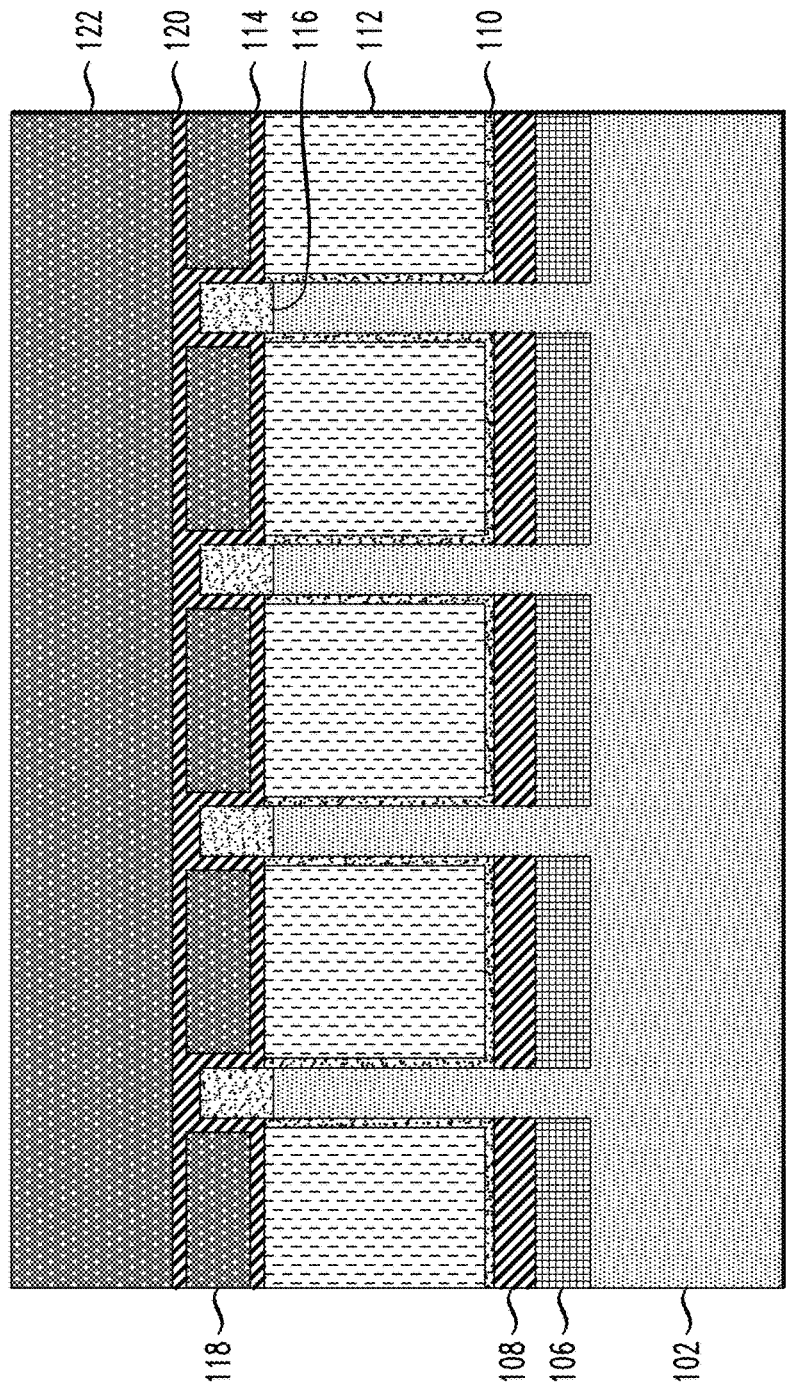
FIG. 8 depicts a side cross-sectional view of the semiconductor structure of FIG. 7 following formation of an additional spacer and interlevel dielectric, according to an embodiment of the invention.

FIG. 8 depicts a side cross-sectional view 800 of the semiconductor structure of FIG. 7 following formation of a spacer 120 and an ILD layer 122. The spacer 120 may be formed of SiN, although other suitable materials such as $SiO_2$, SiON, SiBCN, SiCO, etc. may be used. The spacer 120 may have a height or vertical thickness (in direction Y-Y') in the range of 5 nm to 15 nm, although other heights above or below this range may be used as desired for a particular application. The spacer 120 may be formed using conformal deposition processing such as ALD or CVD.

The ILD 122 may be formed of $SiO_2$, although other suitable materials such as SiON, SiCO, etc. may be used. The ILD 122 may be formed using CVD or ALD processing.

The ILD 122 may have a height or vertical thickness (in direction Y-Y') in the range of 30 nm to 150 nm, although other heights above or below this range may be used as desired for a particular application.

Figure 9:
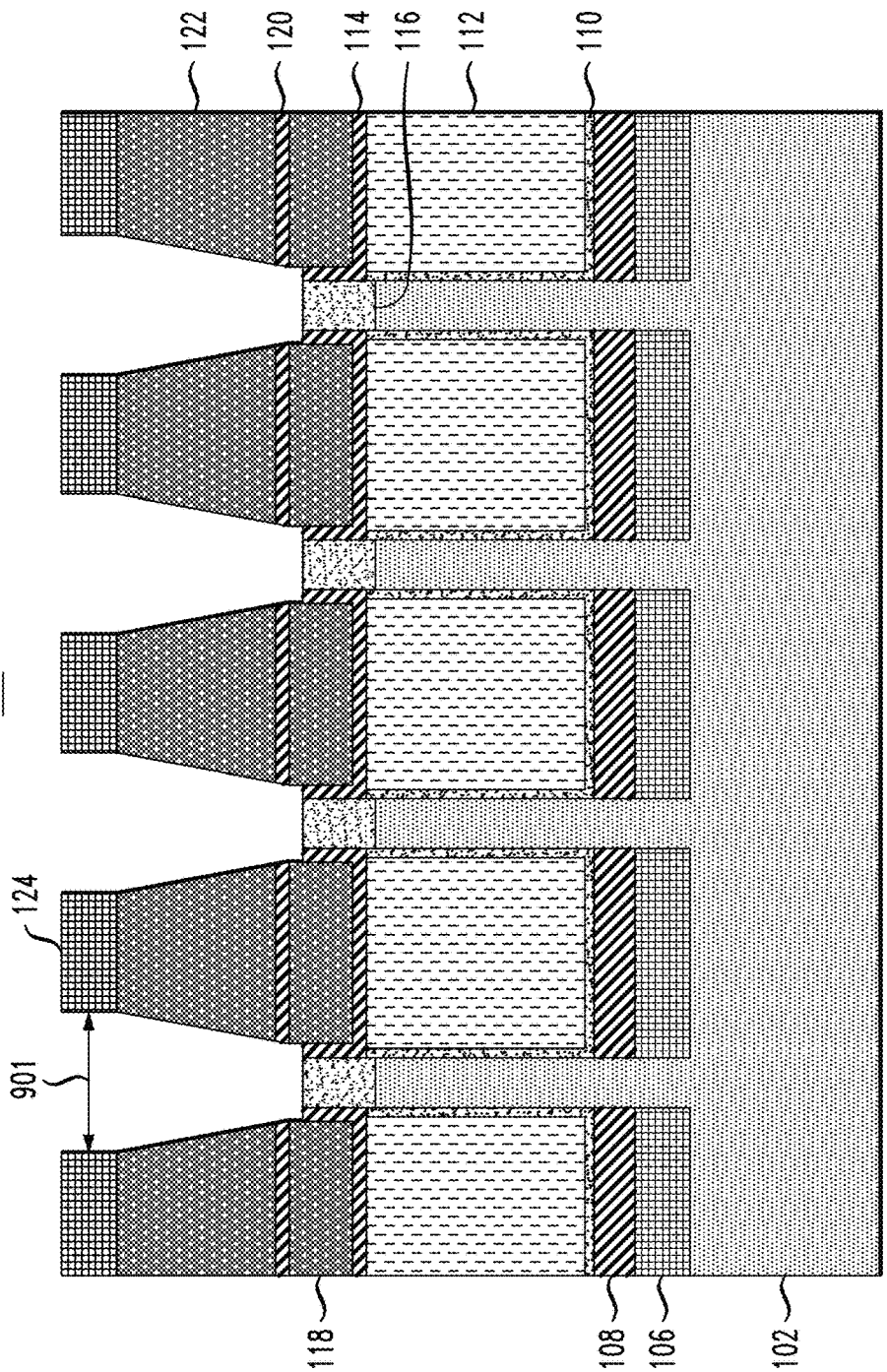
FIG. 9 depicts a side cross-sectional view of the semiconductor structure of FIG. 8 following opening to expose the tops of the junctions for formation of top source/drain contacts, according to an embodiment of the invention.

FIG. 9 depicts a side cross-sectional view 900 of the semiconductor structure of FIG. 8 following opening to expose the tops of the junctions 116 for formation of top source/drain contacts. A mask layer 124 is patterned over a top surface of the ILD 122, using lithography and etching or other suitable techniques. The mask layer 124 may be formed of a suitable combination of organic materials, $SiO_2$, titanium oxide ($TiO_x$), although other suitable materials may be used. The mask layer 124 may have a height or vertical thickness (in direction Y-Y') in the range of 30 nm to 150 nm, although other heights above or below this range may be used as desired for a particular application.

The mask layer 124 is patterned so to provide openings above the tops of the fins 101. The tops of the openings above the fins 101 are wider than the fins 101, such as having a width 901 in the range of 20 nm to 80 nm, which narrow to a width substantially matching the widths of the fins 101 as distance from a top surface of the fins 101 decreases. The openings in ILD 122 may be formed by directional RIE or other suitable processing.

Figure 10:
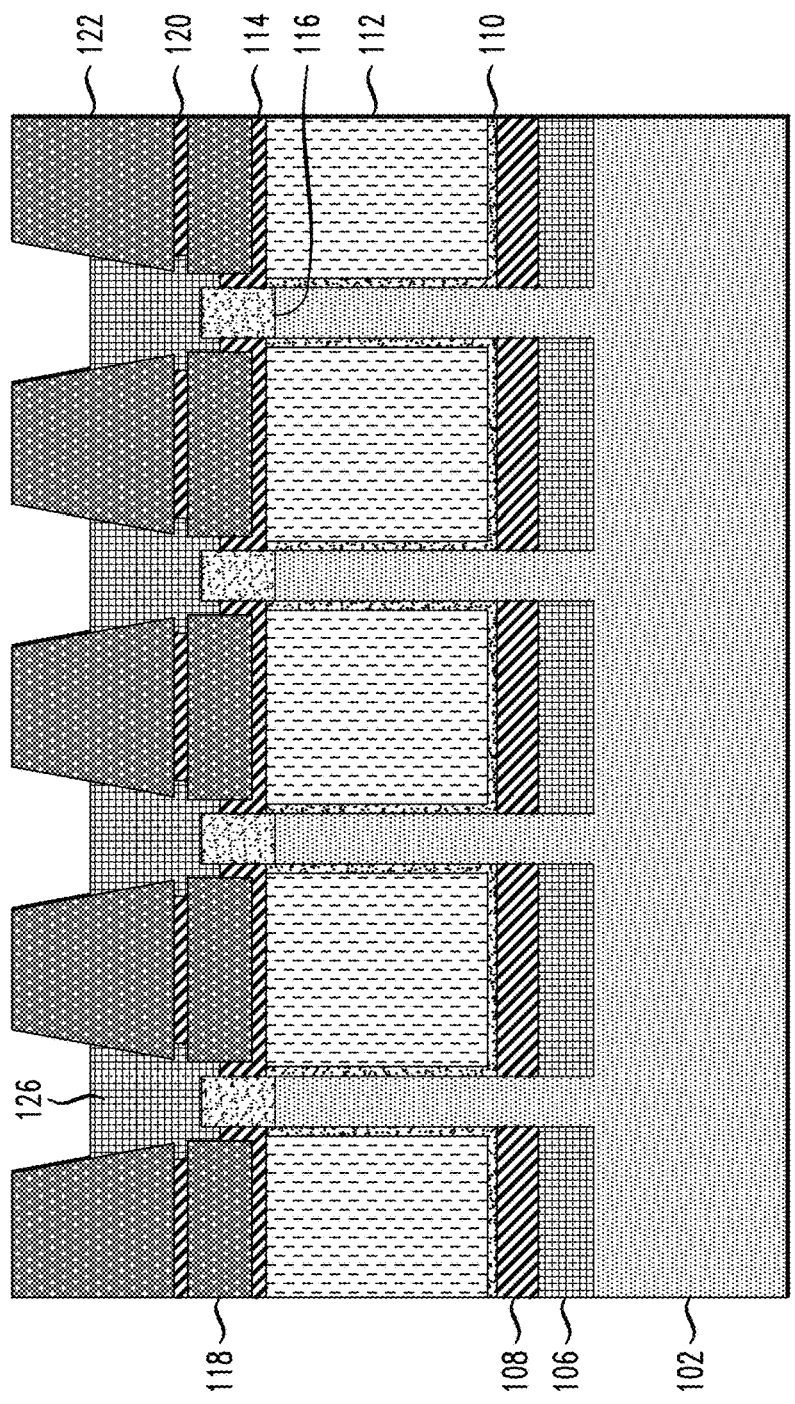
FIG. 10 depicts a side cross-sectional view of the semiconductor structure of FIG. 9 following top source/drain formation, according to an embodiment of the invention.

FIG. 10 depicts a side cross-sectional view 1000 of the semiconductor structure of FIG. 9 following top source/drain formation. The mask layer 124 is removed, using processing such as plasma ashing/removal. To assist with epitaxial growth, a lateral etch of material of the spacers 114 and 120 may optionally be performed. Following the optional lateral etch, top source/drain regions 126 are epitaxially grown over the junctions 116 (and in the regions exposed by the optional lateral etch of spacers 114 and 120). The top source/drain regions 126 may have a height or vertical thickness (in direction Y-Y') in the range of 10 nm to 50 nm, although other heights above or below this range may be used as desired for a particular application. The top source/drain regions 126 may be formed of similar materials as the bottom source/drain regions 106.

Figure 11:
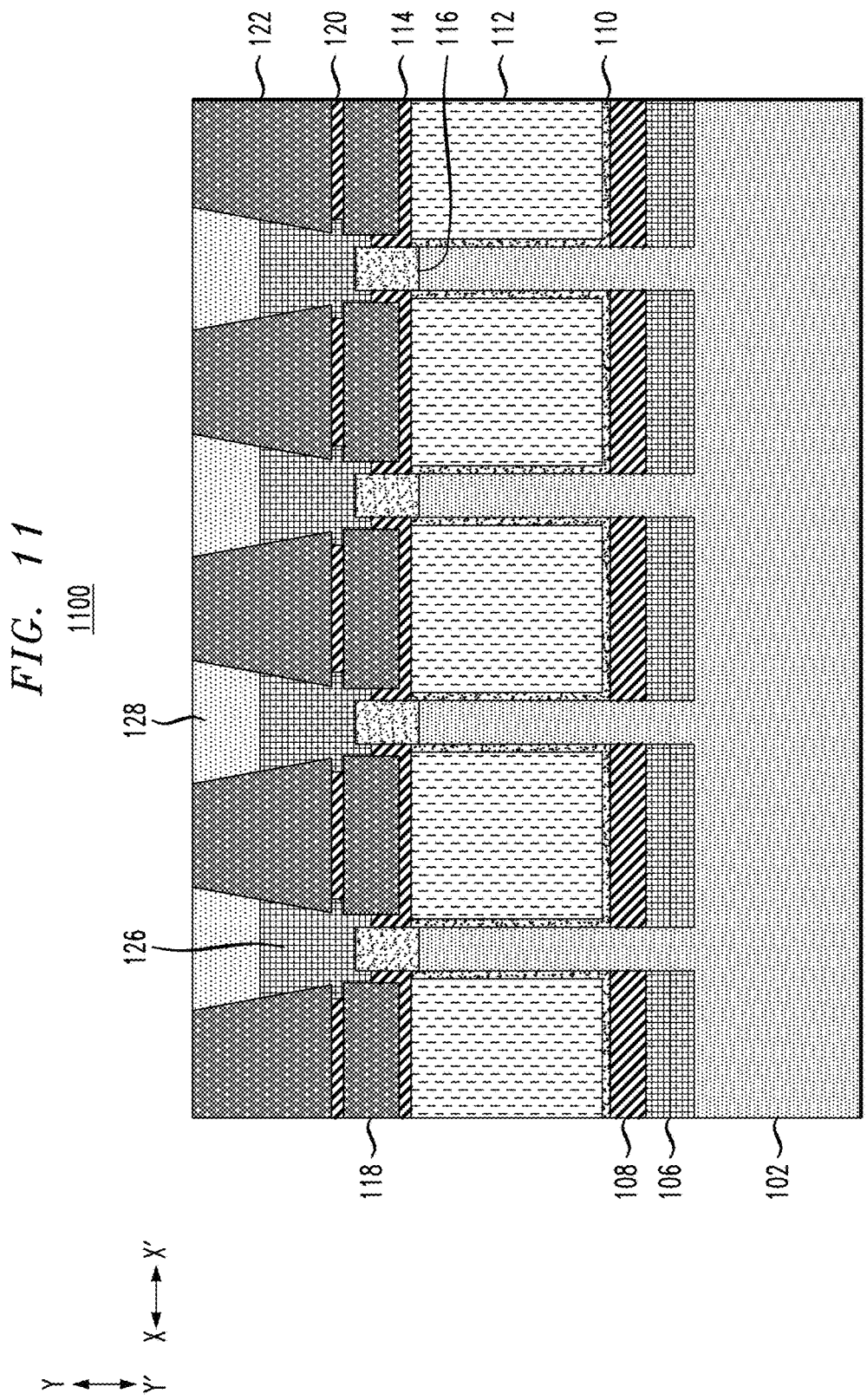
FIG. 11 depicts a side cross-sectional view of the semiconductor structure of FIG. 10 following fill with a metal layer over the top source/drain regions, according to an embodiment of the invention.

FIG. 11 depicts a side cross-sectional view 1100 of the semiconductor structure of FIG. 10 following fill with metal to form a metal layer 128 over the top source/drain regions 126. The metal layer 128, also referred to as top source/drain contact metal layers, may be formed of tungsten (W), although other suitable materials such as titanium (Ti), cobalt (Co), etc. may be used. The metal layer 128 may be formed by fill with the metal material followed by planarizing using CMP or another suitable technique such that a top surface of the metal layer 128 is substantially coplanar with a top surface of ILD 122.

Figure 12:
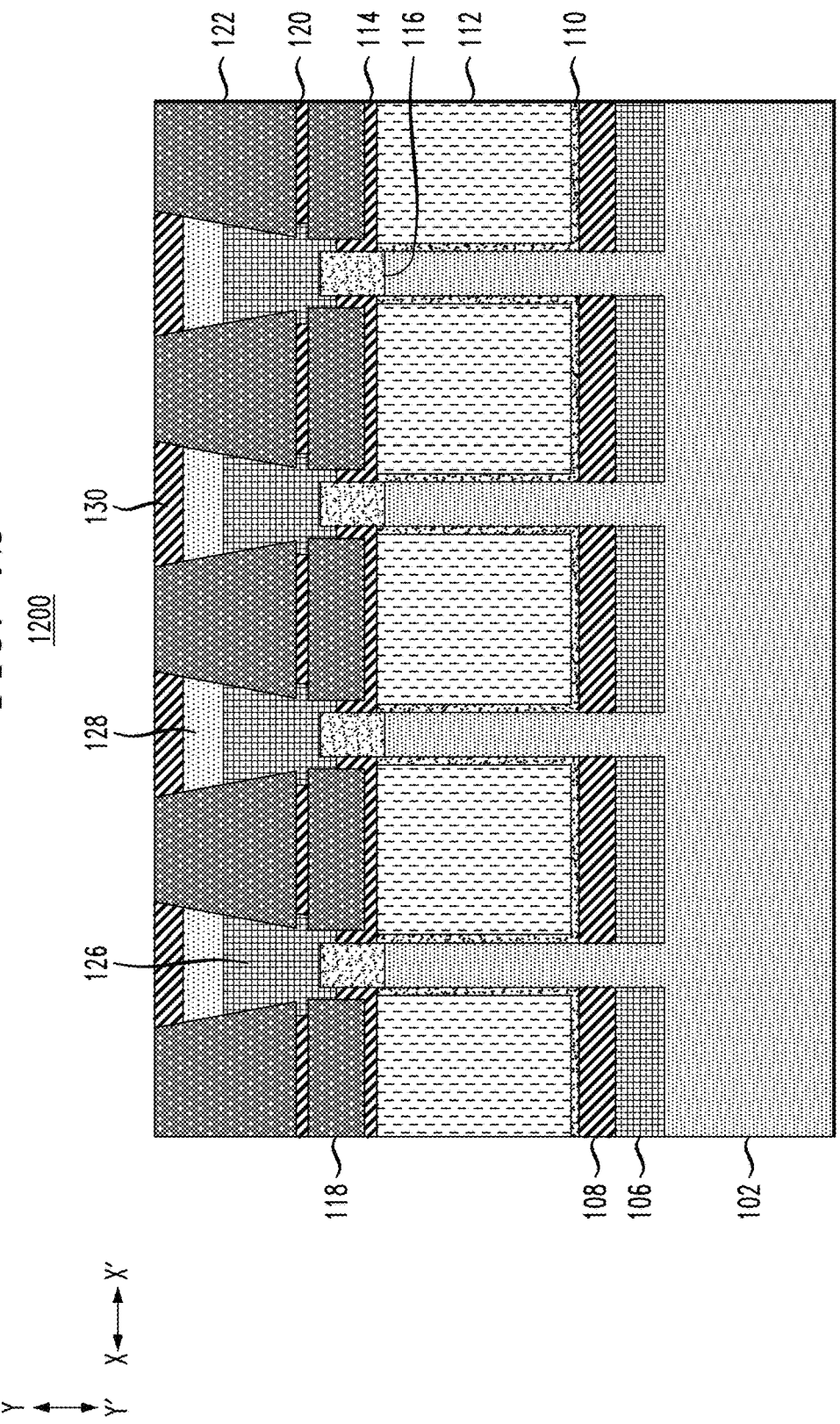
FIG. 12 depicts a side cross-sectional view of the semiconductor structure of FIG. 11 following recess of the metal layer and formation of a top source/drain self-aligned contact capping layers, according to an embodiment of the invention.

FIG. 12 depicts a side cross-sectional view 1200 of the semiconductor structure of FIG. 11 following recess of the metal layer 128 and formation of a self-aligned contact (SAC) capping layer 130, also referred to as top source/drain SAC capping layers, over top surfaces of the metal layer 128. The metal layer 128 may be recessed using a wet or dry etch process. The SAC capping layer 130 may be formed using ALD or CVD processing. The metal layer 128 may be recessed to a depth in the range of 5 nm to 20 nm, although other depths outside this range may be used as desired for a particular application. The SAC capping layer 130 may have a height or thickness (in direction Y-Y') that matches the depth to which the metal layer 128 is recessed, such that the SAC capping layer 130 has a top surface matching the top surface of ILD 122.

Figure 13:
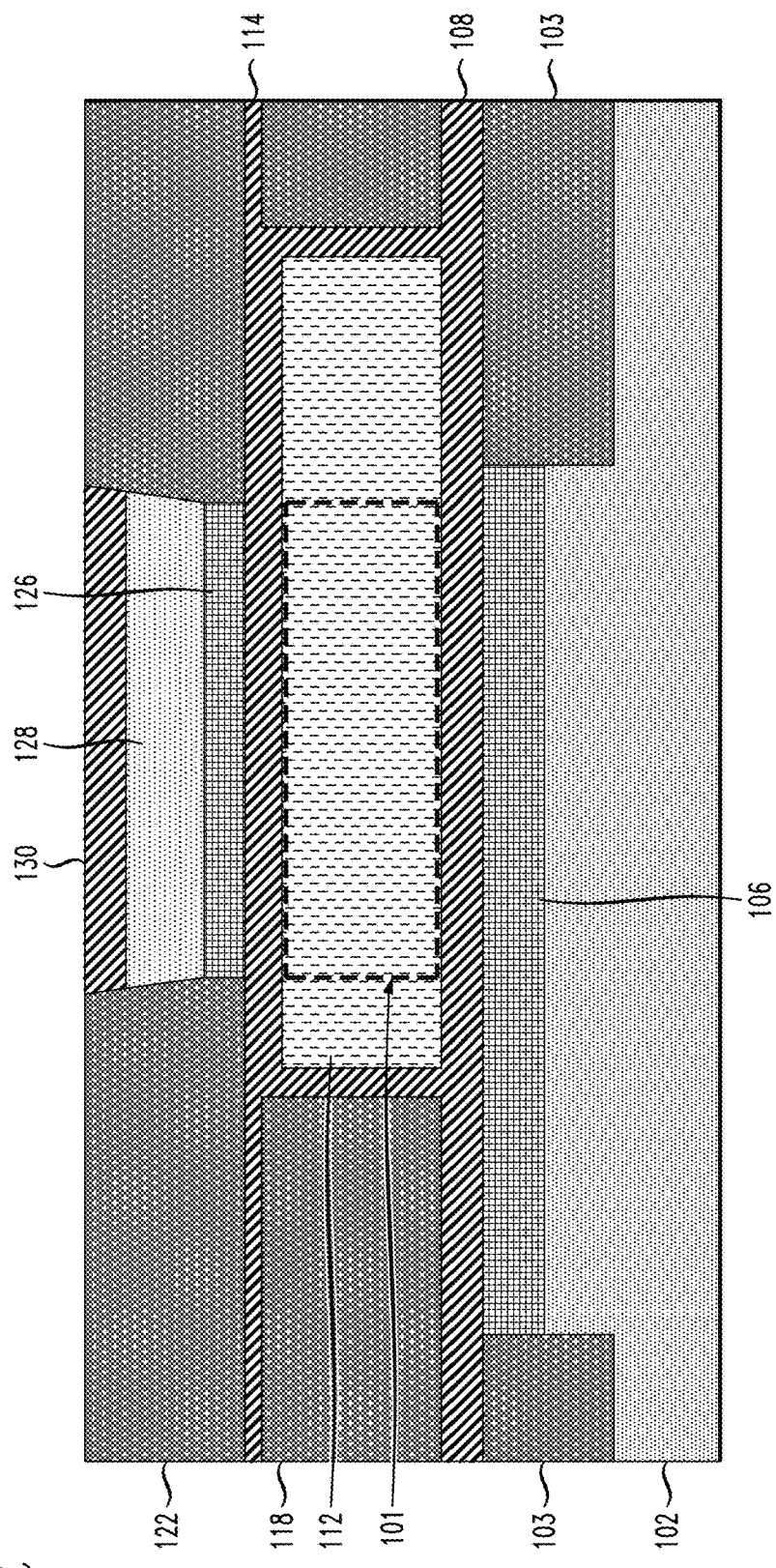
FIG. 13 depicts another side cross-sectional view of the semiconductor structure of FIG. 11 after formation of the top source/drain self-aligned contact capping layers, according to an embodiment of the invention.

FIG. 13 depicts another side cross-sectional view 1300 of the semiconductor structure of FIG. 11 following formation of the SAC capping layer 130. While the side cross-sectional view 1200 of FIG. 12 (as well as the side cross-sectional views of FIGS. 1-11) is taken perpendicular to the fins 101, the side cross-sectional view 1300 is taken parallel to the fins 101. One of the fins 101 is shown in dashed outline in the side cross-sectional view 1300, indicating that it is "behind" the dummy gate 112 in this view. The side cross-sectional view 1300 further shows shallow trench isolation (STI) regions 103 formed as shown. The STI regions 103 may be formed of similar materials as the isolation layer 118 and ILD 122.

Figure 14:
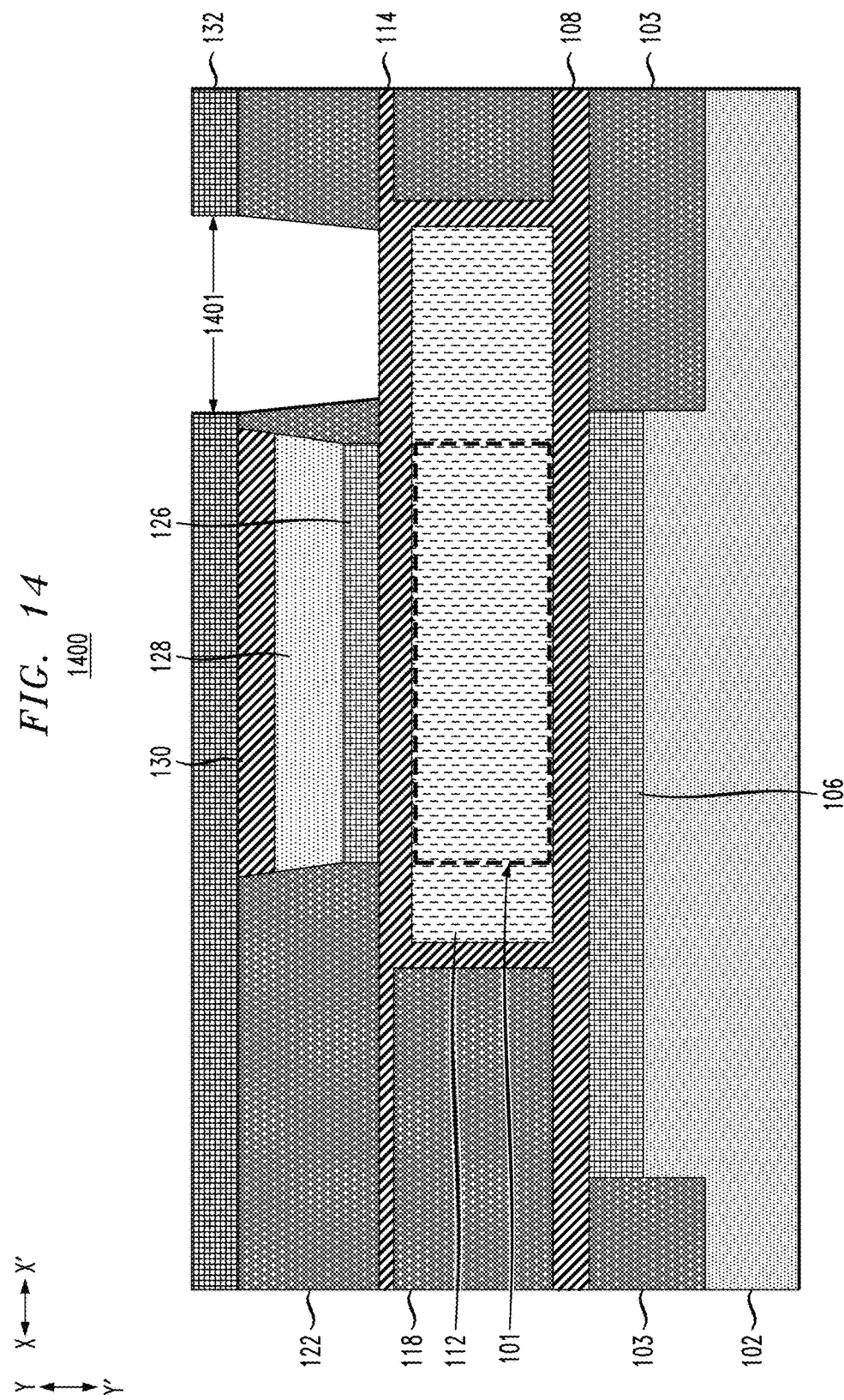
FIG. 14 depicts a side cross-sectional view of the semiconductor structure of FIGS. 12 and 13 following masking to open the dummy gate, according to an embodiment of the invention.

FIG. 14 depicts a side cross-sectional view 1400 of the semiconductor structure of FIGS. 12 and 13, following masking to open the dummy gate 112. The side cross-sectional view 1400, similar to the side cross-sectional view 1300, is taken parallel to the fins 101. A mask layer 132 is patterned over the top surface of the ILD 122 and SAC capping layer 130. The mask layer 132 may be formed with similar materials and sizing as that of the mask layer 124. The SAC capping layer 130 ensures that there will be no short between the top source/drain regions 126 and the gate. The mask layer 132 may be patterned as shown to open the dummy gate 112, as the SAC capping layer 130 over the top source/drain regions 126 is not merged due to the confined epitaxial layers. The opening to expose the dummy gate 112 may have a width 1401 of 75 nm or more generally in the range of 30 nm to 100 nm, although other widths outside this range may be used as desired for a particular application.

Figure 15:
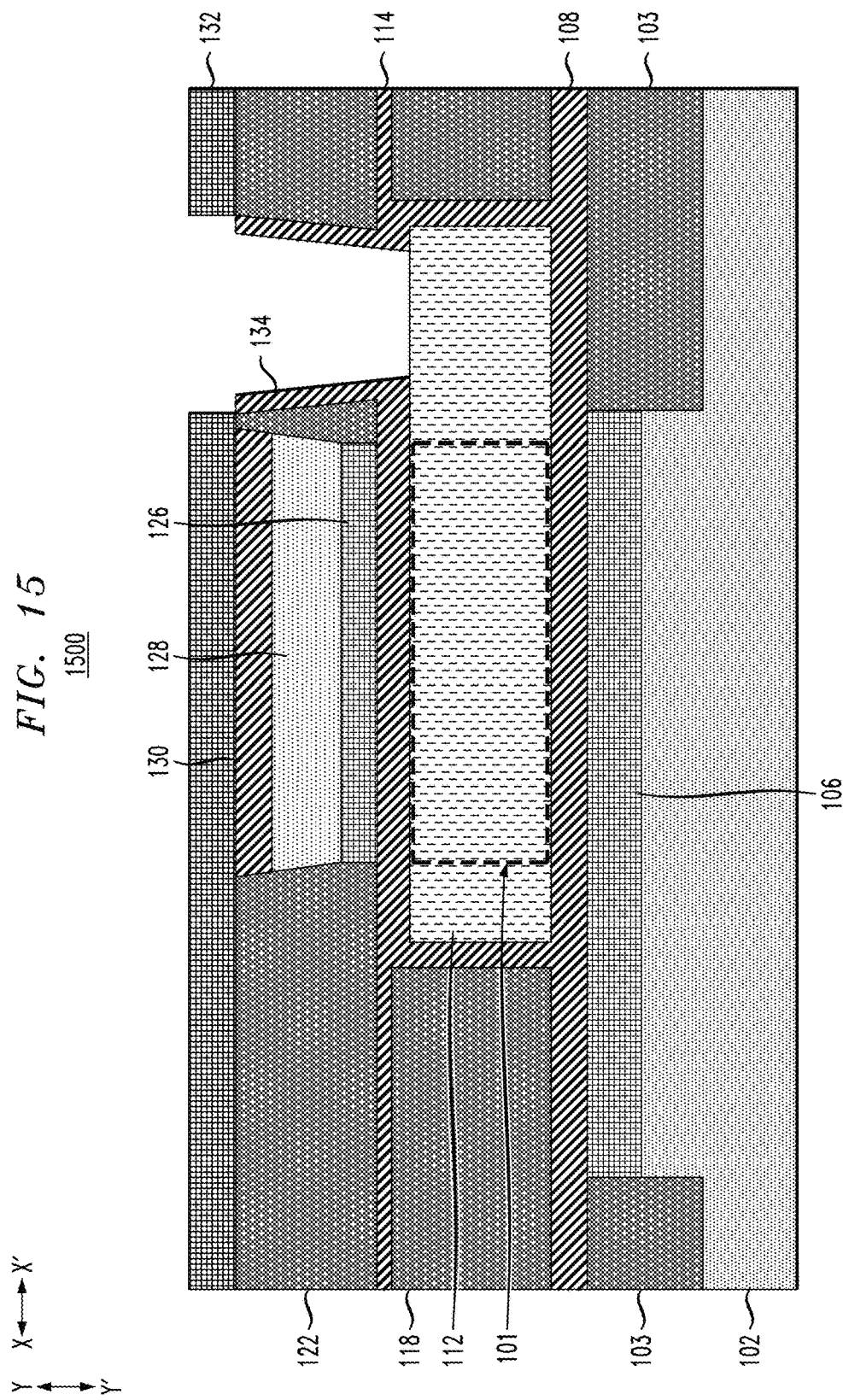
FIG. 15 depicts a side cross-sectional view of the semiconductor structure of FIG. 14 following formation of a liner on sidewalls of the gate opening, according to an embodiment of the invention.

FIG. 15 depicts a side cross-sectional view 1500 of the semiconductor structure of FIG. 14 following deposition of a liner 134 on sidewalls of the gate opening, and following a directional etch to expose the top surface of the dummy gate 112 in the gate opening. The liner 134 may be formed of a material similar to that of the bottom spacers 108 and top spacers 114 (e.g., SiN), although other suitable materials may be used. The liner 134 may have a thickness in the range of 3 nm to 10 nm, although other thicknesses outside this range may be used as desired for a particular application. The directional etch to expose the top surface of the dummy gate 112 may be a directional RIE.

Figure 16:
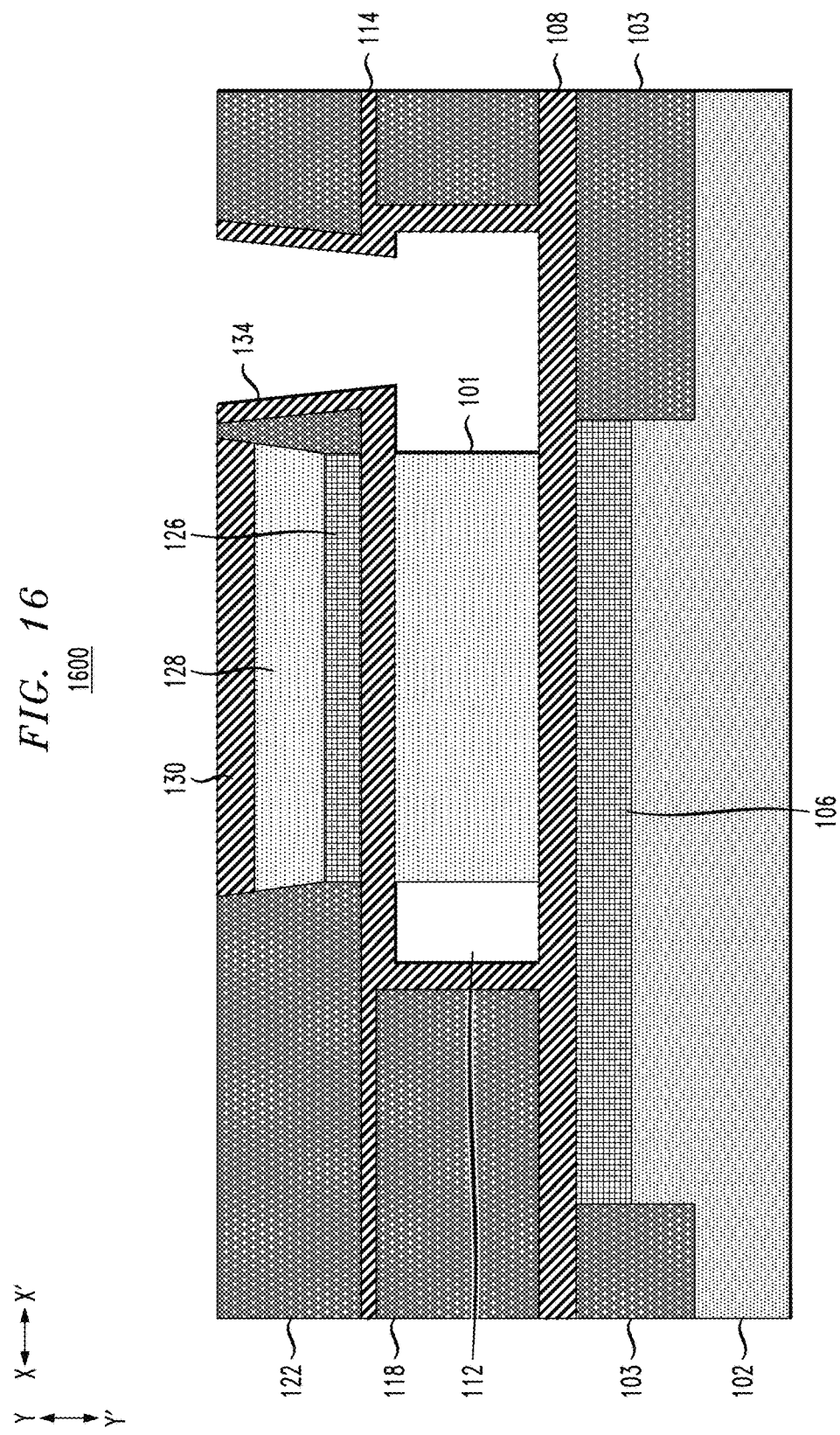
FIG. 16 depicts a side cross-sectional view of the semiconductor structure of FIG. 15 following removal of the dummy gate, according to an embodiment of the invention.

FIG. 16 depicts a side cross-sectional view 1600 of the semiconductor structure of FIG. 15 following removal of the dummy gate 112. The mask layer 132 is removed prior to removal of the dummy gate 112. The dummy gate 112 may be removed using gas phase etch, wet etch or other suitable processing to selectively remove the dummy gate 112 on the oxide layer 110, which protects the fin 101 during the removal of the dummy gate 112. The oxide layer 110 covering the fin 101 is removed, such as using a diluted HF etch prior to the replacement metal gate (RMG) process described in further detail below. Following removal of the dummy gate 112 and oxide layer 110 covering the fin 101, the fin 101 behind the dummy gate 112 is seen as illustrated.

Figure 17:
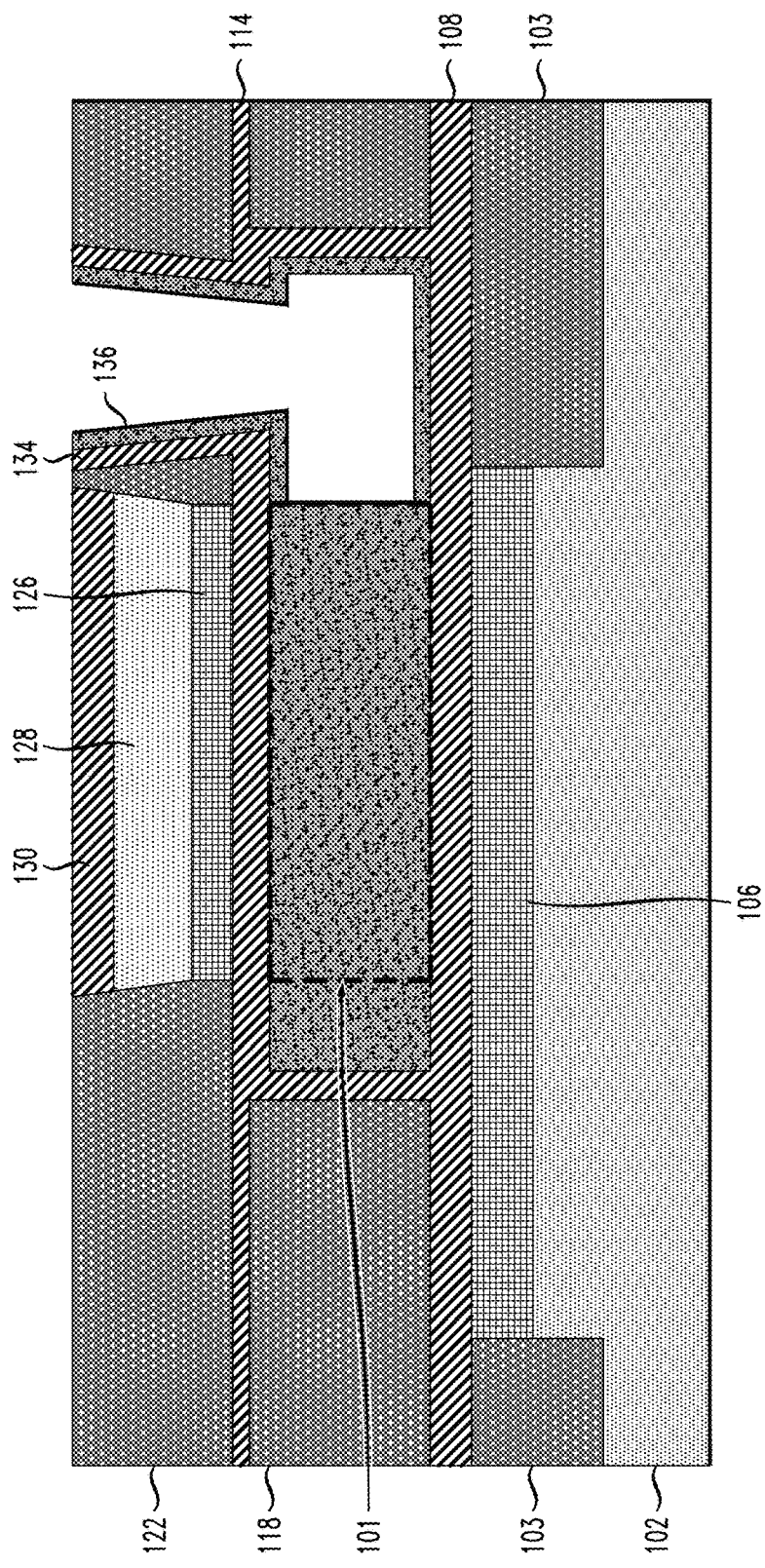
FIG. 17 depicts a side cross-sectional view of the semiconductor structure of FIG. 16 following a replacement metal gate process, according to an embodiment of the invention.

FIG. 17 depicts a side cross-sectional view 1700 of the semiconductor structure of FIG. 16 following a RMG process, where a gate dielectric (not shown) is formed surrounding the fin 101 followed by formation of a gate conductor 136.

The gate dielectric may be formed of a high-k dielectric material, although other suitable materials may be used. Examples of high-k materials include but are not limited to metal oxides such as hafnium oxide ($HfO_2$), hafnium silicon oxide (Hf-Si-O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric may have a uniform thickness in the range of 2 nm to 5 nm, although other thicknesses above or below this range may be used as desired for a particular application.

The gate conductor 136 may be formed of any suitable conducting material, including but not limited to, a metal (e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc.), a conducting metallic compound material (e.g., tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, nickel silicide, etc.), or any suitable combination of these and other suitable materials. The conductive material may further comprise dopants that are incorporated during or after deposition. In some embodiments, the gate conductor includes a work function metal (WFM) layer to set the threshold voltage of the vertical transistor to a desired value. The WFM may be: a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC); and combinations thereof.

The gate conductor 136 fills the regions around the fin 101 as shown, and has a thickness on sidewalls of the spacers and surrounding the gate opening in the range of 3 nm to 10 nm, although other thicknesses outside this range may be used as desired for a particular application.

The gate dielectric and gate conductor 136, as mentioned above, are formed using a RMG process. The gate dielectric film and the gate conductor 136 can be formed by suitable deposition processes such as CVD, plasma enhanced chemical vapor deposition (PECVD), ALD, evaporation, PVD, chemical solution deposition, or other like processes. The thickness of the gate dielectric and the gate conductor 136 can vary depending on the deposition process as well as the composition and number of gate dielectric materials used.

Figure 18:
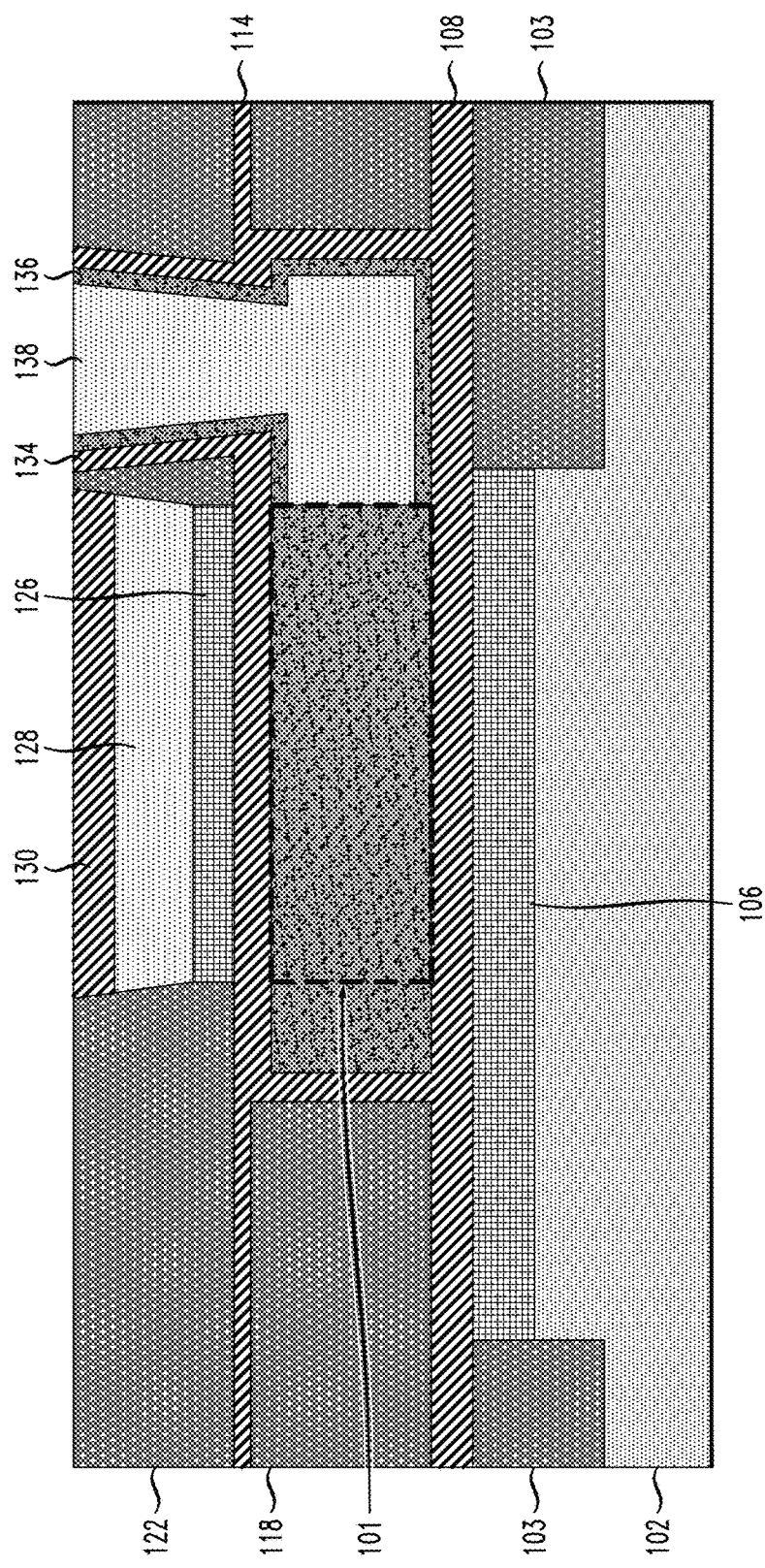
FIG. 18 depicts a side cross-sectional view of the semiconductor structure of FIG. 17 following fill of a metal in the gate opening, according to an embodiment of the invention.

FIG. 18 depicts a side cross-sectional view 1800 of the semiconductor structure of FIG. 17 following fill with a metal layer 138, also referred to as a gate contact metal layer, in the gate opening as illustrated. The metal layer 138 may be planarized using CMP or other suitable processing to have a surface substantially coplanar with a top surface of ILD 122. The metal layer 138 may be formed of materials similar to that of metal layer 128.

Figure 19:
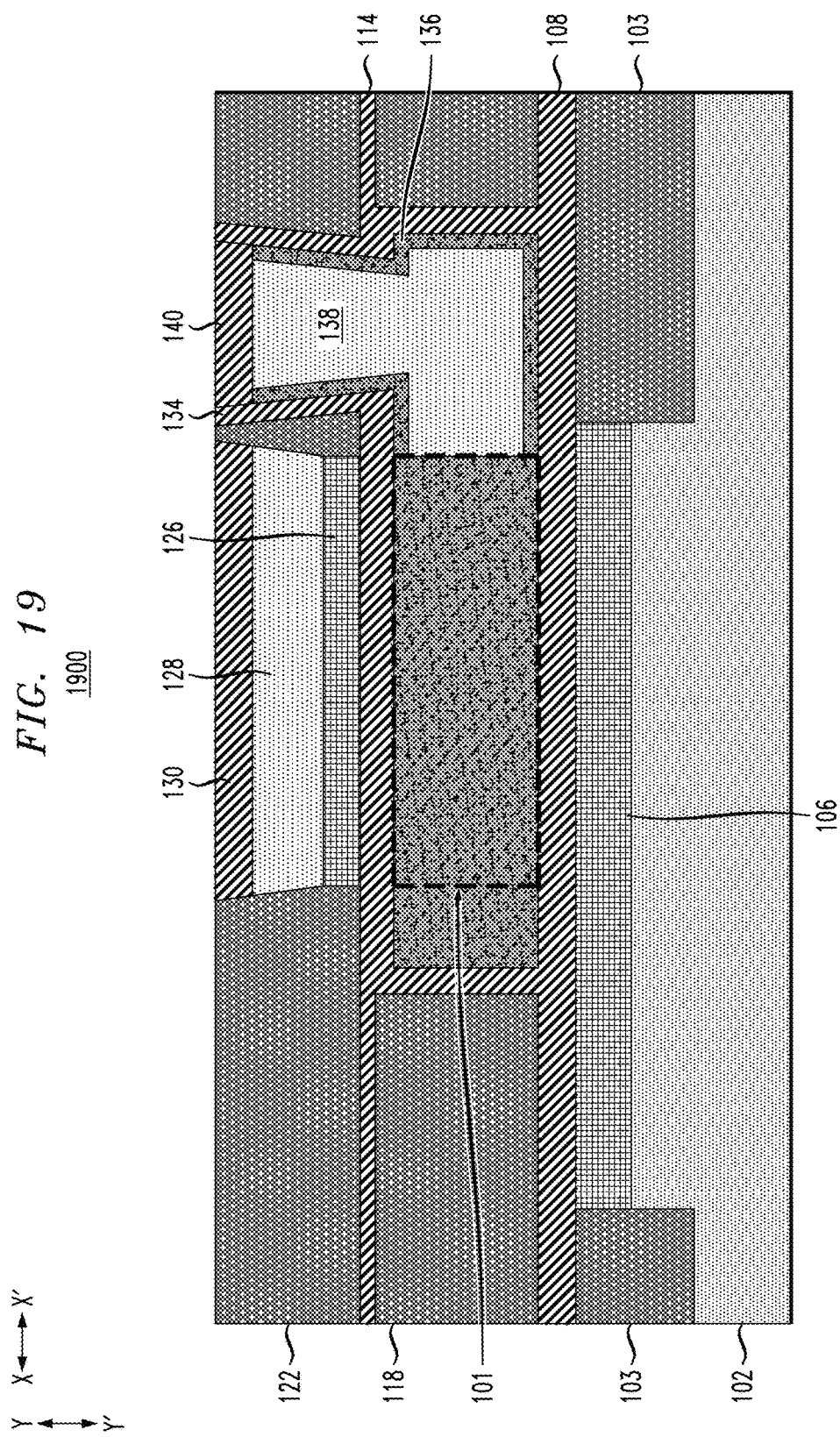
FIG. 19 depicts a side cross-sectional view of the semiconductor structure of FIG. 18 following recess of the metal in the gate opening and formation of a gate self-aligned contact capping layer, according to an embodiment of the invention.

FIG. 19 depicts a side cross-sectional view 1900 of the semiconductor structure of FIG. 18 following recess of the metal layer 138 and formation of SAC capping layer 140, also referred to as a gate SAC capping layer. The SAC capping layer 140 may be formed of similar materials as that of the SAC capping layer 130, and with similar thickness. The metal layer 138 may be recessed using processing similar to that used for recess of metal layer 128.

Figure 20:
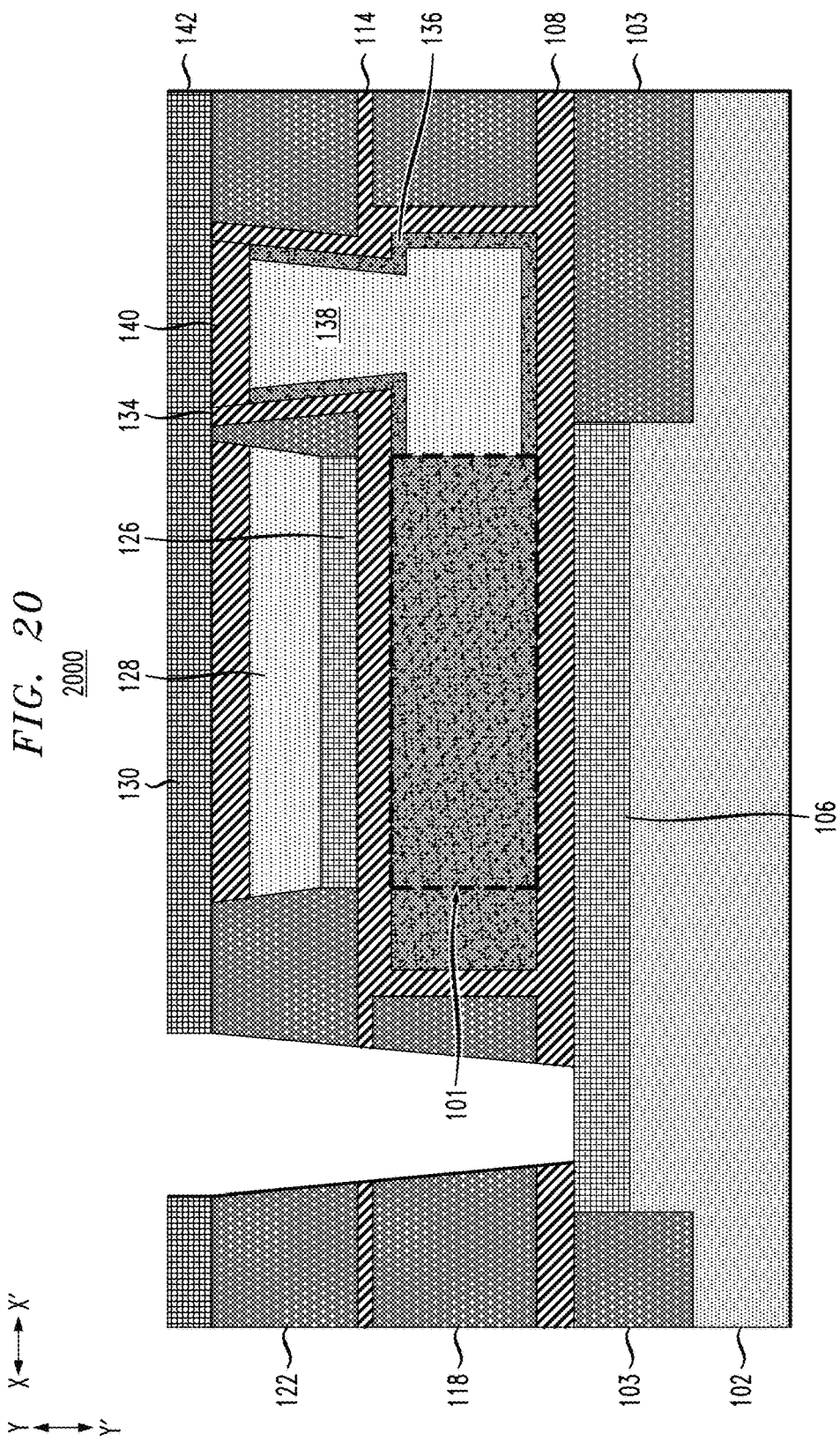
FIG. 20 depicts a side cross-sectional view of the semiconductor structure of FIG. 19 following masking to open the bottom source/drain regions, according to an embodiment of the invention.

FIG. 20 depicts a side cross-sectional view 2000 of the semiconductor structure of FIG. 19 following patterning of a mask layer 142 and forming an opening to the bottom source/drain regions 106. The mask layer 142 may be formed with similar materials and sizing as that described above with respect to mask layer 124. The opening to the bottom source/drain regions 106 may be formed by directional RIE or other suitable processing.

Figure 21:
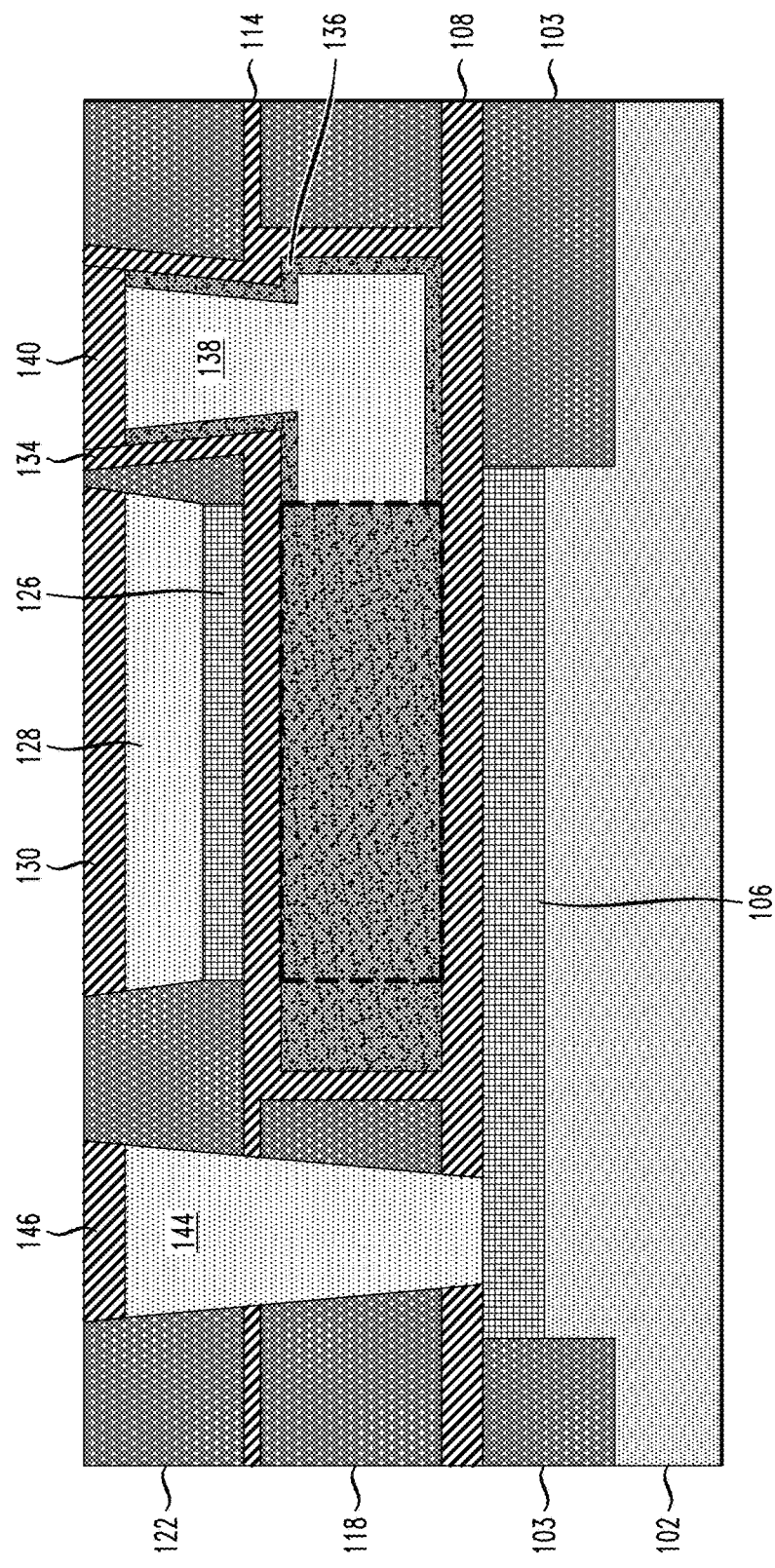
FIG. 21 depicts a side cross-sectional view of the semiconductor structure of FIG. 20 following filling of the opening to the bottom source/drain regions with a metal and formation of a bottom source/drain self-aligned contact capping layer, according to an embodiment of the invention.

FIG. 21 depicts a side cross-sectional view 2100 of the semiconductor structure of FIG. 20 following fill of a metal layer 144, also referred to as bottom source/drain contact metal layer, in the opening to the bottom source/drain regions 106. FIG. 21 also depicts recess of the metal layer 144 and formation of a SAC capping layer 146, also referred to as a bottom source/drain capping layer. The metal layer 144 may be formed of similar materials and with similar processing as metal layers 128 and 138. The SAC capping layer 146 may be formed of similar materials and similar sizing using processing similar to that described with respect to formation of SAC capping layers 130 and 140.

Figure 22:
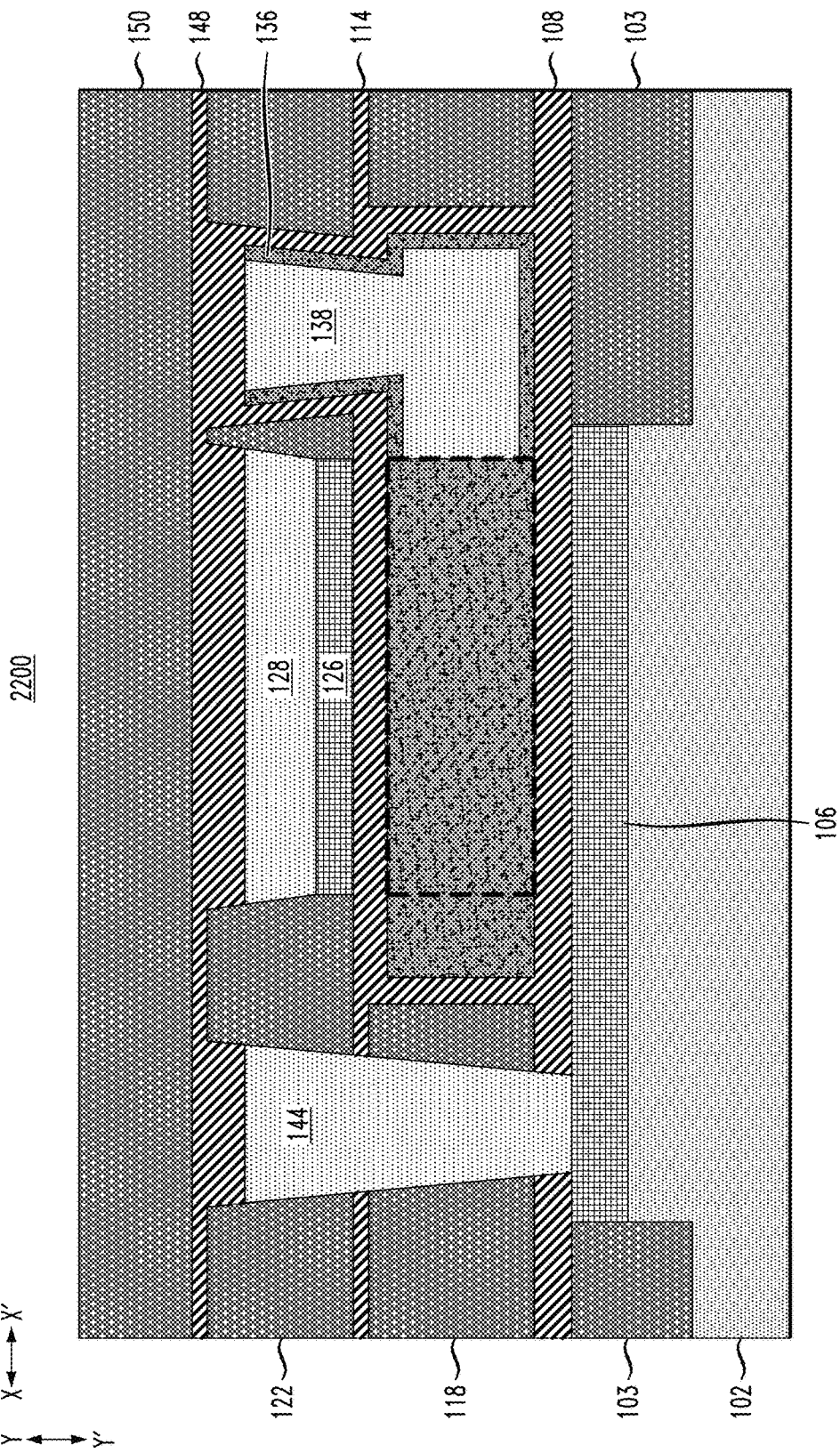
FIG. 22 depicts a side cross-sectional view of the semiconductor structure of FIG. 21 following formation of a liner and an interlevel dielectric, according to an embodiment of the invention.

FIG. 22 depicts a side cross-sectional view 2200 of the semiconductor structure of FIG. 21 following formation of a liner 148 and an ILD 150. The liner 148 may be formed of similar materials as the top spacers 114 and SAC capping layers 130, 140 and 146. The liner 148 may have a height or vertical thickness (in direction Y-Y') in the range of 5 nm to 20 nm, although other thickness outside this range may be used as desired for a particular application. The ILD 150 may be formed of similar materials as the ILD 122. The ILD 150 have a height or vertical thickness (in direction Y-Y') in the range of 30 nm to 150 nm, although other thickness outside this range may be used as desired for a particular application.

Figure 23:
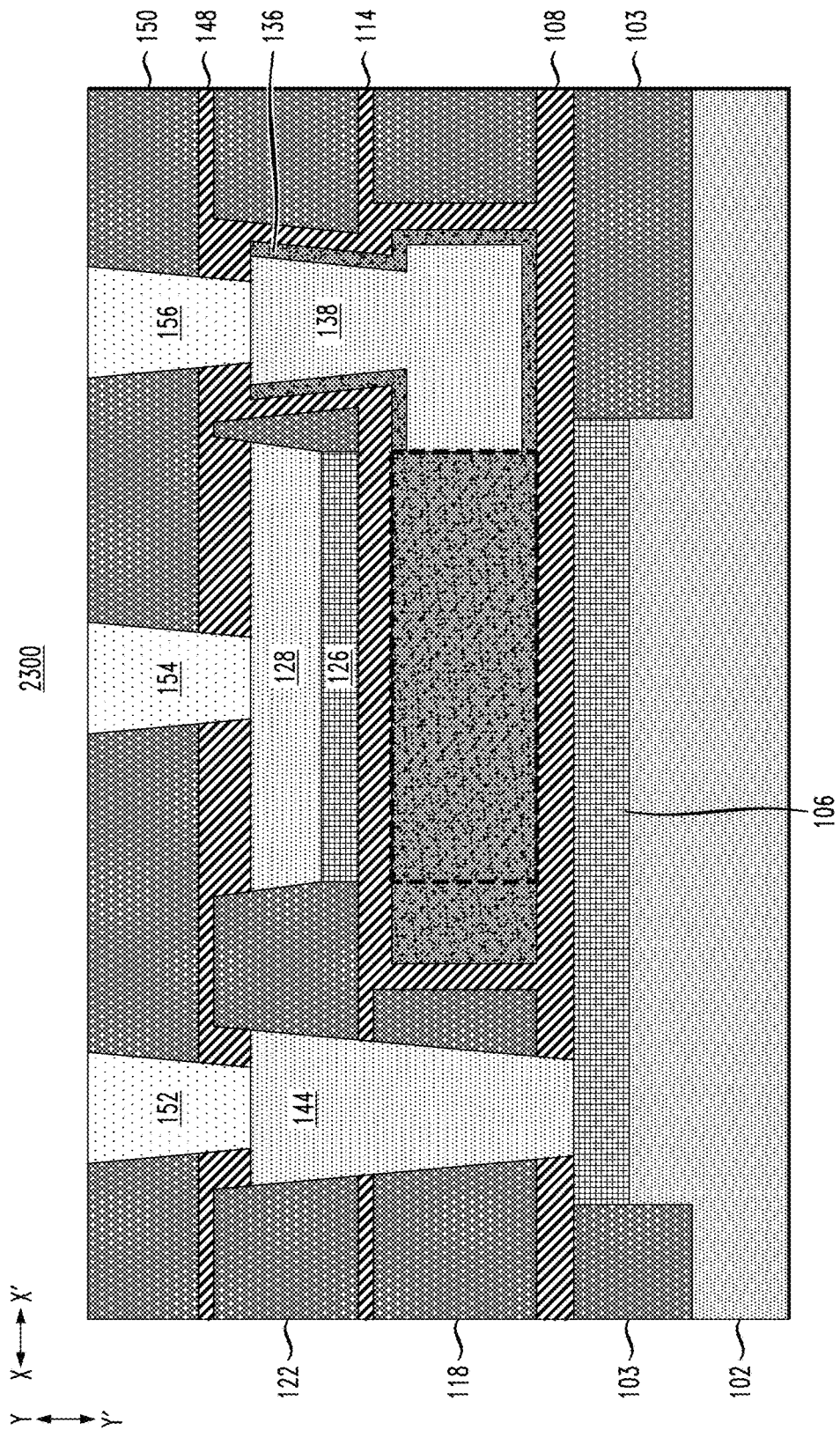
FIG. 23 depicts a side cross-sectional view of the semiconductor structure of FIG. 22 following formation of vias to access contacts, according to an embodiment of the invention.

FIG. 23 depicts a side cross-sectional view 2300 of the semiconductor structure of FIG. 22 following formation of vias 152, 154 and 156 providing access to contacts for the bottom source/drain regions 106, the top source/drain regions 126, and to the gate conductor 136, respectively (via metal layers 128, 138 and 144, respectively). The vias 152, 154 and 156 may be formed using conformal deposition processing such as CVD or ALD, and may each have a width or horizontal thickness (in direction X-X') at top surfaces thereof in the range of 20 nm to 100 nm, although other widths outside this range may be used as desired for a particular application. It is also to be appreciated that the vias 152, 154 and 156 may have different widths.

Figure 24:
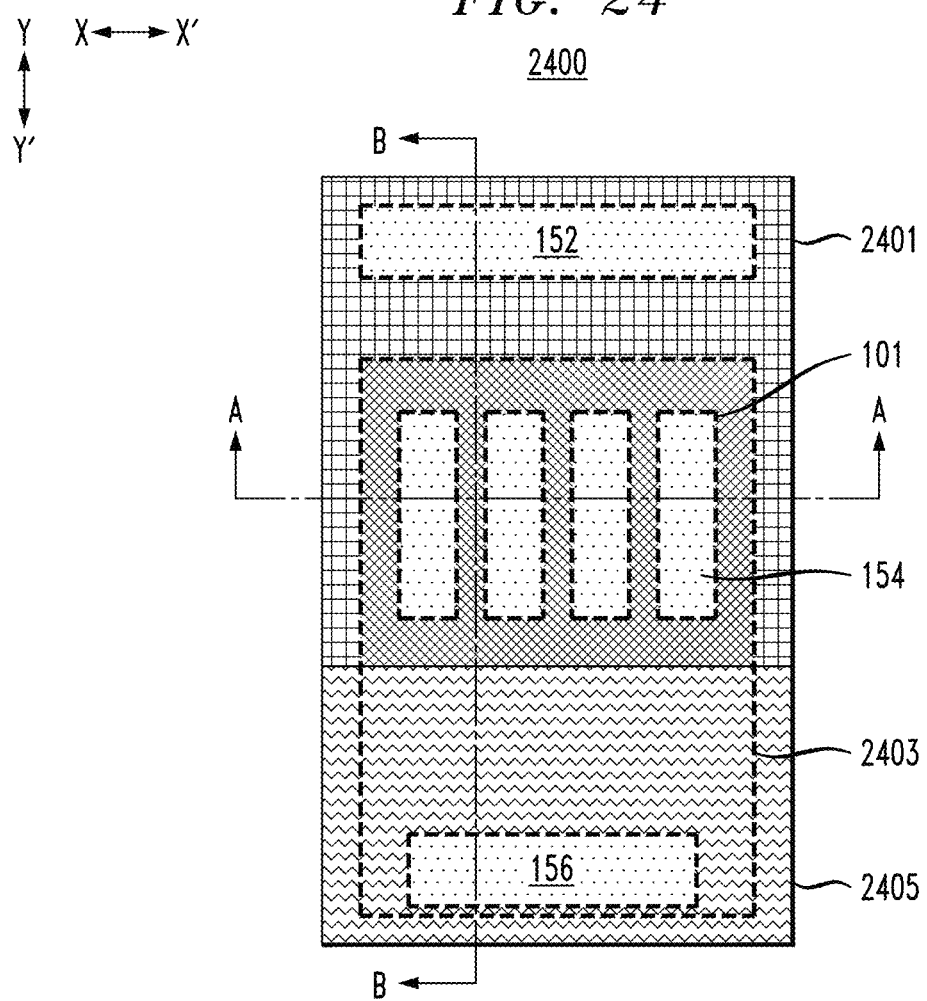
FIG. 24 depicts a top-down view of the semiconductor structure of FIG. 23, according to an embodiment of the invention.

FIG. 24 depicts a top-down view 2400 of the semiconductor structure of FIG. 23. It should be noted that the top-down view 2400 is presented to illustrate locations of the vias 152, 154 and 156 relative to fins 101, and as such omits various details of underlying layers for clarity of illustration. The bottom source/drain contact via 152 may have a thickness (in direction Y-Y') of 30 nm, or more generally in the range of 20 nm to 100 nm, although other suitable thicknesses may be used as desired for a particular application. Each of the fins 101 may have a length (in direction Y-Y') of 45 nm, or more generally in the range of 10 nm to 200 nm, although other suitable lengths may be used as desired for a particular application. The top source/drain contacts 154 may have lengths that match that of the fins 101 as illustrated, though this is not a requirement. The gate contact via 156 may have a thickness (in direction Y-Y') of 20 nm, or more generally in the range of 15 nm to 100 nm, although other suitable thicknesses may be used as desired for a particular application.

The top-down view 2400 shows mask regions 2401, 2403 and 2405 of the semiconductor structure. The mask region 2401 illustrates where the bottom source/drain 106 is formed. The mask region 2403 illustrates where the gate is formed. The mask region 2405 illustrates where the opening to expose the dummy gate 112 is formed.

RMG schemes for a vertical transistor requires the removal of the dummy gate and deposition of gate dielectrics and gate conductor through the gate contact opening 156. Since there is a high risk of gate to source/drain region shorts due to the process variation of lithography and etch, the gate contact opening should be placed away from the top source/drain region. The distance between the fin 101 and the gate contact opening 156 is generally in the range of 20 nm to 100 nm, which makes it difficult to remove the dummy gate and deposit the gate dielectrics and gate conductor. However, the SAC capping layers formed on the tops of the openings to the top and bottom source/drain regions in illustrative embodiments advantageously enables the RMG process without dimensional limitations and gate to top source/drain shorts.

As mentioned above, the side cross-sectional views of FIGS. 1-12 are taken perpendicular to a length of the fins 101, such as along line A-A in the top-down view 2400 of FIG. 24. The side cross-sectional views of FIGS. 13-23 are taken parallel to a length of the fins 101, such as along line B-B in the top-down view 2400 of FIG. 24.

In some embodiments, RMG processes may be used to form multiple different channel lengths for VTFETs formed on a common substrate. FIGS. 25-34 illustrate an example of such processing for forming multiple different channel lengths.

Figure 25:
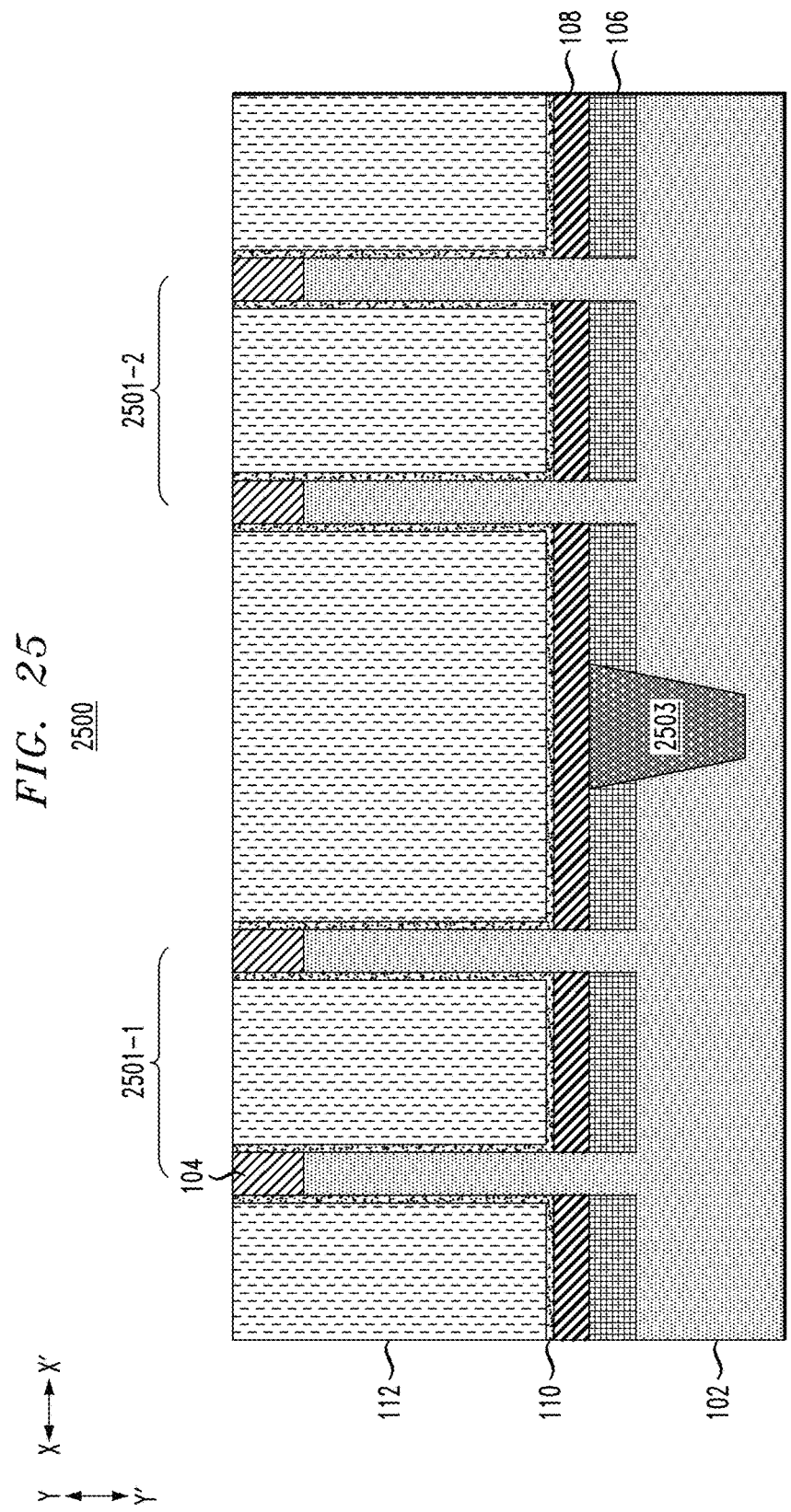
FIG. 25 depicts a side cross-sectional view of a semiconductor structure comprising fins in long and short channel regions, according to an embodiment of the invention.

FIG. 25 depicts a side cross-sectional view 2500 of a semiconductor structure similar to the semiconductor structure shown in FIG. 3, with similarly labeled elements being formed of similar materials, with similar size and with similar processing. In the semiconductor structure shown in FIG. 25, however, the fins are arranged in different regions 2501-1 and 2501-2, with a STI region 2503 (formed of similar materials as STI region 103) formed between the fins in the different regions 2501-1 and 2501-2. The STI region 2503 may be formed after formation of bottom source/drain regions 106. In the example process described below with respect to FIGS. 25-34, the fins in region 2501-1 are used to form "long" channel devices with the fins in region 2501-2 being used to form "short" channel devices.

Figure 26:
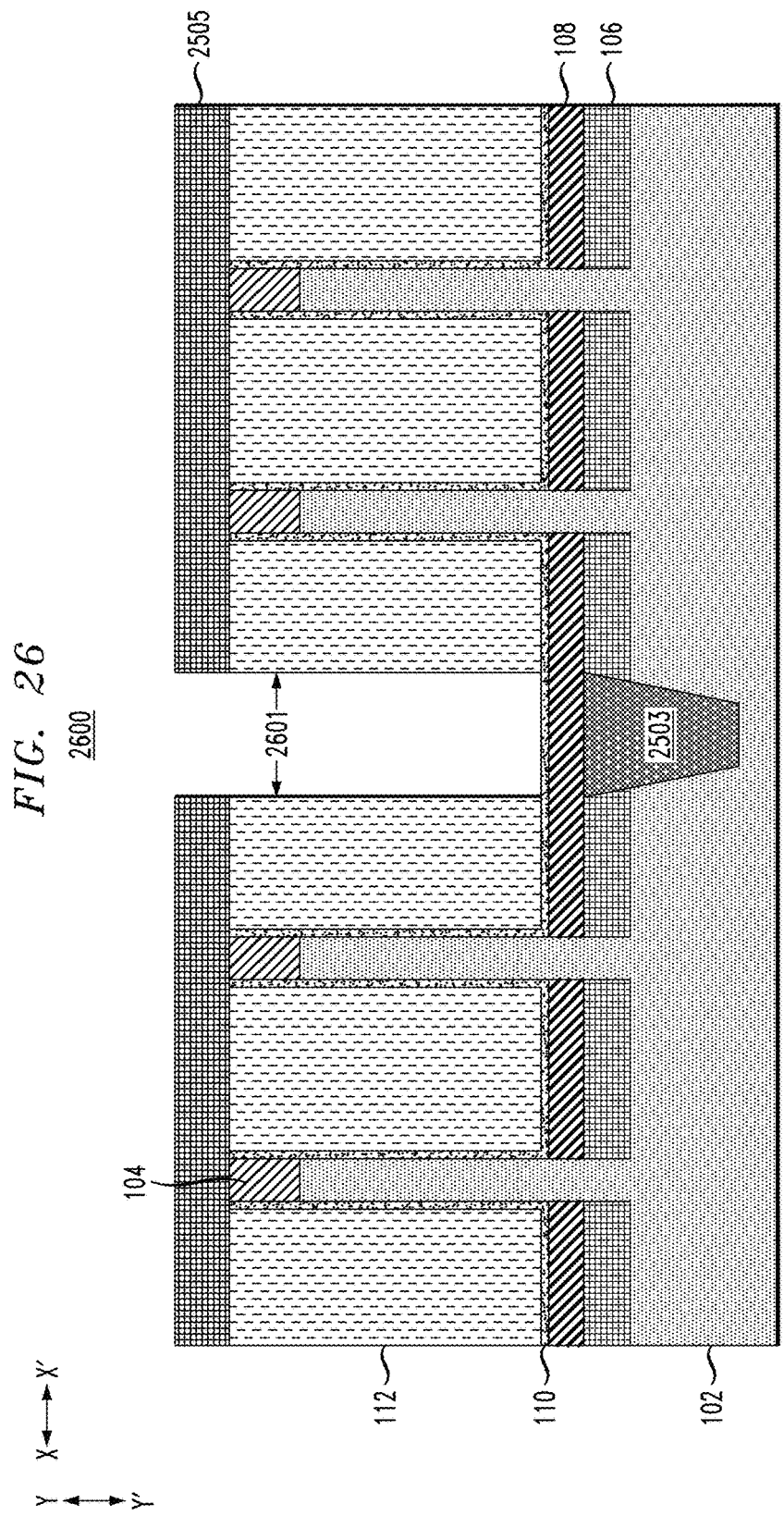
FIG. 26 depicts a side cross-sectional view of the semiconductor structure of FIG. 25 following dummy gate patterning, according to an embodiment of the invention.

FIG. 26 depicts a side cross-sectional view 2600 of the semiconductor structure of FIG. 25 following patterning of a mask layer 2505 over a top surface thereof, and etching to pattern or remove the portions of the dummy gate 112 exposed by the mask layer 2505. The mask layer 2505 may be formed of similar materials and with similar sizing as that described above with respect to mask layer 124. The opening 2601 may have a width in the range of 20 nm to 150 nm, although other suitable widths above or below this range may be used so long as a sufficient portion of the dummy gate 112 material remains surrounding the fins nearest to the opening 2601 in the regions 2501-1 and 2501-2. The dummy gate 112 exposed by the mask layer 2505 may be removed using directional RIE or other suitable processing.

Figure 27:
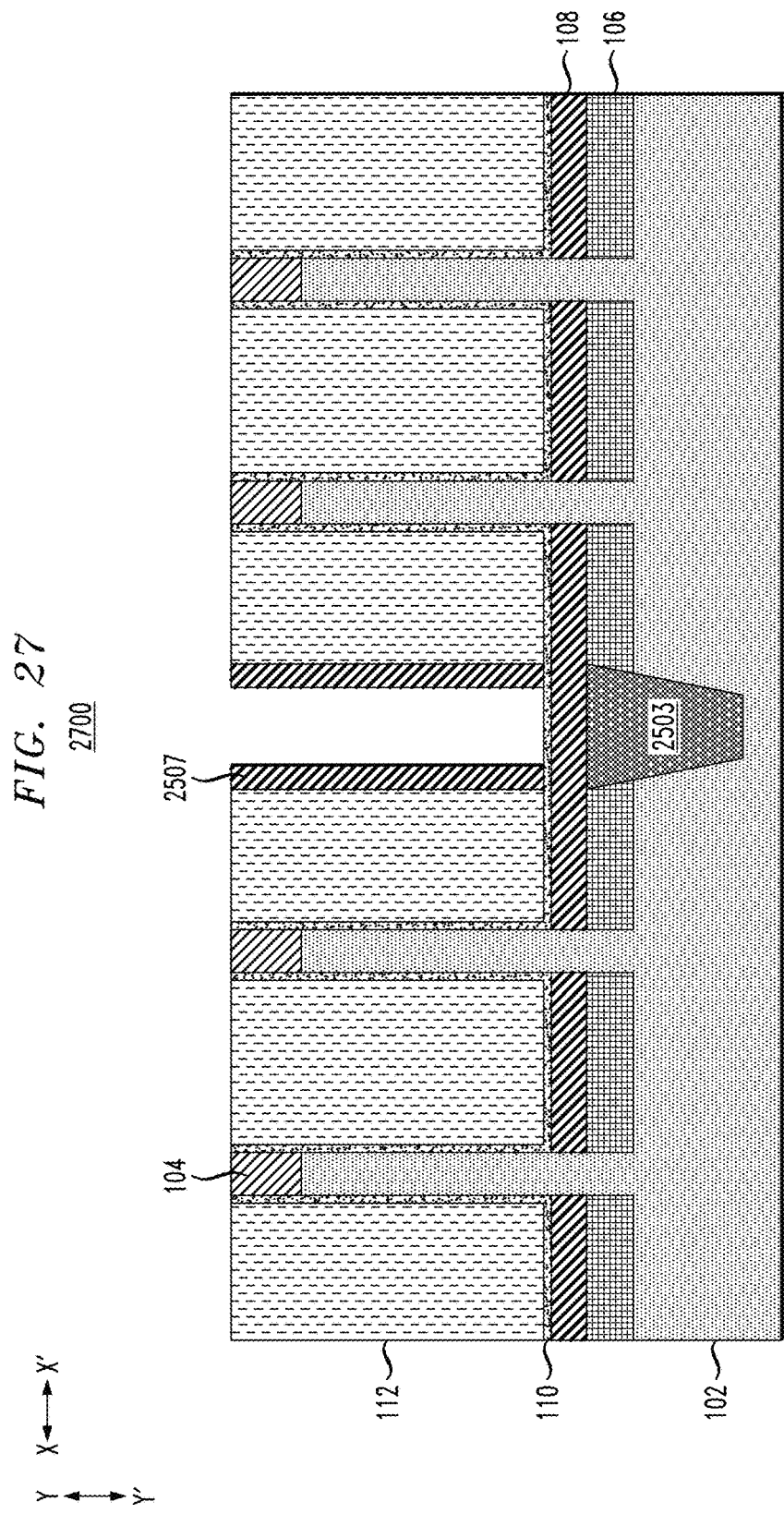
FIG. 27 depicts a side cross-sectional view of the semiconductor structure of FIG. 26 following formation of a liner, according to an embodiment of the invention.

FIG. 27 depicts a side cross-sectional view 2700 of the semiconductor structure of FIG. 26 following formation of liner 2507. The liner 2507 may be formed of materials similar to that bottom spacers 108 (e.g., SiN). The liner 2507 may have a width or thickness (in direction X-X') in the range of 5 nm to 20 nm, although other suitable widths above or below this range may be used as desired for a particular application. The liner 2508 may be formed by any suitable deposition followed by RIE.

Figure 28:
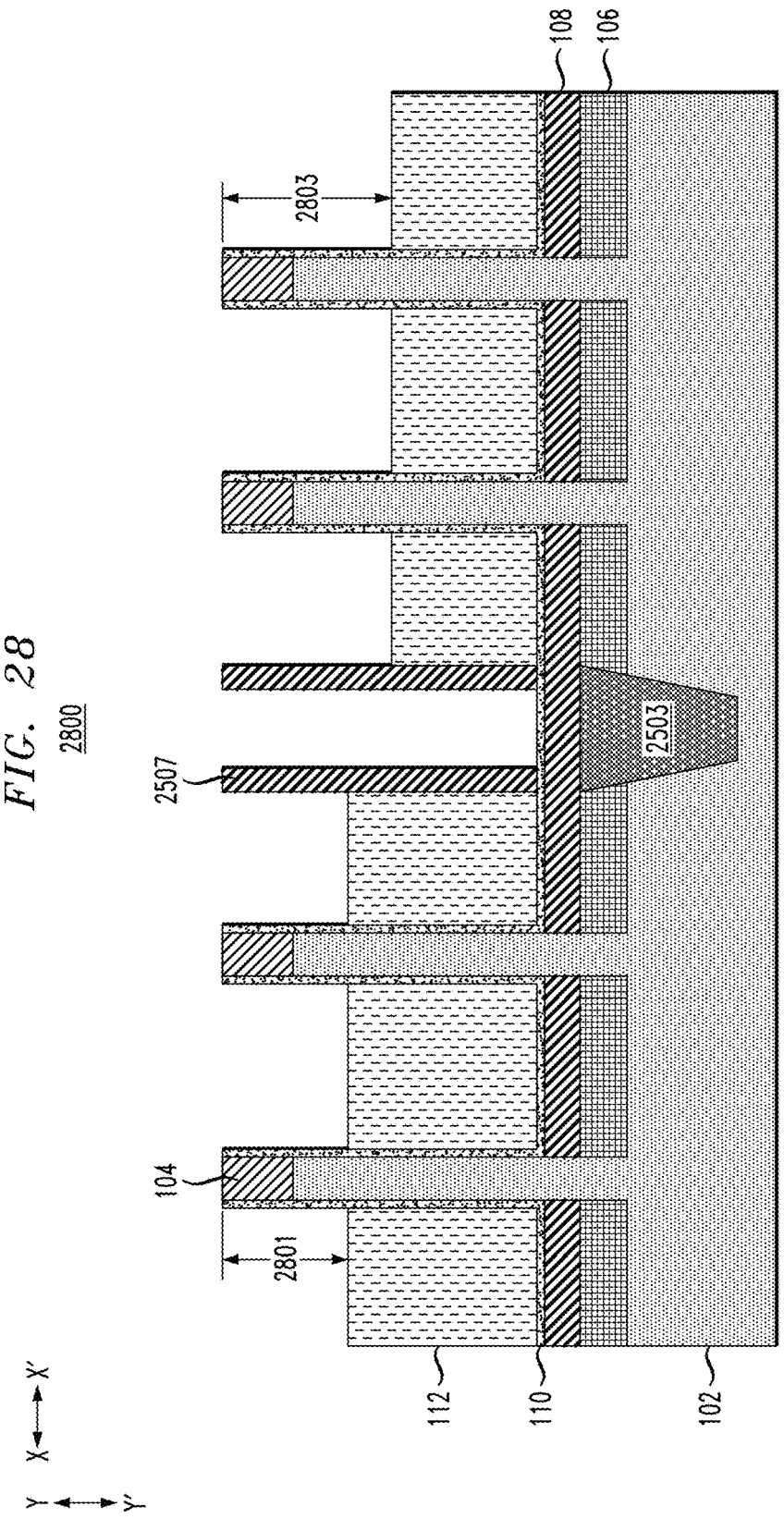
FIG. 28 depicts a side cross-sectional view of the semiconductor structure of FIG. 27 following recess of the dummy gate, according to an embodiment of the invention.

FIG. 28 depicts a side cross-sectional view 2800 of the semiconductor structure of FIG. 27 following recess of the dummy gate 112. The recess of the dummy gate 112 may use processing similar to that described above with respect to FIG. 4, though in the FIG. 28 example the dummy gate 112 in the long channel region (e.g., 2501-1) is recessed a first depth 2801 while the dummy gate 112 in the short channel region (e.g., 2501-2) is recessed a second depth 2803, with the second depth 2803 being greater than the first depth 2801. In some embodiments, the first depth 2801 may be in the range of 15 nm to 100 nm, while the second depth 2803 is in the range of 25 nm to 110 nm, although other depths outside these ranges may be used to form different channel lengths as desired. It is to be appreciated that while FIGS. 25-34 illustrate an example wherein two different channel lengths are formed, embodiments are not so limited. Instead, any number of different channel lengths may be formed as desired using techniques similar to those described with respect to FIGS. 25-34.

The recess of dummy gate 112 to the different depths 2801 and 2803 may involve first recessing the dummy gate 112 in both the long and short channel regions to the depth 2801, followed by masking or protecting the dummy gate 112 in the long channel region followed by additional recess of the dummy gate 112 in the short channel region. Alternately, the recess of the dummy gate 112 in the long channel region may be performed while the dummy gate 112 in the short channel region is protected, followed by recess of the dummy gate 112 in the short channel region while the dummy gate 112 in the long channel region is protected (or vice versa).

Figure 29:
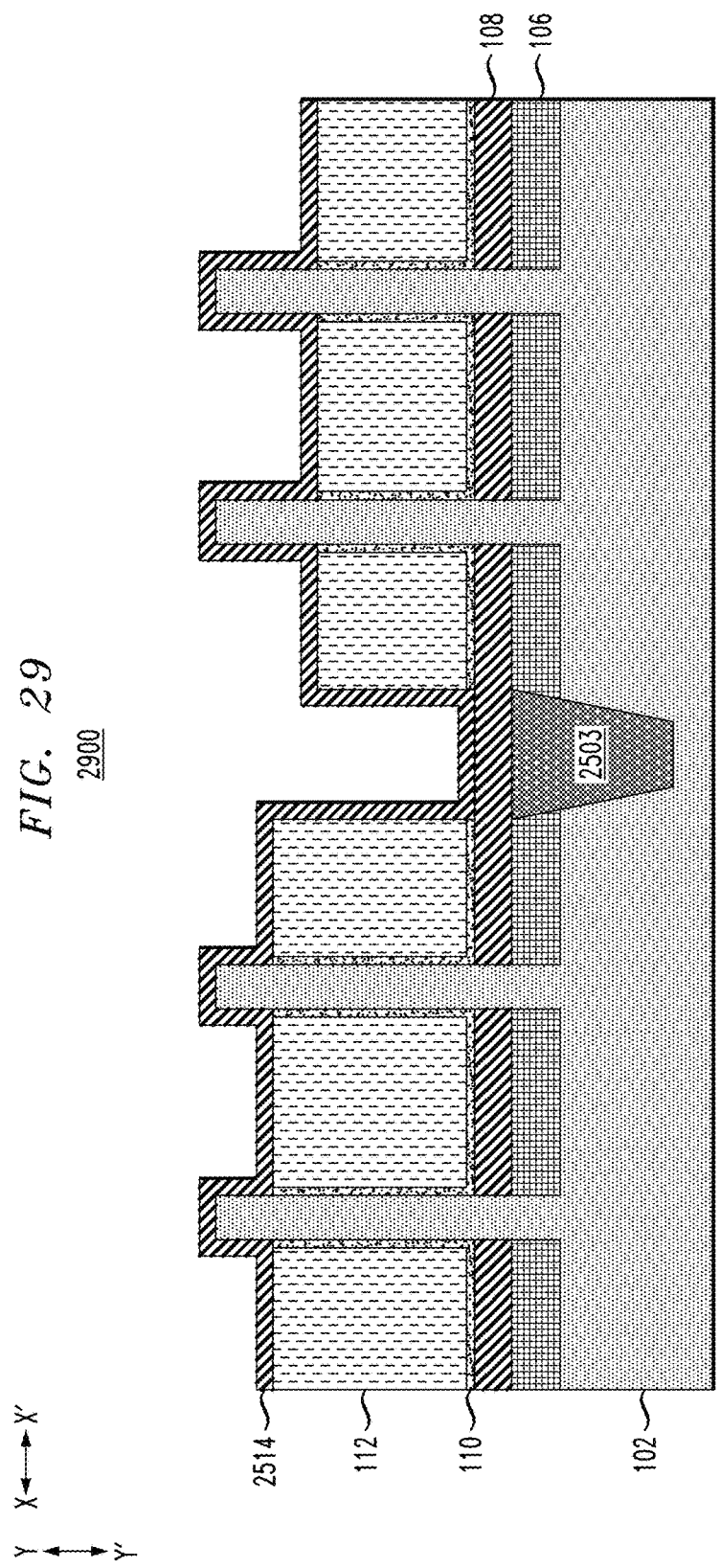
FIG. 29 depicts a side cross-sectional view of the semiconductor structure of FIG. 28 following formation of top spacers, according to an embodiment of the invention.

FIG. 29 depicts a side cross-sectional view 2900 of the semiconductor structure of FIG. 28 following formation of top spacers 2514, which may be formed with similar materials, similar sizing and with similar processing as top spacers 114. Prior to formation of the top spacers 2514, the hard mask 104 over each fin is removed, and the oxide 110 is recessed to have a top surface substantially coplanar with the surrounding dummy gate 112. The liner 2507 is also removed prior to formation of top spacers 2514.

Figure 30:
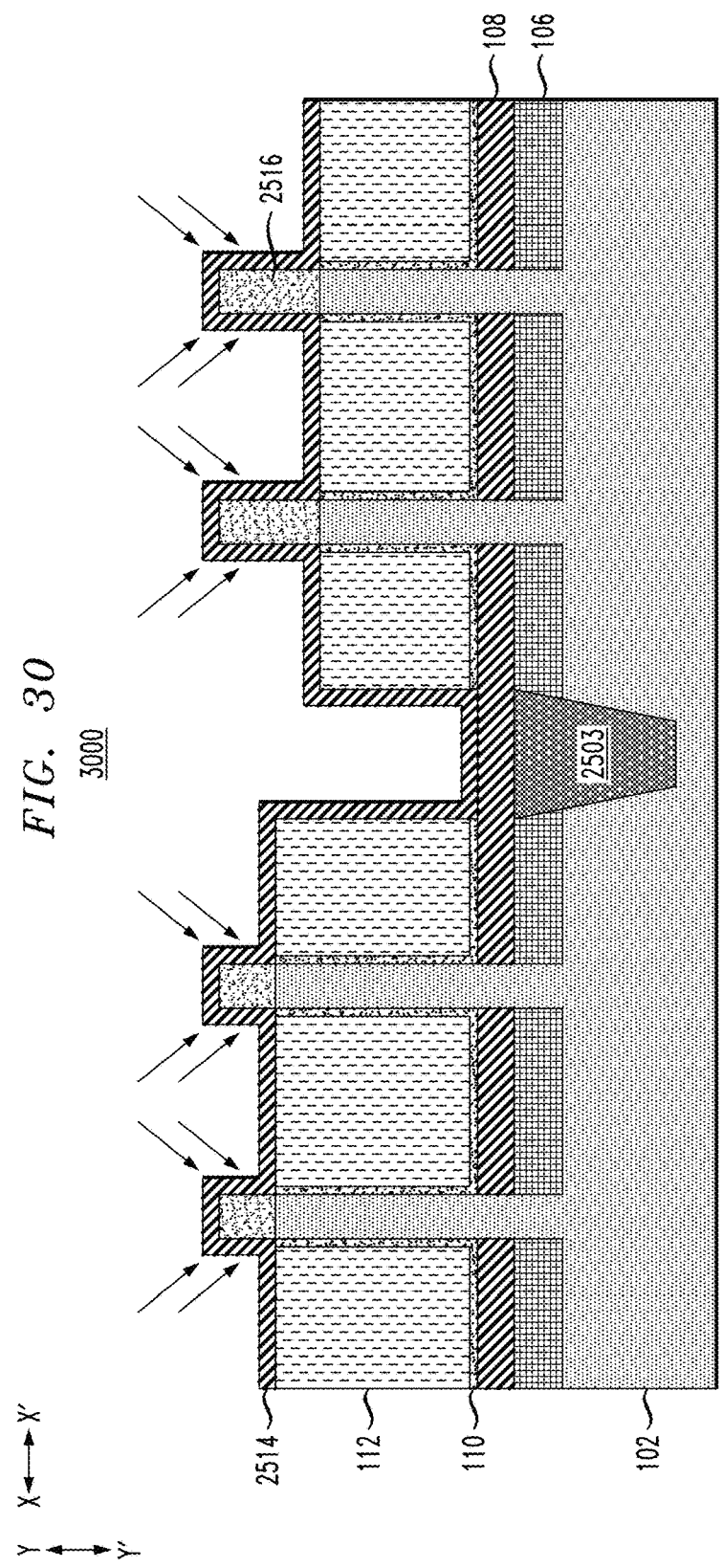
FIG. 30 depicts a side cross-sectional view of the semiconductor structure of FIG. 29 following formation of top junctions, according to an embodiment of the invention.

FIG. 30 depicts a side cross-sectional view 3000 of the semiconductor structure of FIG. 29 following formation of top junctions 2516. The formation of top junctions 2516 may use processing similar to that described above with respect to formation of top junctions 116. As shown in FIG. 30, the top junctions 2516 in the short channel region are "longer" or have greater vertical thickness relative to the top junctions 2516 in the long channel region. The top junctions 2516 in both the long and short channel regions extend below a surface of the surrounding dummy gate 112 to a depth in the range of 2 nm to 10 nm, although other suitable depths outside this range may be used as desired for a particular application. The top junctions 2516, however, should be overlapped with the gate conductor, otherwise transistor performance may be degraded due to the undoped region.

Figure 31:
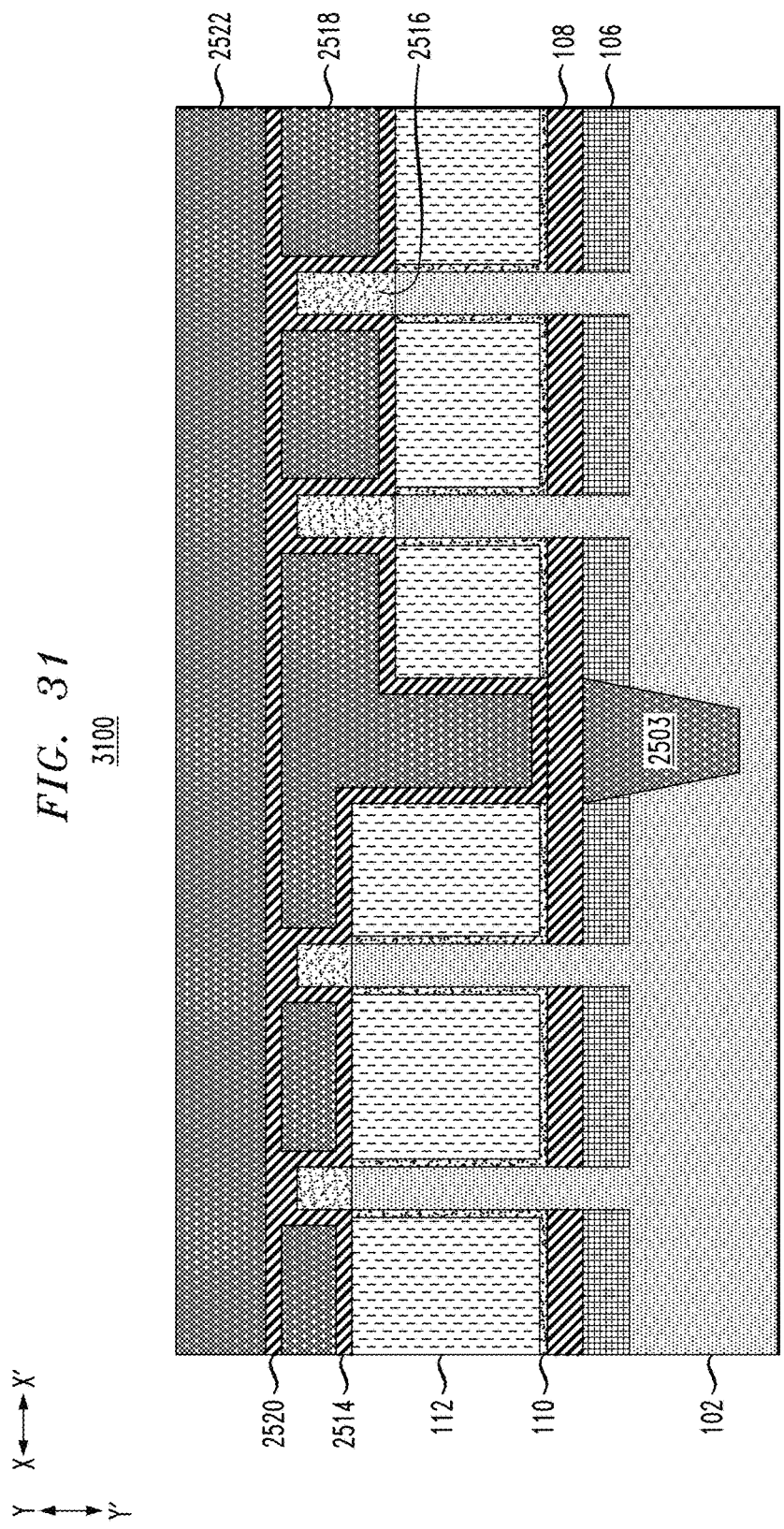
FIG. 31 depicts a side cross-sectional view of the semiconductor structure of FIG. 30 following fill with an isolation layer and formation of an additional spacer and interlevel dielectric, according to an embodiment of the invention.

FIG. 31 depicts a side cross-sectional view 3100 of the semiconductor structure of FIG. 30 following formation of isolation layer 2518, spacer 2520 and ILD 2522. The isolation layer 2518, spacer 2520 and ILD 2522 may be formed of similar materials, with similar sizing and using similar processing as that described above with respect to isolation layer 118, spacer 120 and ILD 122, respectively.

Figure 32:
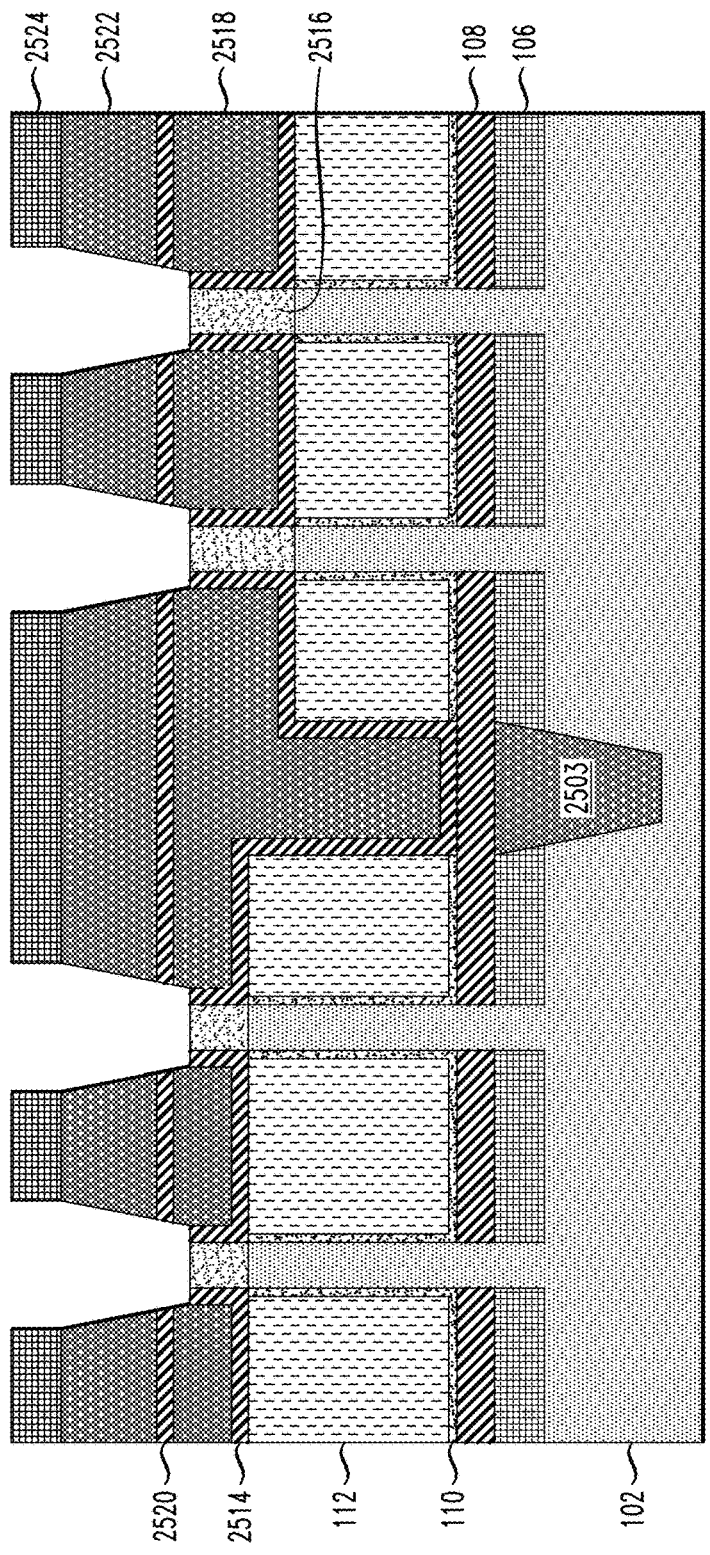
FIG. 32 depicts a side cross-sectional view of the semiconductor structure of FIG. 31 following opening to expose the tops of the junctions for formation of top source/drain contacts, according to an embodiment of the invention.

FIG. 32 depicts a side cross-sectional view 3200 of the semiconductor structure of FIG. 31 following opening to expose the top junctions 2516, by using a patterned mask layer 2524. The mask layer 2524 may be patterned in a manner similar to that described above with respect to mask layer 124. The openings to expose the top junctions 2516 may be formed using processing similar to that described above with respect to FIG. 9.

Figure 33:
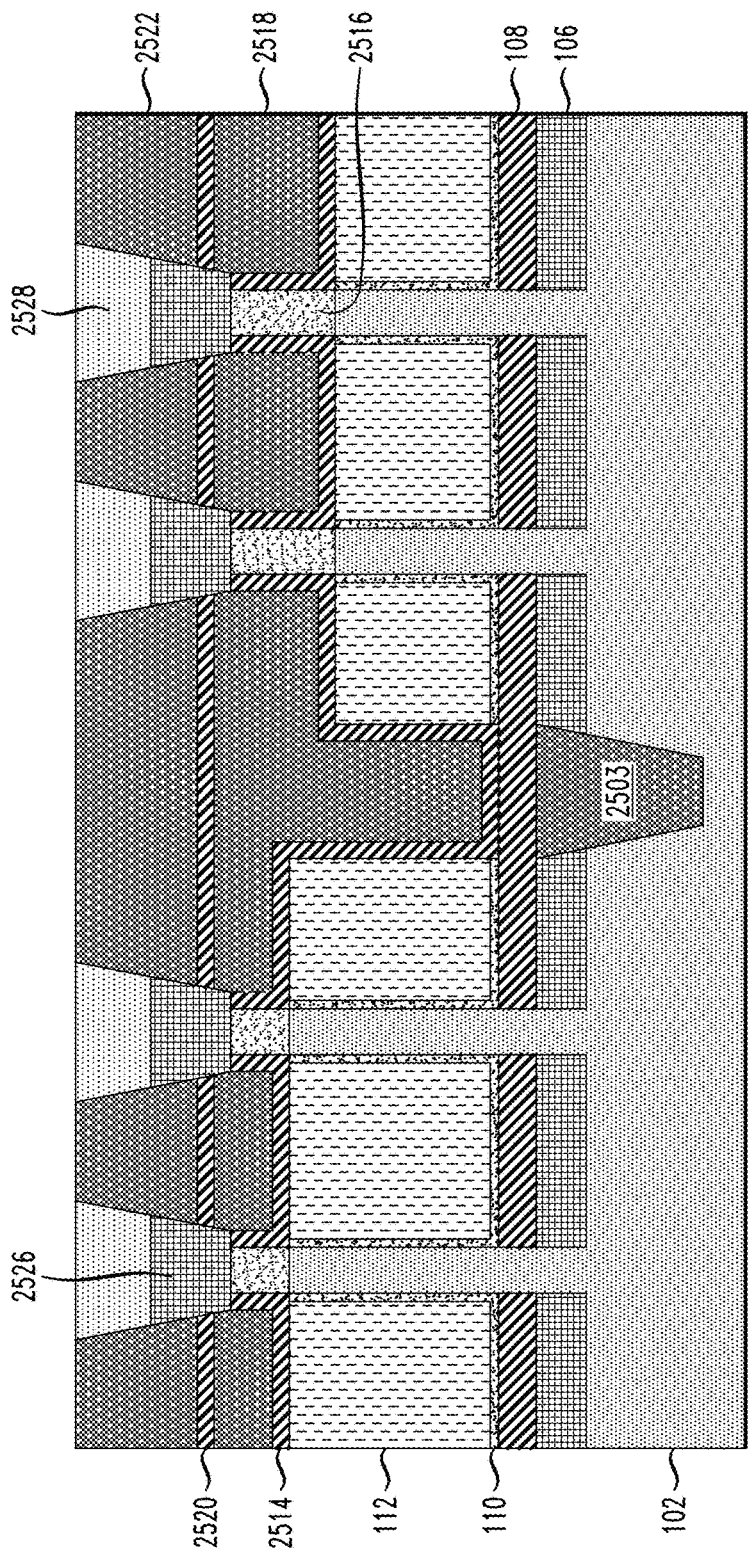
FIG. 33 depicts a side cross-sectional view of the semiconductor structure of FIG. 32 following formation of top source/drain regions and fill with a metal layer, according to an embodiment of the invention.

FIG. 33 depicts a side cross-sectional view 3300 of the semiconductor structure of FIG. 32 following formation of top source/drain regions 2526 and formation of metal layer 2528 over the top source/drain regions 2526. The top source/drain regions 2526 may be formed of similar materials, with similar sizing and using similar processing as that described above with respect to top source/drain regions 126. FIG. 33, however, illustrates an embodiment where the optional lateral etch of FIG. 10 is not performed. In other embodiments, however, the optional lateral etch described above with respect to FIG. 10 may also be used for formation of top source/drain regions 2526. The metal layer 2528 may be formed of similar materials, with similar sizing and using similar processing as that described above with respect to metal layer 128.

Figure 34:
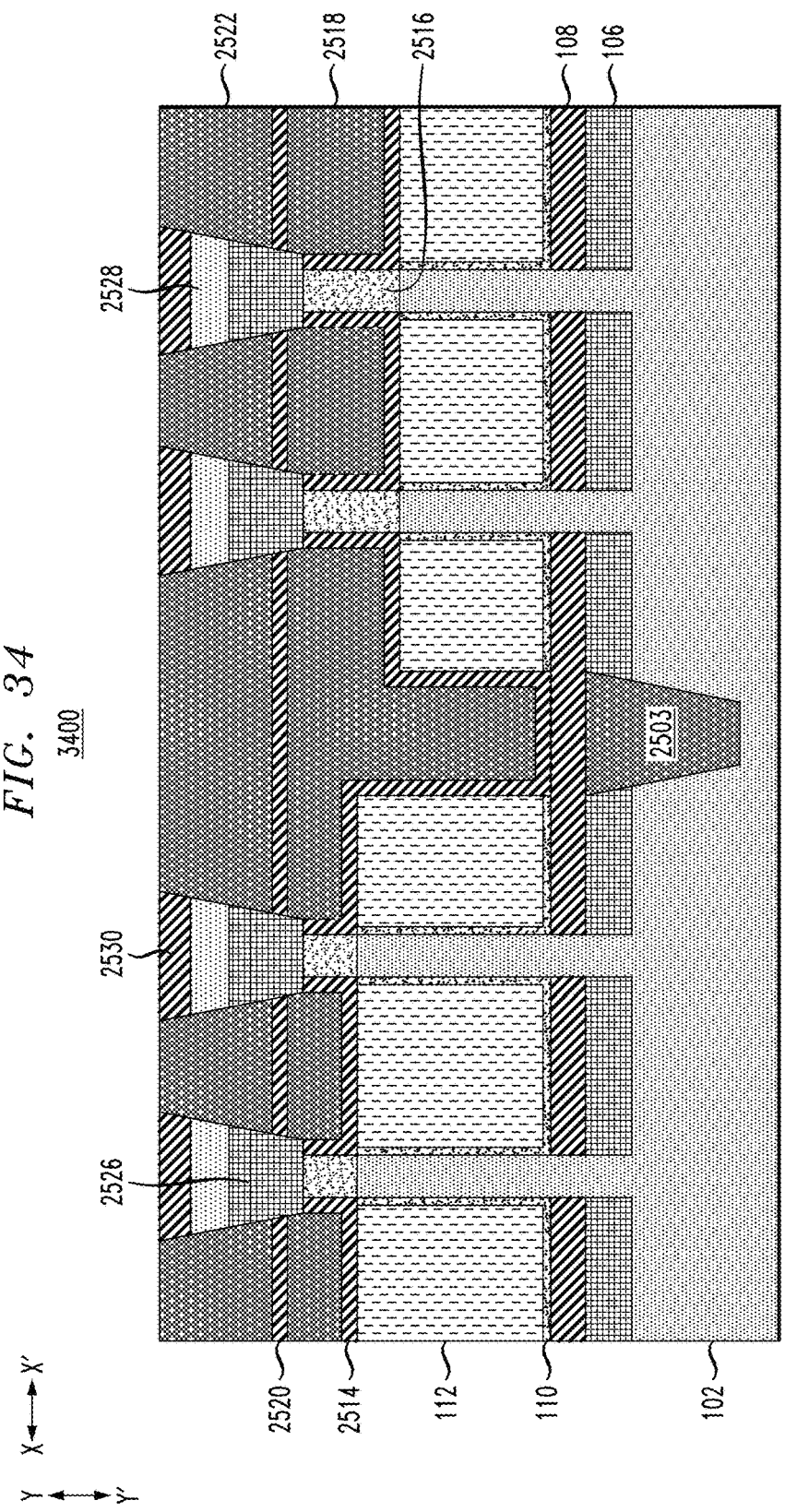
FIG. 34 depicts a side cross-sectional view of the semiconductor structure of FIG. 33 following recess of the metal layer and forming of top source/drain region self-aligned contact capping layers, according to an embodiment of the invention.

FIG. 34 depicts a side cross-sectional view 3400 of the semiconductor structure of FIG. 33 following recess of the metal layer 2528 and formation of SAC capping layer 2530, also referred to herein as top source/drain SAC capping layer. The recess of metal layer 2528 and formation of SAC capping layer 2530 may use processing similar to that described above with respect to FIG. 12. The SAC capping layer 2530 may be formed of similar materials and with similar sizing as SAC capping layer 130.

FIGS. 25-34, similar to FIGS. 1-12, are cross-sectional views taken perpendicular to the fins (e.g., along the line A-A in the top-down view 2400 of FIG. 24). The semiconductor structure of FIG. 34 may be subject to further processing for RMG similar to that described above with respect to FIGS. 13-23.

The RMG techniques described herein may also be used in the formation of CMOS devices or for CMOS patterning. RMG processes for CMOS patterning will now be described with respect to FIGS. 35-45.

Figure 35:
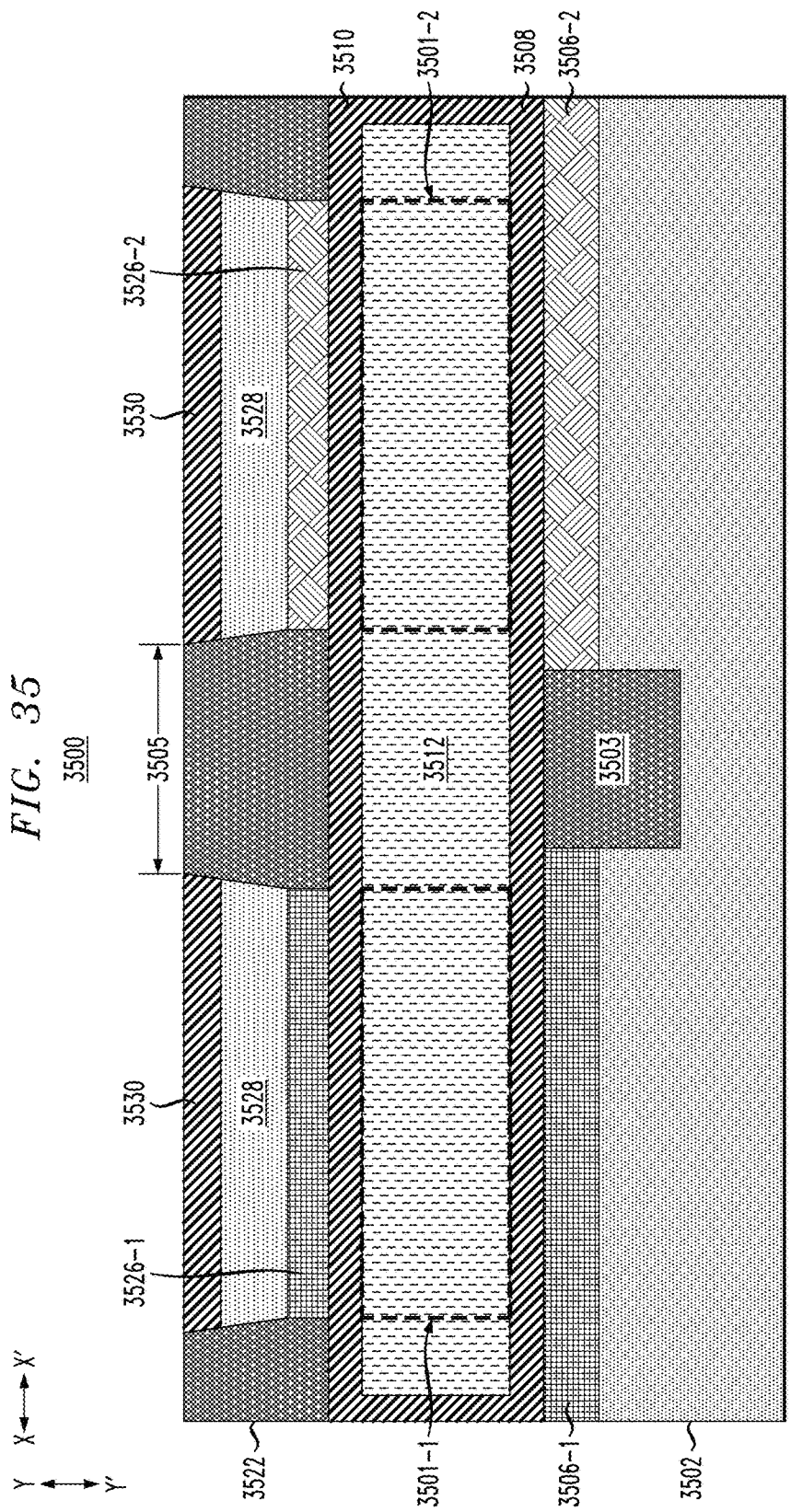
FIG. 35 depicts a side cross-sectional view of a semiconductor structure with a shared dummy gate, according to an embodiment of the invention.

FIG. 35 depicts a side cross-sectional view 3500 of a semiconductor structure with a shared dummy gate 3512. The semiconductor structure of FIG. 35 includes a substrate 3502, STI region 3503, bottom source/drain regions 3506-1 and 3506-2 (collectively, bottom source/drain regions 3506), bottom spacer 3508, top spacer 3510, ILD 3522, top source/drain regions 3526-1 and 3526-2 (collectively, top source/drain regions 3526), metal layer 3528 and SAC capping layer 3530, which may be formed of similar materials, with similar sizing and using similar processing as that described above with respect to substrate 102, STI region 103, bottom source/drain regions 106, bottom spacer 108, top spacer 110, ILD 122, top source/drain regions 126, metal layer 128 and SAC capping layer 130, respectively. FIG. 35, however, illustrates a CMOS arrangement, with a first fin 3501-1 that forms an NFET and a second fin 3502-2 that forms a PFET. The fins 3501-1 and 3501-2 (collectively, fins 3501) are shown in dashed outline as they are "behind" the shared dummy gate 3512 in the side cross-sectional view 3500.

The bottom source/drain region 3506-1 and top source/drain region 3526-1 for the NFET may be doped with an n-type dopant, with the bottom source/drain region 3506-2 and top source/drain region 3526-2 being doped with a p-type dopant. A distance 3505 between the fins 3501-1 and 3501-2 may be 75 nm, or more generally in the range of 30 nm to 100 nm, although other distances outside this range may be used as desired, so long as there is sufficient space for formation of a shared gate contact using the processing described below.

Figure 36:
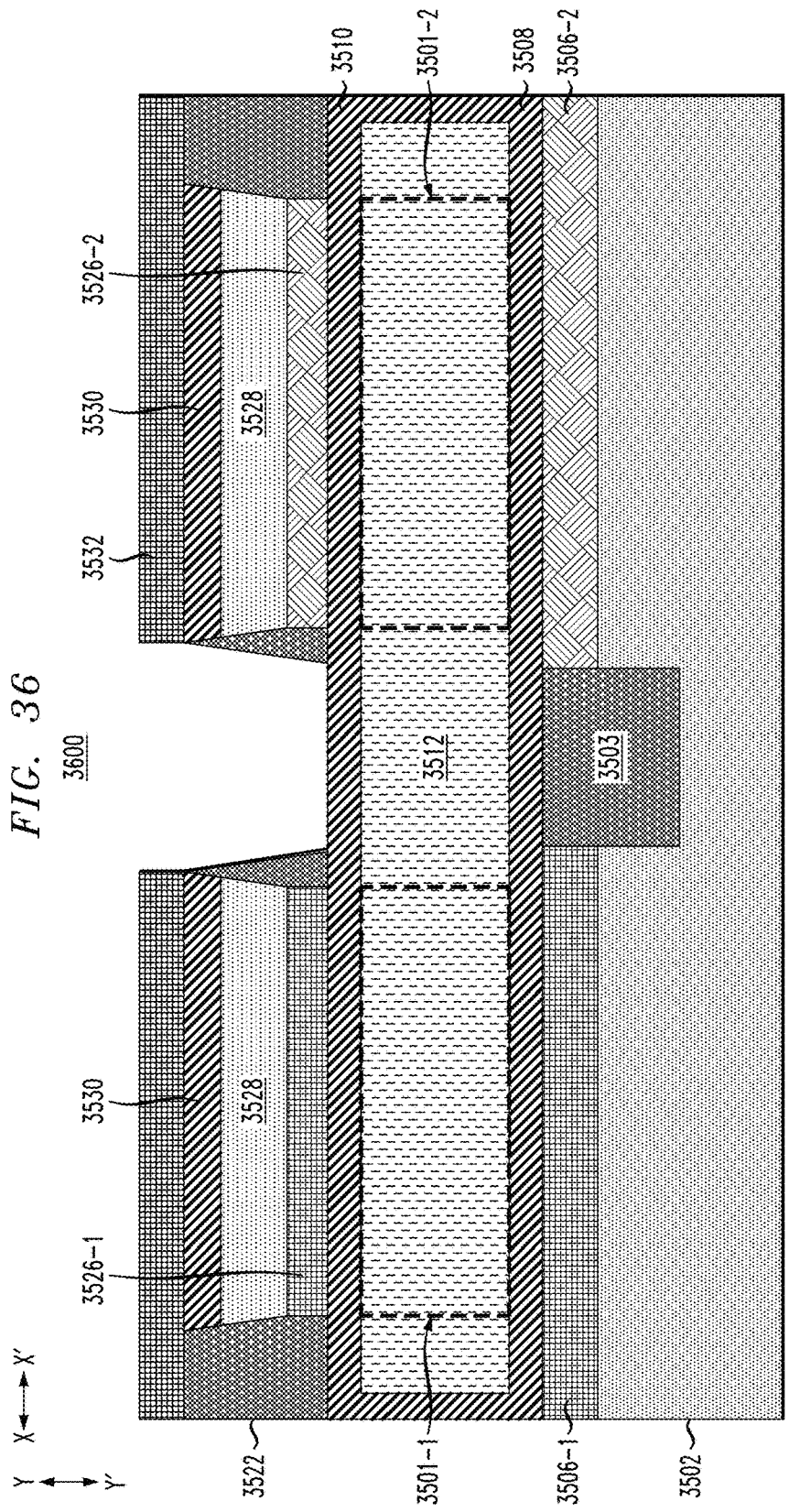
FIG. 36 depicts a side cross-sectional view of the semiconductor structure of FIG. 35 following opening of the shared dummy gate, according to an embodiment of the invention.

FIG. 36 depicts a side cross-sectional view 3600 of the semiconductor structure of FIG. 35 following opening of the shared dummy gate 3512 using a patterned mask layer 3532. The opening to the shared dummy gate 3512 may be formed using processing similar to that described above with respect to FIG. 14. The mask layer 3532 may be formed with similar materials and with similar sizing as the mask layer 132.

Figure 37:
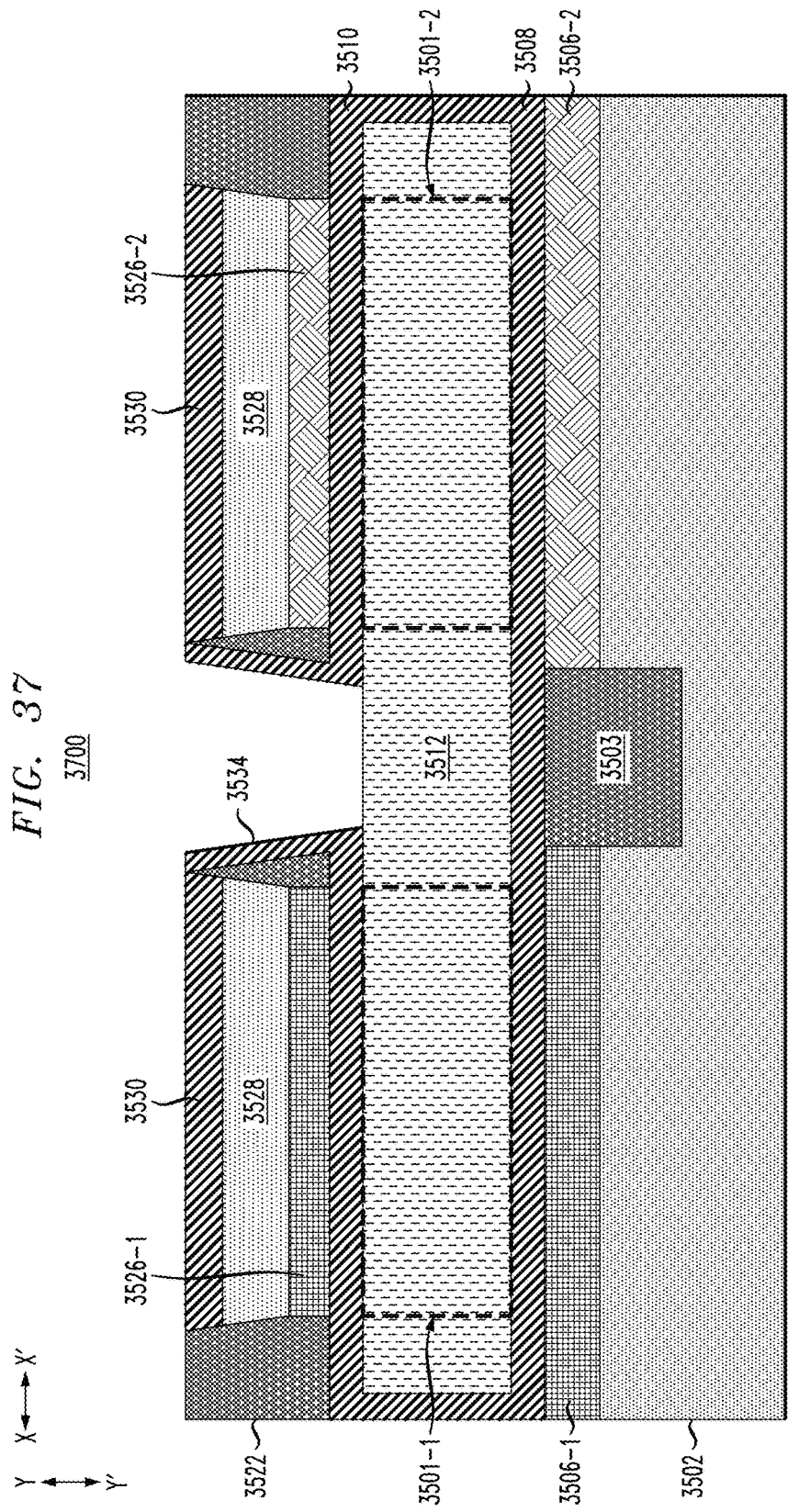
FIG. 37 depicts a side cross-sectional view of the semiconductor structure of FIG. 36 following formation of a liner, according to an embodiment of the invention.

FIG. 37 depicts a side cross-sectional view 3700 of the semiconductor structure of FIG. 36 following formation of a liner 3534 using processing similar to that described above with respect to FIG. 15. The liner 3534 may be formed with similar materials and with similar sizing as the liner 134.

Figure 38:
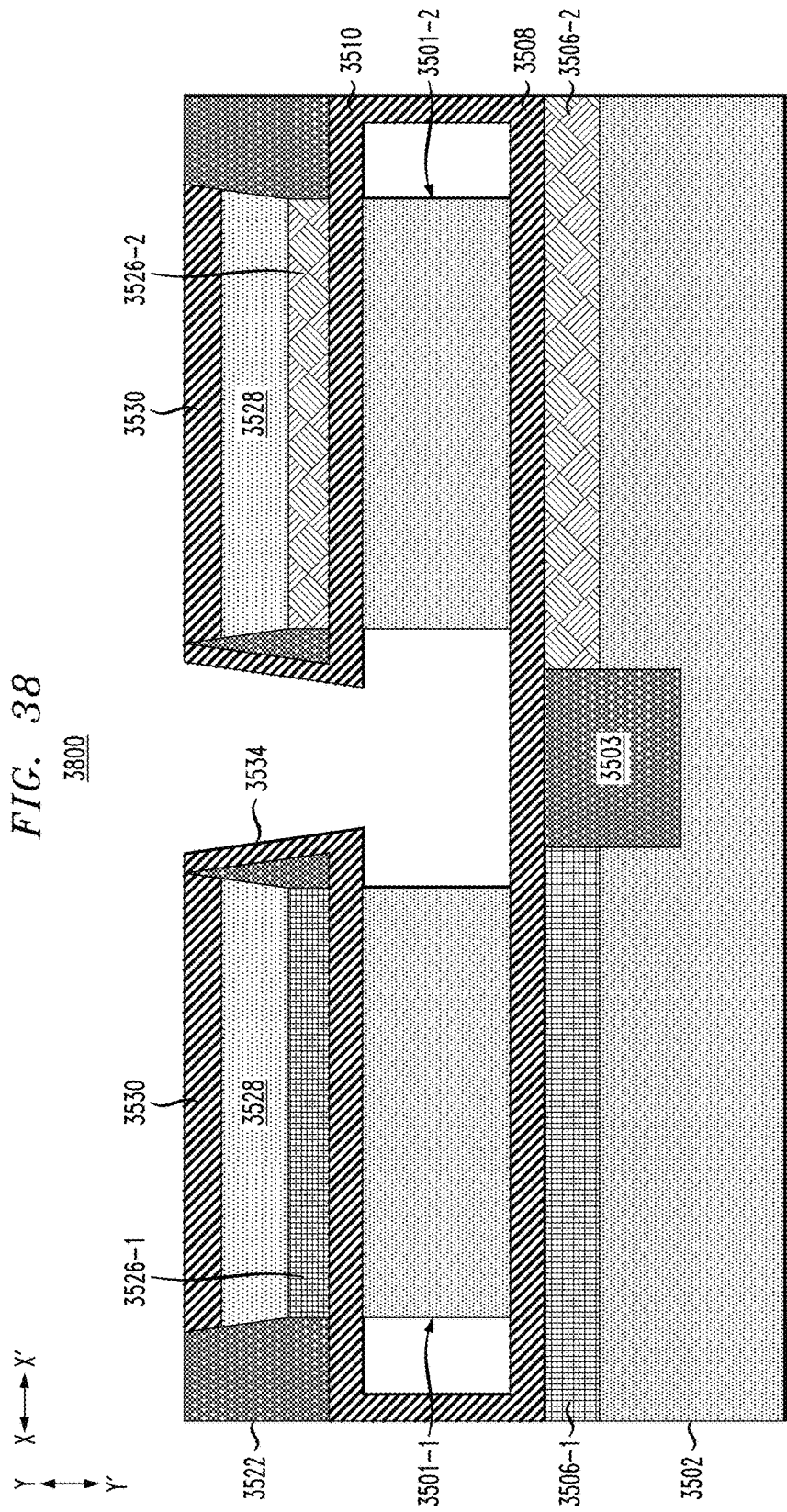
FIG. 38 depicts a side cross-sectional view of the semiconductor structure of FIG. 37 following removal of the shared dummy gate, according to an embodiment of the invention.

FIG. 38 depicts a side cross-sectional view 3800 of the semiconductor structure of FIG. 37 following removal of the shared dummy gate 3512. The shared dummy gate 3512 may be removed using processing similar to that described above with respect to removal of dummy gate 112.

Figure 39:
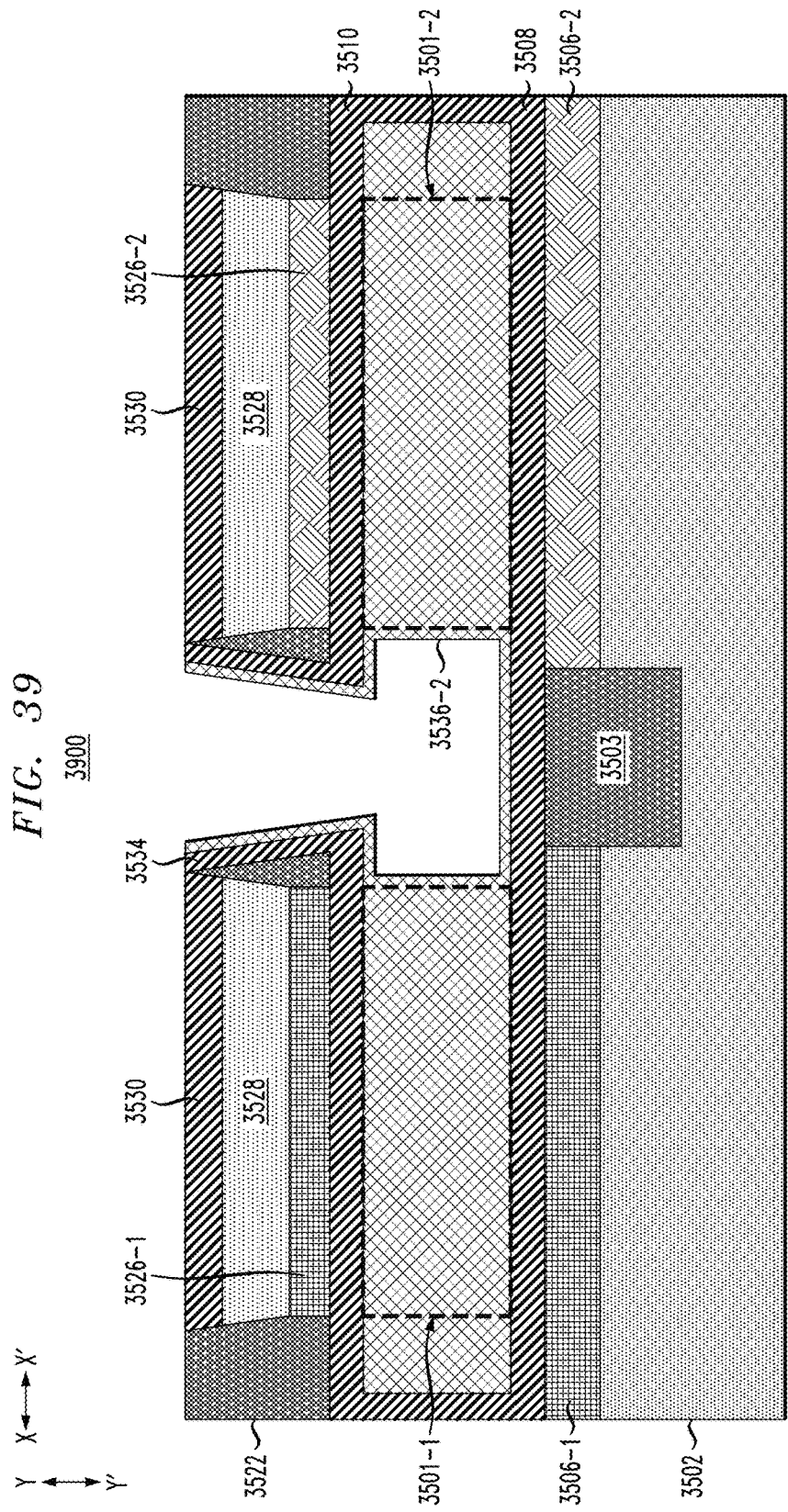
FIG. 39 depicts a side cross-sectional view of the semiconductor structure of FIG. 38 following formation of a work function metal for a p-type field-effect transistor, according to an embodiment of the invention.

FIG. 39 depicts a side cross-sectional view 3900 of the semiconductor structure of FIG. 38 following deposition of a gate dielectric (not shown) and a PFET WFM 3536-2 (more generally, a PFET gate conductor 3536-2). Initially, the PFET WFM 3536-2 is formed surrounding the fin 3501-1 for the NFET device as shown, but is removed during later processing described below. The PFET WFM 3536-2 may be formed of a nitride such as titanium nitride (TiN), titanium aluminum nitride (TiAlN), tantalum nitride (TaN), tantalum silicon nitride (TaSiN), or a carbide including but not limited to titanium carbide (TiC), titanium aluminum carbide (TiAlC), tantalum carbide (TaC), although other suitable materials may be used. The PFET WFM 3536-2 may be formed using conformal deposition processing such as ALD or CVD.

Figure 40:
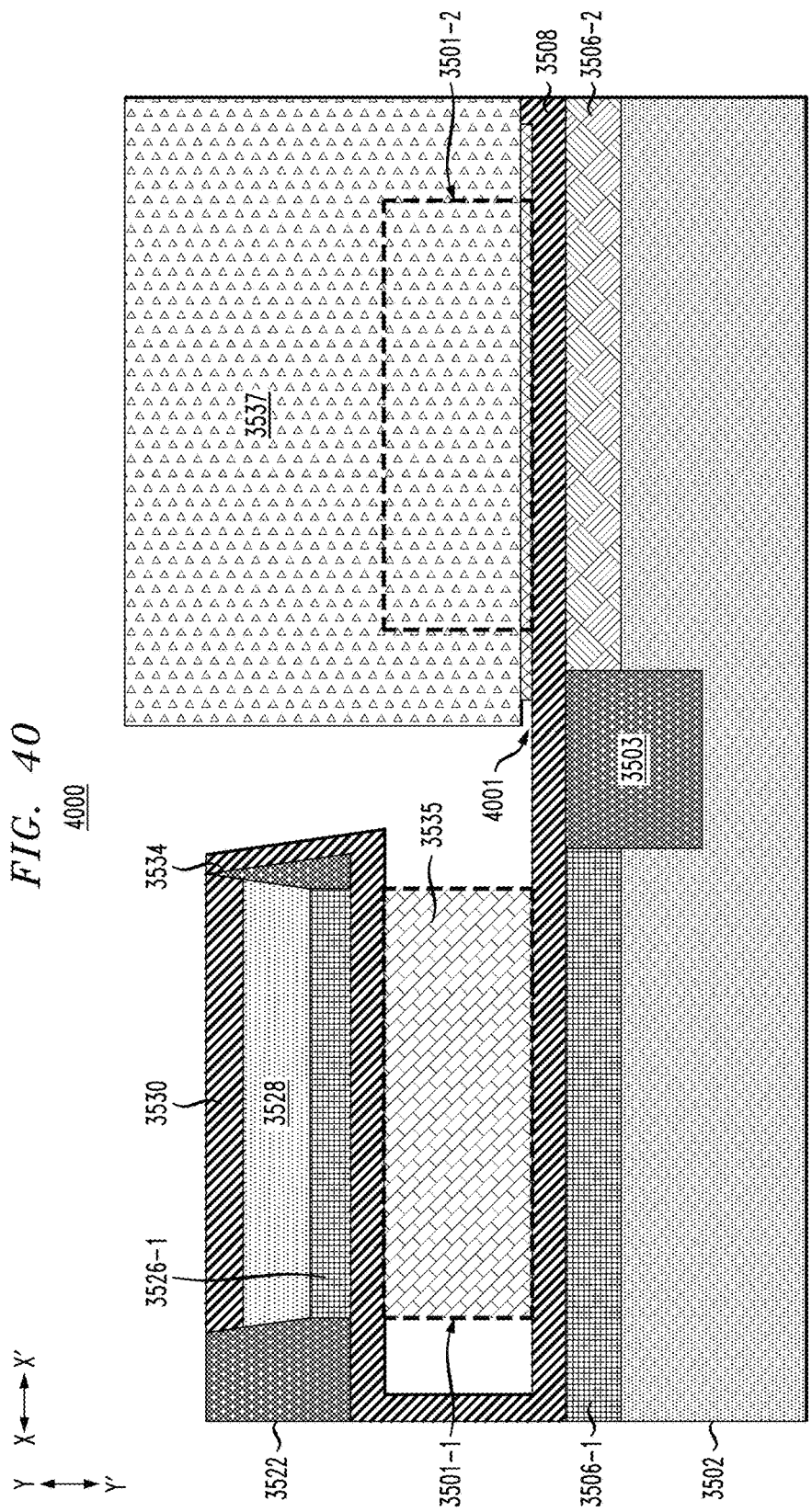
FIG. 40 depicts a side cross-sectional view of the semiconductor structure of FIG. 39 following patterning of the p-type work function metal, according to an embodiment of the invention.

FIG. 40 depicts a side cross-sectional view 4000 of the semiconductor structure of FIG. 39 following patterning of the PFET WFM 3536-2. The PFET WFM 3536-2 is patterned by blocking the PFET region (e.g., the PFET WFM 3536-2 surrounding the fin 3501-2) while the PFET WFM 3536-2 in the NFET region (e.g., portions of the PFET WFM 3536-2 surrounding the fin 3501-1) is removed using a wet chemical etch (e.g., SC1) or other suitable processing. The PFET WFM 3536-2 may be blocked in the PFET region using an organic polymer layer (OPL) 3537. When the PFET WFM 3536-2 is removed in the NFET region, the gate dielectric 3535 surrounding the fin 3501-1 is visible (the gate dielectric 3535 similarly surrounds the fin 3501-2, but it is not visible in the side cross-sectional view 4000). Although the PFET region is blocked by OPL 3537 during removal of the PFET WFM 3536-2 from the NFET region, there is some lateral undercut 4001 removal of the PFET WFM 3536-2 in the PFET region as illustrated. The lateral undercut 4001, however, is small, which advantageously corresponds to very small n-to-p boundary shift during patterning of the gate metal.

Figure 41:
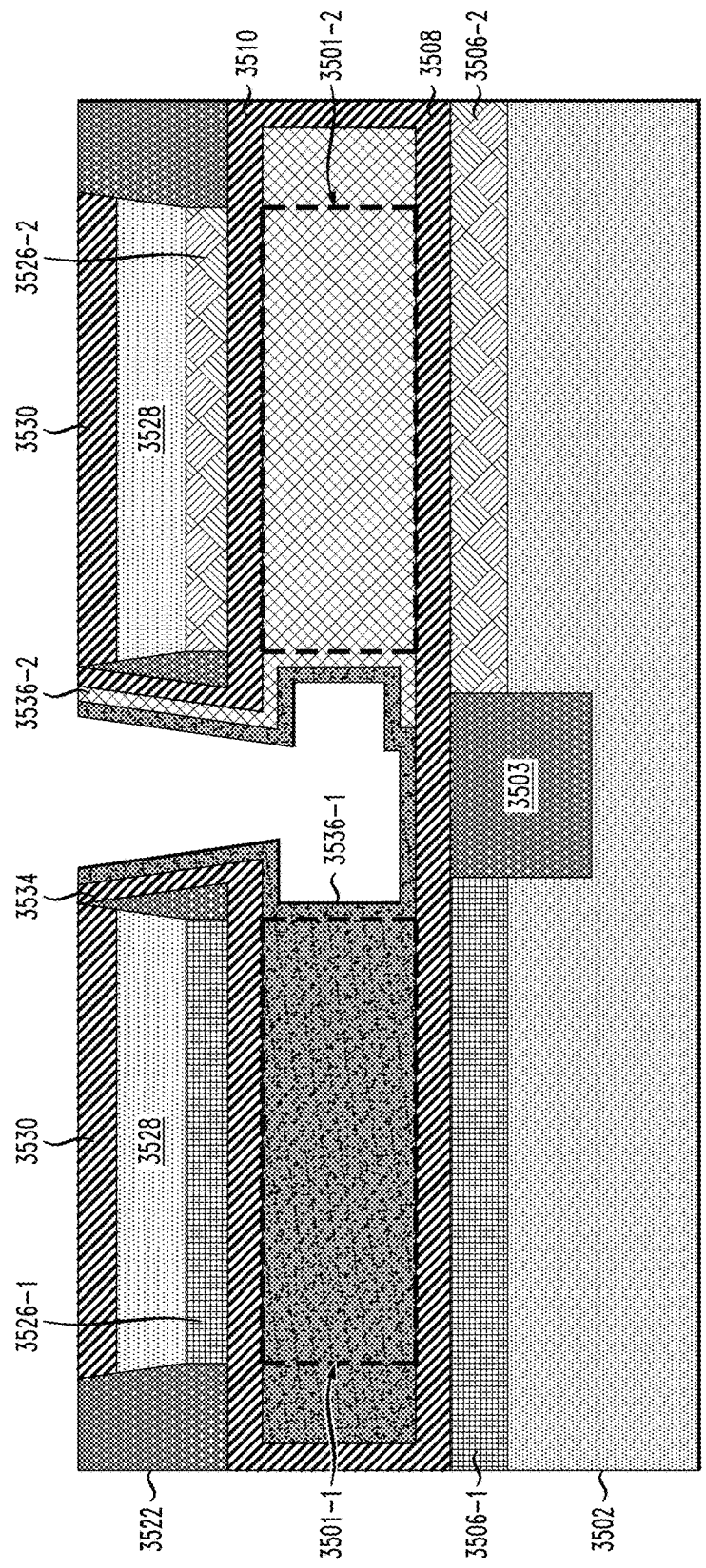
FIG. 41 depicts a side cross-sectional view of the semiconductor structure of FIG. 40 following formation of a work function metal for an n-type field-effect transistor, according to an embodiment of the invention.

FIG. 41 depicts a side cross-sectional view 4100 of the semiconductor structure of FIG. 40 following formation of an NFET WFM 3536-1 (more generally, an NFET gate conductor 3536-1). The NFET WFM 3536-1 may be formed using conformal deposition processing such as ALD or CVD. The NFET WFM 3536-1 may be formed of a nitride such as titanium nitride (TiN), titanium aluminum nitride (TiAlN), tantalum nitride (TaN), tantalum silicon nitride (TaSiN), a carbide including but not limited to titanium carbide (TiC), titanium aluminum carbide (TiAlC), tantalum carbide (TaC), and combinations thereof, although other suitable materials may be used. It is to be appreciated that while FIGS. 39-41 illustrate formation of the PFET WFM 3536-2 followed by formation of the NFET WFM 3536-1, in other embodiments the NFET WFM 3536-1 may be formed before formation of the PFET WFM 3536-2 using similar processing (e.g., forming the NFET WFM 3536-1 first followed by blocking the NFET region while the NFET WFM 3536-1 is removed from the PFET region).

Figure 42:
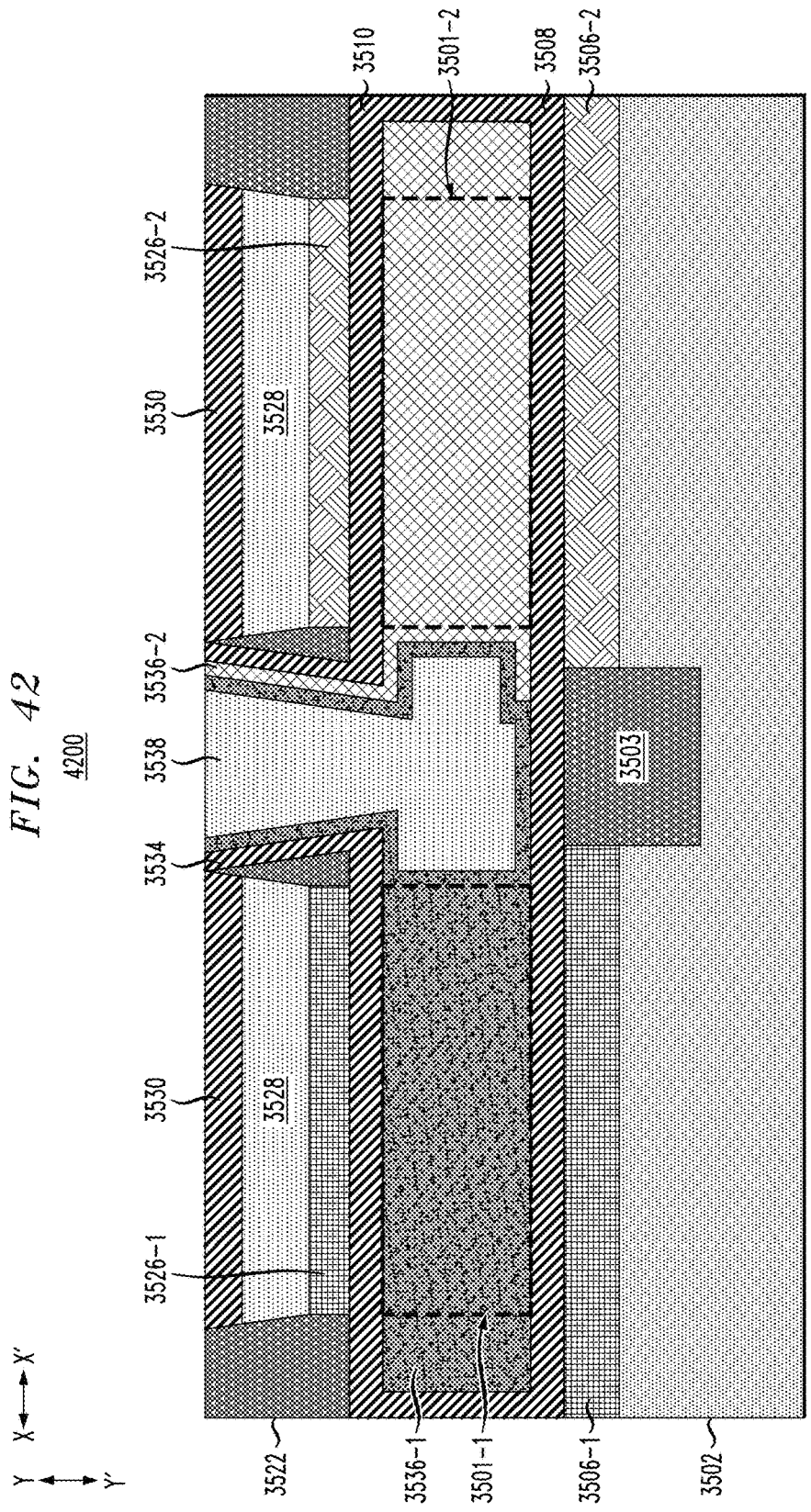
FIG. 42 depicts a side cross-sectional view of the semiconductor structure of FIG. 41 following fill with a metal, according to an embodiment of the invention.

FIG. 42 depicts a side cross-sectional view 4200 of the semiconductor structure of FIG. 41 following fill with metal layer 3538, which may be formed using similar materials and with similar processing as metal layer 138.

Figure 43:
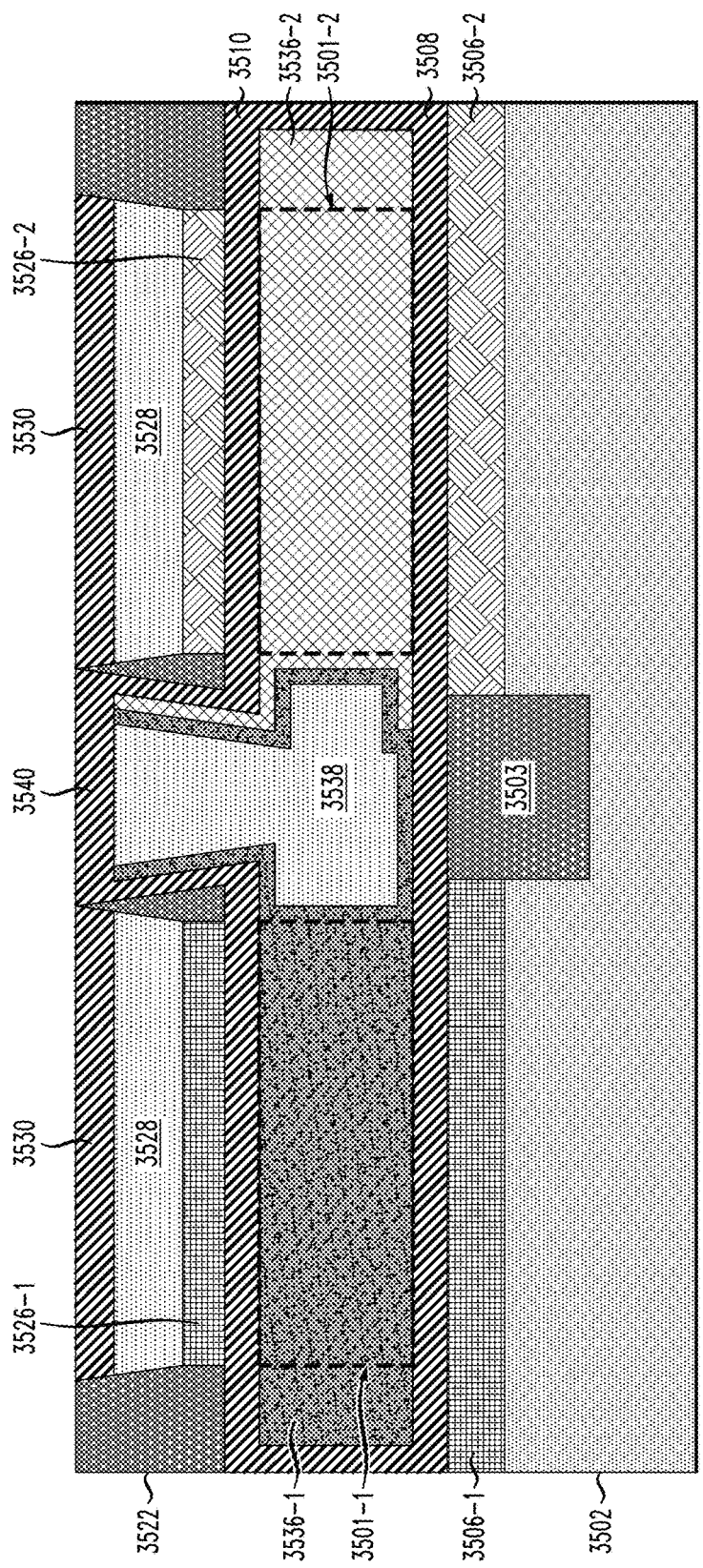
FIG. 43 depicts a side cross-sectional view of the semiconductor structure of FIG. 42 following recess of the metal and formation of a gate self-aligned contact capping layer, according to an embodiment of the invention.

FIG. 43 depicts a side cross-sectional view 4300 of the semiconductor structure of FIG. 42 following recess of the metal layer 3538 (as well as recess of the NFET WFM 3536-1 and PFET WFM 3536-2) and formation of SAC capping layer 3540, also referred to as a gate SAC capping layer or shared gate SAC capping layer. The recess of metal layer 3538 (as well as recess of the NFET WFM 3536-1 and the PFET WFM 3536-2) and formation of SAC capping layer 3540 may use processing similar to that described above with respect to recess of metal layer 138 and formation of SAC capping layer 140. The SAC capping layer 3540 may be formed with similar materials and similar sizing as the SAC capping layer 140.

Figure 44:
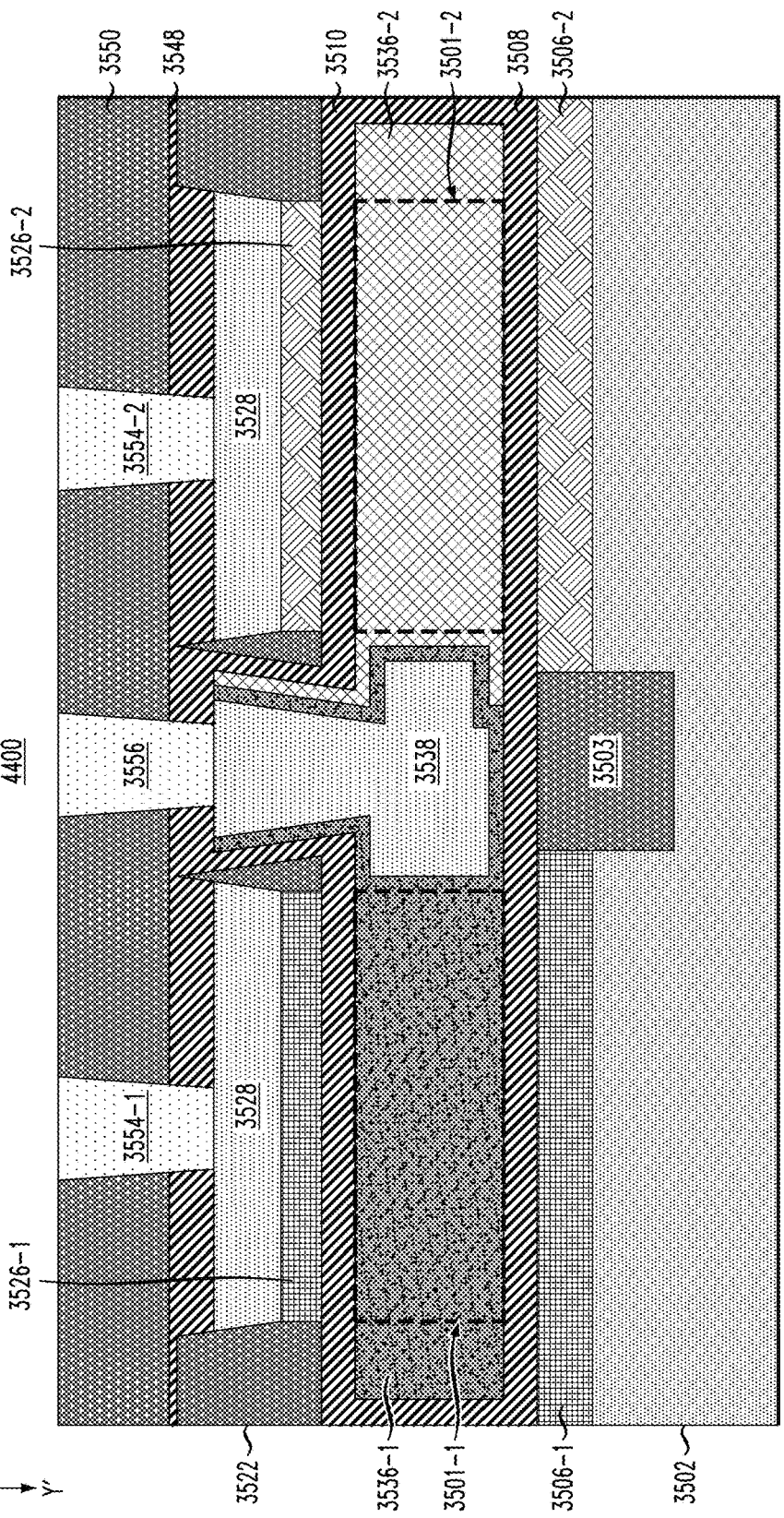
FIG. 44 depicts a side cross-sectional view of the semiconductor structure of FIG. 43 following formation of vias to access contacts, according to an embodiment of the invention.

FIG. 44 depicts a side cross-sectional view 4400 of the semiconductor structure of FIG. 43 following formation of vias 3554-1 and 3554-2 to access contacts for the top source/drain regions 3526-1 and 3526-2, respectively, as well as formation of via 3556 to access the shared gate contact. The vias 3554-1 and 3554-2 (collectively, vias 3554) and via 3556 may be formed of similar materials, with similar sizing and using similar processing as that described above with respect to formation of vias 154 and 156. Although not shown in FIG. 44, vias 3552-1 and 3552-2 to the bottom source/drain regions 3506-1 and 3506-2 are also formed (as illustrated in FIG. 45, with similar processing as that described with respect to formation of via 152).

Figure 45:
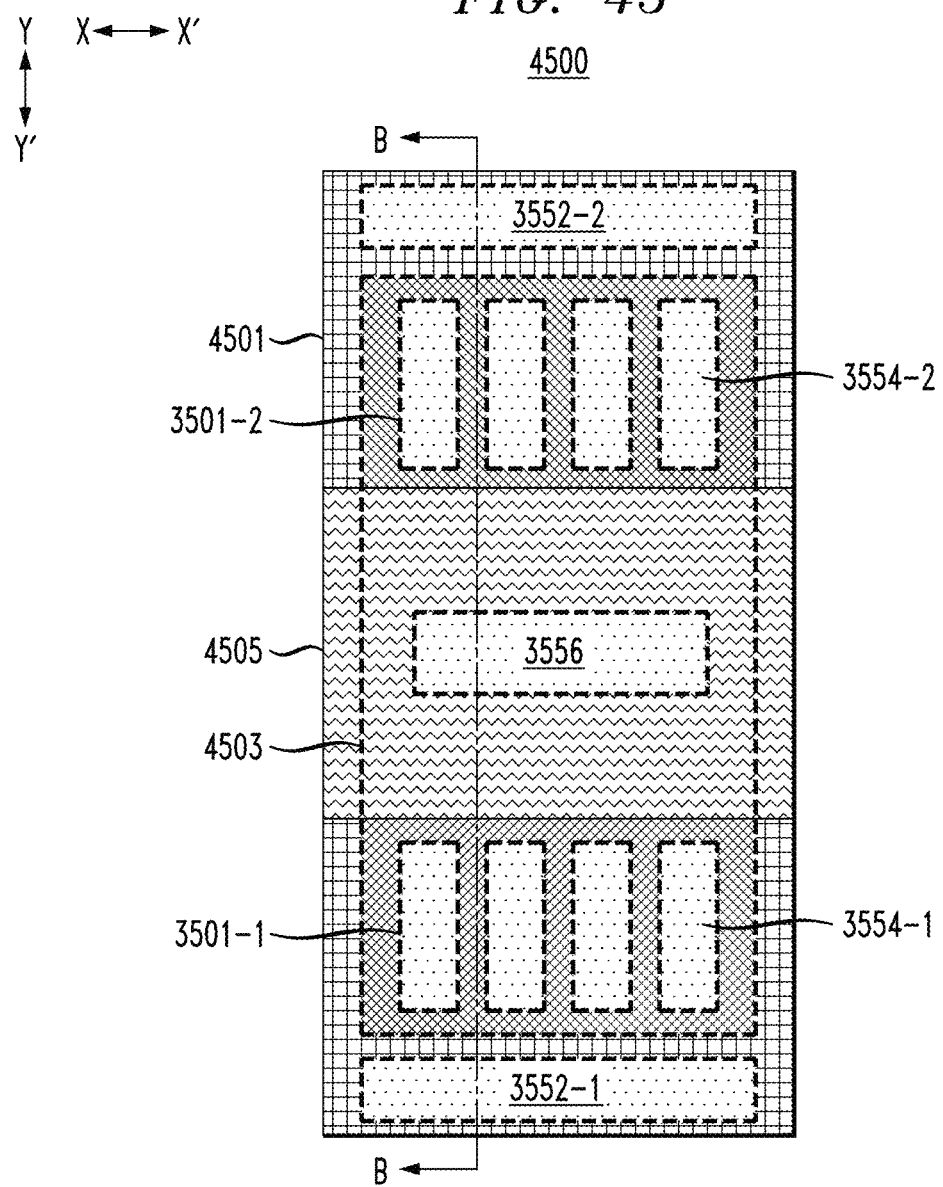
FIG. 45 depicts a top-down view of the semiconductor structure of FIG. 44, according to an embodiment of the invention.

FIG. 45 depicts a top-down view 4500 of the semiconductor structure of FIG. 44. It should be noted that the top-down view 4500 is presented to illustrate locations of the vias 3552-1, 3552-2, 3554-1, 3554-2 and 3556 relative to fins 3501-1 and 3501-2, and as such omits various details of underlying layers for clarity of illustration. The bottom source/drain contacts via 3552-1 and 3552-2 may have sizing similar to that of bottom source/drain contacts 152. Each of the fins 3501 may have a length (in direction Y-Y') similar to that of fins 101. The top source/drain contacts 3554-1 and 3554-2 may have lengths that match that of the fins 3501 as illustrated, though this is not a requirement. The gate contact via 3556 may have a thickness similar to that of gate contact 156.

The top-down view 4500 shows mask regions 4501, 4503 and 4505 similar to the mask regions 2401, 2403 and 2405. The side cross-sectional views of FIGS. 35-44 are taken parallel to a pair of fins 3501-1 and 3501-2, e.g., along the line B-B in the top-down view 4500 of FIG. 45.

In some embodiments, a method of forming a semiconductor structure comprises forming a plurality of fins disposed over a top surface of a substrate and forming one or more VTFETs from the plurality of fins using a RMG process. A gate surrounding at least one fin of a given one of the VTFETs comprises a gate SAC capping layer disposed over a gate contact metal layer, the gate contact metal layer being disposed adjacent an end of the at least one fin.

Forming the one or more VTFETs may comprise forming bottom source/drain regions disposed over the top surface of the substrate surrounding the plurality of fins and forming bottom spacers disposed over the bottom source/drain regions.

Forming the one or more VTFETs may further comprise forming an oxide layer disposed over the bottom spacers and sidewalls of the plurality of fins, forming a dummy gate disposed over the oxide layer, recessing the dummy gate below top surfaces of the plurality of fins, removing exposed portions of the oxide layer, and forming top spacers disposed over the dummy gate and the plurality of fins.

Forming the one or more VTFETs may further comprise forming top junctions in upper portions of the plurality of fins, forming an oxide layer disposed over the top spacers, forming a liner disposed over the oxide layer, and forming an interlevel dielectric layer disposed over the liner.

Forming the one or more VTFETs may further comprise forming top source/drain openings in the interlevel dielectric layer to expose top surfaces of the top junctions of each of the plurality of fins, forming top source/drain regions disposed over the top junctions, forming top source/drain contact metal layers disposed over the top source/drain regions, recessing the top source/drain contact metal layers below a top surface of the interlevel dielectric, and forming top source/drain SAC capping layers disposed over the recessed top source/drain contact metal layers.

Forming the one or more VTFETs may further comprise forming a gate opening in the interlevel dielectric layer to expose a portion of the top spacer disposed over the dummy gate, depositing a liner on sidewalls of the opening of the interlevel dielectric layer, etching the exposed portion of the top spacer to expose a portion of the dummy gate, removing the dummy gate, performing the replacement metal gate process to form a gate dielectric surrounding the one or more fins and to form a metal gate conductor surrounding the gate dielectric, filling the gate contact metal layer in remaining portions of the gate opening in the interlevel dielectric layer, recessing the gate contact metal layer below the top surface of the interlevel dielectric layer, and forming the gate SAC capping layer disposed over the recessed gate contact metal layer.

Forming the one or more VTFETs may further comprise forming a bottom source/drain opening in the interlevel dielectric layer to expose a portion of the top surface of the bottom source/drain regions, filling a bottom source/drain contact metal layer in the bottom source/drain opening disposed over the exposed portion of the top surface of the bottom source/drain regions, recessing the bottom source/drain contact metal layer below a top surface of the interlevel dielectric layer, and forming a bottom source/drain SAC capping layer disposed over the recessed bottom source/drain contact layer.

Forming the one or more VTFETs may further comprise forming an additional liner disposed over the interlevel dielectric, the top source/drain SAC capping layers, the gate SAC capping layer and the bottom source/drain SAC capping layer, forming an additional interlevel dielectric disposed over the additional liner, forming vias in the additional liner, the additional interlevel dielectric, the top source/drain SAC capping layers, the gate SAC capping layer and the bottom source/drain SAC capping layer to expose portions of the top surfaces of the top source/drain contact metal layers, the gate contact metal layer and the bottom source/drain contact metal layer, and forming top source/drain contacts, a gate contact and a bottom source/drain contact in the vias.

Forming the one or more VTFETs may further comprise forming at least one shallow trench isolation region in the substrate and the bottom source/drain region between a first subset of the plurality of fins and at least a second subset of the plurality of fins, wherein recessing the dummy gate comprises recessing a first portion of the dummy gate surrounding the first subset of the plurality of fins to a first depth and recessing a second portion of the dummy gate surrounding the second subset of the plurality of fins to a second depth greater than the first depth. The first subset of the plurality of fins form VTFETs having a first channel length and the second subset of the plurality of fins form VTFETs having a second channel length smaller than the first channel length.

Recessing the first portion of the dummy gate and recessing the second portion of the dummy gate may comprise patterning a mask layer over the dummy gate to expose a top surface of the dummy gate disposed over the at least one shallow trench isolation region, removing the exposed portion of the dummy gate to expose a portion of the bottom spacer disposed over the at least one shallow trench isolation region, and forming a liner on exposed sidewalls of the dummy gate.

The dummy gate may comprise a shared dummy gate surrounding pairs of the plurality of fins, each pair of the plurality of fins comprising a first fin forming a channel for one of a PFET of a given CMOS device and an NFET of the given CMOS device, and a second fin forming a channel for the other one of the PFET and the NFET of the given CMOS device.

Forming the one or more VTFETs may further comprise patterning a gate opening in an interlevel dielectric layer disposed over a top spacer disposed over the shared dummy gate, removing portions of the interlevel dielectric layer to expose a portion of the top surface of the top spacer, forming a liner on exposed sidewalls of the interlevel dielectric layer in the gate opening, and removing the shared dummy gate.

Forming the one or more VTFETs may further comprise forming a gate dielectric surrounding the first fin and the second fin, forming a first gate conductor layer surrounding the gate dielectric, the top surface of the substrate, and the liner disposed on the exposed sidewalls of the interlevel dielectric layer, blocking a first portion of the gate opening and the first gate conductor layer surrounding the first fin with an organic polymer layer, removing the first gate conductor layer surrounding the second fin exposed by the organic polymer layer, removing the organic polymer layer, and forming a second gate conductor layer surrounding the gate dielectric surrounding second fin.

The method may further comprise filling the gate contact metal layer in the gate opening contacting the first gate conductor layer and the second gate conductor layer, recessing the gate contact metal layer below a top surface of the interlevel dielectric, and forming the gate SAC capping layer disposed over the recessed gate contact metal layer.

In some embodiments, a semiconductor structure comprises a substrate and a plurality of fins disposed over a top surface of the substrate, the plurality of fins comprising channels for one or more VTFETs formed with a RMG process. A given one of the VTFETs comprises a gate surrounding at least one of the plurality of fins, the gate of the given VTFET comprising a gate SAC capping layer disposed over a gate contact metal layer, the gate contact metal layer being disposed adjacent an end of the at least one fin.

The semiconductor structure may further comprise a bottom source/drain region disposed over the top surface of the substrate surrounding the plurality of fins, a bottom spacer disposed over the bottom source/drain region, the gate surrounding the plurality of fins, a top spacer disposed over the gate, top source/drain regions disposed over a portion of the top spacer disposed over each of the plurality of fins, top source/drain contact metal layers disposed over the top source/drain regions, top source/drain SAC capping layers disposed over the top source/drain metal contact layers, a bottom source/drain contact metal layer disposed over a portion of the bottom source/drain region, and a bottom source/drain SAC capping layer disposed over the bottom source/drain metal contact layer.

In some embodiments, at least two of the plurality fins have different heights.

In some embodiments, the gate of the given VTFET comprises a shared gate surrounding pairs of the plurality of fins, each pair of the plurality of fins comprising a first fin forming a channel for one of a PFET of a given CMOS device and an NFET of the given CMOS device and a second fin forming a channel for the other one of the PFET and the NFET of the given CMOS device.

In some embodiments, the shared gate comprises a first gate conductor surrounding the first fin and a second gate conductor surrounding the second fin, the gate contact metal layer contacting the first gate conductor and the second gate conductor.

In some embodiments, an integrated circuit comprises one or more VTFETs comprising a substrate and a plurality of fins disposed over a top surface of the substrate, the plurality of fins comprising channels for the one or more VTFETs formed with a RMG process. A given one of the VTFETs comprises a gate surrounding at least one of the plurality of fins, the gate of the given VTFET comprising a gate SAC capping layer disposed over a gate contact metal layer, the gate contact metal layer being disposed adjacent an end of the at least one fin.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a plurality of fins disposed over a top surface of a substrate; and
    forming one or more vertical transport field-effect transistors (VTFETs) from the plurality of fins using a replacement metal gate (RMG) process;
    wherein a gate surrounding at least one fin of a given one of the VTFETs comprises a gate self-aligned contact (SAC) capping layer disposed over a gate contact metal layer, the gate contact metal layer being disposed adjacent an end of the at least one fin;
    wherein forming the one or more VTFETs comprises:
        forming bottom source/drain regions disposed over the top surface of the substrate surrounding the plurality of fins;
        forming bottom spacers disposed over the bottom source/drain regions;
        forming an oxide layer disposed over the bottom spacers and sidewalls of the plurality of fins;
        forming a dummy gate disposed over the oxide layer;
        recessing the dummy gate below top surfaces of the plurality of fins;
        removing exposed portions of the oxide layer;
        forming top spacers disposed over the dummy gate and the plurality of fins;
        forming top junctions in upper portions of the plurality of fins;
        forming an oxide layer disposed over the top spacers;
        forming a liner disposed over the oxide layer; and
        forming an interlevel dielectric layer disposed over the liner.

2. The method of claim 1, wherein forming the one or more VTFETs comprises:
    forming top source/drain openings in the interlevel dielectric layer to expose top surfaces of the top junctions of each of the plurality of fins;
    forming top source/drain regions disposed over the top junctions;
    forming top source/drain contact metal layers disposed over the top source/drain regions;
    recessing the top source/drain contact metal layers below a top surface of the interlevel dielectric; and
    forming top source/drain SAC capping layers disposed over the recessed top source/drain contact metal layers.

3. The method of claim 2, wherein forming the one or more VTFETs further comprises:
    forming a gate opening in the interlevel dielectric layer to expose a portion of the top spacer disposed over the dummy gate;
    depositing a liner on sidewalls of the opening of the interlevel dielectric layer;
    etching the exposed portion of the top spacer to expose a portion of the dummy gate;

removing the dummy gate;
performing the replacement metal gate process to form a gate dielectric surrounding the one or more fins and to form a metal gate conductor surrounding the gate dielectric;
filling the gate contact metal layer in remaining portions of the gate opening in the interlevel dielectric layer;
recessing the gate contact metal layer below the top surface of the interlevel dielectric layer; and
forming the gate SAC capping layer disposed over the recessed gate contact metal layer.

4. The method of claim 3, wherein forming the one or more VTFETs further comprises:
forming a bottom source/drain opening in the interlevel dielectric layer to expose a portion of the top surface of the bottom source/drain regions;
filling a bottom source/drain contact metal layer in the bottom source/drain opening disposed over the exposed portion of the top surface of the bottom source/drain regions;
recessing the bottom source/drain contact metal layer below a top surface of the interlevel dielectric layer; and
forming a bottom source/drain SAC capping layer disposed over the recessed bottom source/drain contact layer.

5. The method of claim 4, wherein forming the one or more VTFETs further comprises:
forming an additional liner disposed over the interlevel dielectric, the top source/drain SAC capping layers, the gate SAC capping layer and the bottom source/drain SAC capping layer;
forming an additional interlevel dielectric disposed over the additional liner;
forming vias in the additional liner, the additional interlevel dielectric, the top source/drain SAC capping layers, the gate SAC capping layer and the bottom source/drain SAC capping layer to expose portions of the top surfaces of the top source/drain contact metal layers, the gate contact metal layer and the bottom source/drain contact metal layer; and
forming top source/drain contacts, a gate contact and a bottom source/drain contact in the vias.

6. The method of claim 1, wherein forming the one or more VTFETs further comprises forming at least one shallow trench isolation region in the substrate and the bottom source/drain region between a first subset of the plurality of fins and at least a second subset of the plurality of fins, wherein recessing the dummy gate comprises:
recessing a first portion of the dummy gate surrounding the first subset of the plurality of fins to a first depth; and
recessing a second portion of the dummy gate surrounding the second subset of the plurality of fins to a second depth greater than the first depth;
wherein the first subset of the plurality of fins form VTFETs having a first channel length; and
wherein the second subset of the plurality of fins form VTFETs having a second channel length smaller than the first channel length.

7. The method of claim 6, wherein recessing the first portion of the dummy gate and recessing the second portion of the dummy gate comprises:
patterning a mask layer over the dummy gate to expose a top surface of the dummy gate disposed over the at least one shallow trench isolation region;
removing the exposed portion of the dummy gate to expose a portion of the bottom spacer disposed over the at least one shallow trench isolation region; and
forming an additional liner on exposed sidewalls of the dummy gate.

8. The method of claim 1, wherein the dummy gate comprises a shared dummy gate surrounding pairs of the plurality of fins, each pair of the plurality of fins comprising:
a first fin forming a channel for one of a p-type field-effect transistor (PFET) of a given complementary metal-oxide-semiconductor (CMOS) device and an n-type field-effect transistor (NFET) of the given CMOS device; and
a second fin forming a channel for the other one of the PFET and the NFET of the given CMOS device.

9. A method of forming a semiconductor structure, comprising:
forming a plurality of fins disposed over a top surface of a substrate; and
forming one or more vertical transport field-effect transistors (VTFETs) from the plurality of fins using a replacement metal gate (RMG) process;
wherein a gate surrounding at least one fin of a given one of the VTFETs comprises a gate self-aligned contact (SAC) capping layer disposed over a gate contact metal layer, the gate contact metal layer being disposed adjacent an end of the at least one fin;
wherein forming the one or more VTFETs comprises:
forming bottom source/drain regions disposed over the top surface of the substrate surrounding the plurality of fins;
forming bottom spacers disposed over the bottom source/drain regions;
forming an oxide layer disposed over the bottom spacers and sidewalls of the plurality of fins;
forming a dummy gate disposed over the oxide layer;
recessing the dummy gate below top surfaces of the plurality of fins;
removing exposed portions of the oxide layer;
forming top spacers disposed over the dummy gate and the plurality of fins;
wherein the dummy gate comprises a shared dummy gate surrounding pairs of the plurality of fins, each pair of the plurality of fins comprising:
a first fin forming a channel for one of a p-type field-effect transistor (PFET) of a given complementary metal-oxide-semiconductor (CMOS) device and an n-type field-effect transistor (NFET) of the given CMOS device; and
a second fin forming a channel for the other one of the PFET and the NFET of the given CMOS device; and
wherein forming the one or more VTFETs further comprises:
patterning a gate opening in an interlevel dielectric layer disposed over a top spacer disposed over the shared dummy gate;
removing portions of the interlevel dielectric layer to expose a portion of the top surface of the top spacer;
forming a liner on exposed sidewalls of the interlevel dielectric layer in the gate opening; and
removing the shared dummy gate.

10. The method of claim 9, wherein forming the one or more VTFETs further comprises:
forming a gate dielectric surrounding the first fin and the second fin;

forming a first gate conductor layer surrounding the gate dielectric, the top surface of the substrate, and the liner disposed on the exposed sidewalls of the interlevel dielectric layer;
blocking a first portion of the gate opening and the first gate conductor layer surrounding the first fin with an organic polymer layer;
removing the first gate conductor layer surrounding the second fin exposed by the organic polymer layer;
removing the organic polymer layer; and
forming a second gate conductor layer surrounding the gate dielectric surrounding second fin.

11. The method of claim 10, further comprising:
filling the gate contact metal layer in the gate opening contacting the first gate conductor layer and the second gate conductor layer;
recessing the gate contact metal layer below a top surface of the interlevel dielectric; and
forming the gate SAC capping layer disposed over the recessed gate contact metal layer.

12. A semiconductor structure, comprising:
a substrate; and
a plurality of fins disposed over a top surface of the substrate, the plurality of fins comprising channels for one or more vertical transport field-effect transistors (VTFETs) formed with a replacement metal gate (RMG) process;
wherein a given one of the VTFETs comprises a gate surrounding at least one of the plurality of fins, the gate of the given VTFET comprising a gate self-aligned contact (SAC) capping layer disposed over a gate contact metal layer, the gate contact metal layer being disposed adjacent an end of the at least one fin;
a bottom source/drain region disposed over the top surface of the substrate surrounding the plurality of fins;
a bottom spacer disposed over the bottom source/drain region;
the gate surrounding the plurality of fins;
a top spacer disposed over the gate;
top source/drain regions disposed over a portion of the top spacer disposed over each of the plurality of fins;
top source/drain contact metal layers disposed over the top source/drain regions;
top source/drain SAC capping layers disposed over the top source/drain metal contact layers;
a bottom source/drain contact metal layer disposed over a portion of the bottom source/drain region; and
a bottom source/drain SAC capping layer disposed over the bottom source/drain metal contact layer;
wherein the gate of the given VTFET comprises a shared gate surrounding pairs of the plurality of fins, each pair of the plurality of fins comprising:
a first fin forming a channel for one of a p-type field-effect transistor (PFET) of a given complementary metal-oxide-semiconductor (CMOS) device and an n-type field-effect transistor (NFET) of the given CMOS device; and
a second fin forming a channel for the other one of the PFET and the NFET of the given CMOS device.

13. The semiconductor structure of claim 12, wherein at least two of the plurality fins have different heights.

14. The semiconductor structure of claim 12, wherein the shared gate comprises a first gate conductor surrounding the first fin and a second gate conductor surrounding the second fin, the gate contact metal layer contacting the first gate conductor and the second gate conductor.

15. An integrated circuit comprising:
one or more vertical transport field-effect transistors (VTFETs) comprising:
a substrate; and
a plurality of fins disposed over a top surface of the substrate, the plurality of fins comprising channels for the one or more VTFETs formed with a replacement metal gate (RMG) process;
wherein a given one of the VTFETs comprises a gate surrounding at least one of the plurality of fins, the gate of the given VTFET comprising a gate self-aligned contact (SAC) capping layer disposed over a gate contact metal layer, the gate contact metal layer being disposed adjacent an end of the at least one fin;
wherein the one or more VTFETs further comprise:
a bottom source/drain region disposed over the top surface of the substrate surrounding the plurality of fins;
a bottom spacer disposed over the bottom source/drain region;
the gate surrounding the plurality of fins;
a top spacer disposed over the gate;
top source/drain regions disposed over a portion of the top spacer disposed over each of the plurality of fins;
top source/drain contact metal layers disposed over the top source/drain regions;
top source/drain SAC capping layers disposed over the top source/drain metal contact layers;
a bottom source/drain contact metal layer disposed over a portion of the bottom source/drain region; and
a bottom source/drain SAC capping layer disposed over the bottom source/drain metal contact layer;
wherein the gate of the given VTFET comprises a shared gate surrounding pairs of the plurality of fins, each pair of the plurality of fins comprising:
a first fin forming a channel for one of a p-type field-effect transistor (PFET) of a given complementary metal-oxide-semiconductor (CMOS) device and an n-type field-effect transistor (NFET) of the given CMOS device; and
a second fin forming a channel for the other one of the PFET and the NFET of the given CMOS device.

16. The integrated circuit of claim 15, wherein at least two of the plurality fins have different heights.

17. The integrated circuit of claim 15, wherein the shared gate comprises a first gate conductor surrounding the first fin and a second gate conductor surrounding the second fin, the gate contact metal layer contacting the first gate conductor and the second gate conductor.

* * * * *